United States Patent
Lutgen et al.

(10) Patent No.: US 11,309,464 B2
(45) Date of Patent: Apr. 19, 2022

(54) MICRO-LED DESIGN FOR CHIEF RAY WALK-OFF COMPENSATION

(71) Applicant: Facebook Technologies, LLC, Menlo Park, CA (US)

(72) Inventors: Stephan Lutgen, Dresden (DE); François Gérard Franck Olivier, Cork (IE); Vasily Zabelin, Cork (IE); William Padraic Henry, Cork (IE); Markus Broell, Cork (IE); Thomas Lauermann, Cork (IE); David Massoubre, Cork (IE); Daniel Bryce Thompson, Cork (IE); Michael Grundmann, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 74 days.

(21) Appl. No.: 16/840,114

(22) Filed: Apr. 3, 2020

(65) Prior Publication Data

US 2021/0111319 A1 Apr. 15, 2021

Related U.S. Application Data

(60) Provisional application No. 62/914,892, filed on Oct. 14, 2019.

(51) Int. Cl.
*H01L 33/58* (2010.01)
*H01L 25/075* (2006.01)
(Continued)

(52) U.S. Cl.
CPC .............. *H01L 33/58* (2013.01); *F21V 5/004* (2013.01); *F21V 5/005* (2013.01);
(Continued)

(58) Field of Classification Search
CPC ............ G02B 27/0955; G02B 19/0028; G02B 27/0172; G02B 9/16; G02B 27/0972;
(Continued)

(56) References Cited

U.S. PATENT DOCUMENTS

| 4,603,420 A | 7/1986 | Nishizawa et al. |
| 7,418,014 B2 | 8/2008 | Mochizuki |

(Continued)

FOREIGN PATENT DOCUMENTS

| CN | 110221440 A | 9/2019 |
| CN | 110323131 A | 10/2019 |

(Continued)

OTHER PUBLICATIONS

PCT Application No. PCT/US2020/061711, "International Search Report and Written Opinion", dated Mar. 5, 2021, 10 pages.

(Continued)

*Primary Examiner* — Bao Q Truong
(74) *Attorney, Agent, or Firm* — Weaver Austin Villeneuve & Sampson LLP

(57) ABSTRACT

Techniques disclosed herein relate to micro light emitting diodes (micro-LEDs) for a display system. A display system includes an array of micro light emitting diodes (micro-LEDs), an array of output couplers optically coupled to the array of micro-LEDs and configured to extract light emitted by respective micro-LEDs in the array of micro-LEDs, a waveguide display, and display optics configured to couple the light emitted by the array of micro-LEDs and extracted by the array of output couplers into the waveguide display. Each output coupler in the array of output couplers is configured to direct a chief ray of the light emitted by a respective micro-LED in the array of micro-LEDs to a different respective direction.

18 Claims, 49 Drawing Sheets

(51) Int. Cl.
- *H01L 33/44* (2010.01)
- *F21V 5/00* (2018.01)
- *G02F 1/13357* (2006.01)
- *F21Y 115/10* (2016.01)

(52) U.S. Cl.
CPC .... *G02F 1/133603* (2013.01); *H01L 25/0753* (2013.01); *H01L 33/44* (2013.01); *F21Y 2115/10* (2016.08)

(58) Field of Classification Search
CPC ............... G02B 19/0061; G02B 9/10; G02B 2027/0112; F21V 5/004; F21V 5/005; G02F 1/133603; H01L 27/15; H01L 33/58; H01L 33/44; H01L 25/0753; F21Y 2115/10
See application file for complete search history.

(56) References Cited

U.S. PATENT DOCUMENTS

| | | |
|---|---|---|
| 7,518,149 B2 | 4/2009 | Maaskant et al. |
| 7,843,982 B2 | 11/2010 | Chua et al. |
| 8,351,479 B2 | 1/2013 | Lutgen et al. |
| 8,384,114 B2 | 2/2013 | Tischler et al. |
| 8,582,209 B1 | 11/2013 | Amirparviz |
| 9,450,148 B2 | 9/2016 | Shepherd |
| 9,484,492 B2 | 11/2016 | Bour et al. |
| 10,468,552 B2 | 11/2019 | Lutgen et al. |
| 10,475,960 B2 | 11/2019 | Jung et al. |
| 10,964,844 B2 | 3/2021 | Lutgen |
| 2002/0105809 A1 | 8/2002 | Kujik et al. |
| 2006/0113638 A1 | 6/2006 | Maaskant et al. |
| 2007/0153857 A1 | 7/2007 | Chua et al. |
| 2008/0248602 A1 | 10/2008 | Erchak et al. |
| 2009/0304039 A1 | 12/2009 | Lutgen et al. |
| 2010/0158067 A1 | 6/2010 | Nakatsuka et al. |
| 2011/0186874 A1 | 8/2011 | Shum |
| 2012/0146066 A1 | 6/2012 | Tischler et al. |
| 2012/0168714 A1 | 7/2012 | Chu et al. |
| 2012/0273824 A1 | 11/2012 | Gmeinwieser et al. |
| 2015/0236201 A1 | 8/2015 | Shepherd |
| 2016/0197232 A1 | 7/2016 | Bour et al. |
| 2017/0271557 A1 | 9/2017 | Brennan et al. |
| 2019/0058088 A1 | 2/2019 | Jung et al. |
| 2019/0227319 A1* | 7/2019 | Trail ............... G09G 3/007 |
| 2019/0305183 A1 | 10/2019 | Lutgen et al. |
| 2020/0105968 A1 | 4/2020 | Lutgen |
| 2021/0159373 A1 | 5/2021 | Grundmann |

FOREIGN PATENT DOCUMENTS

| | | |
|---|---|---|
| CN | 110323313 A | 10/2019 |
| CN | 110323315 A | 10/2019 |
| CN | 112204759 A | 1/2021 |
| EP | 2447757 A1 | 5/2012 |
| EP | 2815436 A1 | 12/2014 |
| EP | 3776673 A1 | 2/2021 |
| JP | 2021517736 A | 7/2021 |
| KR | 20200134266 | 12/2020 |
| WO | 2005066688 A1 | 7/2005 |
| WO | 2015086704 | 6/2015 |
| WO | WO-2017037529 A1 | 3/2017 |
| WO | 2017146806 A1 | 8/2017 |
| WO | 2018050337 A1 | 3/2018 |
| WO | 2019191312 | 10/2019 |
| WO | WO-2021076285 A1 | 4/2021 |
| WO | WO-2021102394 A1 | 5/2021 |

OTHER PUBLICATIONS

Demory B., et al., "Integrated Parabolic Nanolenses on MicroLED Color Pixels," Nanotechnology, Institute of Physics Publishing, GB, Feb. 27, 2018 [Retrieved on Feb. 27, 2018], vol. 29 (16), 7 Pages, XP020326124.

Extended European Search Report for European Application No. 19777211.4, dated Jul. 12, 2021, 11 Pages.
International Search Report and Written Opinion for International Application No. PCT/US2020/052298, dated Mar. 29, 2021, 16 Pages.
Invitation to Pay Additional Fees for International Application No. PCT/US2020/052298, dated Feb. 4, 2021, 10 pages.
"Optical Waveguides in Micro-Led Devices," U.S. Appl. No. 15/824,970, filed Nov. 28, 2017, 26 pages.
Partial Supplementary European Search Report for European Application No. 19777211.4, dated Apr. 9, 2021, 12 Pages.
Walker A.W., "Minority Carrier Diffusion Lengths and Mobilities in Low-Doped n-InGaAs for Focal Plane Array Applications," Infrared Technology and Applications XLIII, Jul. 25, 2017, vol. 10177, pp. 1-9.
U.S. Office Action dated Dec. 3, 2018 in U.S. Appl. No. 15/969,523.
Notice of Allowance dated Jun. 17, 2019 in U.S. Appl. No. 15/969,523.
Corrected Notice of Allowance dated Jun. 20, 2019 in U.S. Appl. No. 15/969,523.
U.S. Office Action dated Jun. 18, 2020 in U.S. Appl. No. 16/572,945.
U.S. Final Office Action dated Sep. 1, 2020 in U.S. Appl. No. 16/572,945.
Notice of Allowance dated Nov. 12, 2020 in U.S. Appl. No. 16/572,945.
PCT Application No. PCT/US19/24408, "International Search Report and Written Opinion", dated Jun. 21, 2019, 9 pages.
Aleksiejunas, et al., "Impact of Diffusivity to Carrier Recombination Rate in Nitride Semiconductors From Bulk GaN to (In,Ga)N Quantum Wells", Japanese Journal of Applied Physics 52, 08JK01, vol. 52, No. 8S, http://dx.doi.org/10.7567/JJAP.52.08JK01, May 20, 2013, 5 pages.
Bulashevich, et al., "Impact of Surface Recombination on Efficiency of III-Nitride Light-Emitting Diodes", Phys. Status Solidi RRL, 1-5, DOI: 10.1002/pssr.201600059, Jun. 2016, 5 pages.
Chen, et al., "Electrically Pumped Continuous-Wave III—V Quantum Dot Lasers on Silicon", Nature Photonics, DOI: 10.1038/NPHOTON.2016.21, Mar. 7, 2016, 6 pages.
Frost, et al., "High Performance Red-emitting Multiple Layer InGAN/GAN Quantum Dot Lasers", Japanese Journal of Applied Physics vol. 55, 032101, Feb. 5, 2016, 4 pages.
Lee, et al., "SiNx-Induced Intermixing in AlInGaAs/InP Quantum Well Through Interdiffusion of Group III Atoms", Journal of Applied Physics, 093109, vol. 112, Issue 9, Nov. 2012, 5 pages.
Lutgen, et al., "Recent Results of Blue and Green InGaN Laser Diodes for Laser Projection", Proceedings of SPIE, vol. 7953, Feb. 16, 2011, 13 pages.
Peter, et al., "LED Epitaxy Technology and Packaging Trends", OSRAM, Opto Semiconductors, EBV-Lighting Academy, Frankfurt, Mar. 16, 2016, 48 pages.
Scajev, et al., "Diffusion-Limited Nonradiative Recombination at Extended Defects in Hydride Vapor Phase Epitaxy GaN Layers", Applied Physics Letters, vol. 98, Issue 20, May 19, 2011, 4 pages.
Schiavon, et al., "Wavelength-Dependent Determination of the Recombination Rate Coefficients in Single-Quantum-Well GaLnN/GaN Light Emitting Diodes", Phys. Status Solidi B vol. 250, No. 2, Nov. 28, 2012, 8 pages.
Shen, et al., "Enabling Area-Selective Potential-Energy Engineering in InGaN/GaN Quantum Wells by Post-Growth Intermixing", Optics Express, vol. 23, No. 6, Mar. 23, 2015, 8 pages.
Stanchu, et al., "High-Resolution X-Ray Diffraction Analysis of Strain Distribution in GaN Nanowires on Si(111) Substrate", Nanoscale Research Letters, vol. 10, No. 51, Feb. 6, 2015, 5 pages.
Yadav, et al., "AlGaInP Red-Emitting Light Emitting Diode Under Extremely High Pulsed Pumping", Proc. of SPIE, 97681K-1, vol. 9768, Mar. 8, 2016, 7 pages.
Zhao, et al., "Toward Ultimate Efficiency: Progress and Prospects on Planar and 3D Nanostructured Nonpolar and Semipolar InGaN Light-Emitting Diodes", Advances in Optics and Photonics, vol. 10, No. 1, Mar. 2018, 63 pages.

* cited by examiner

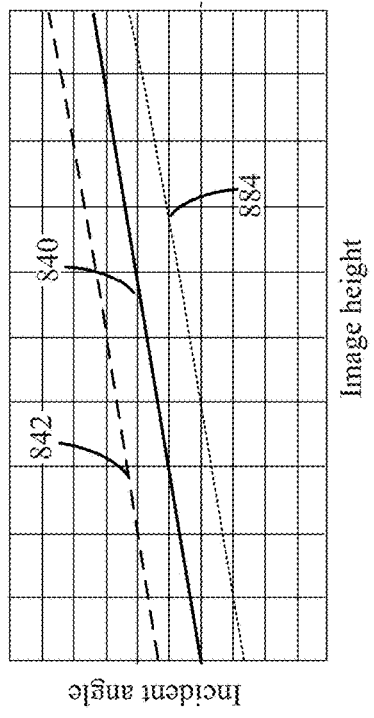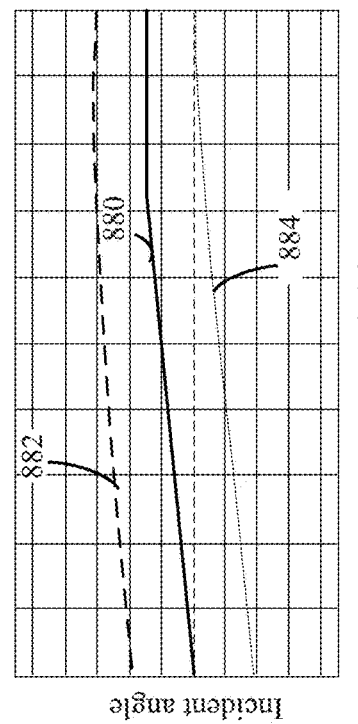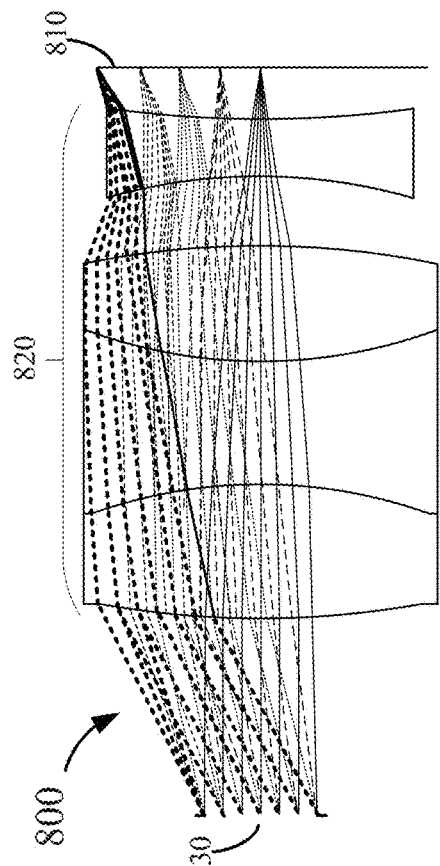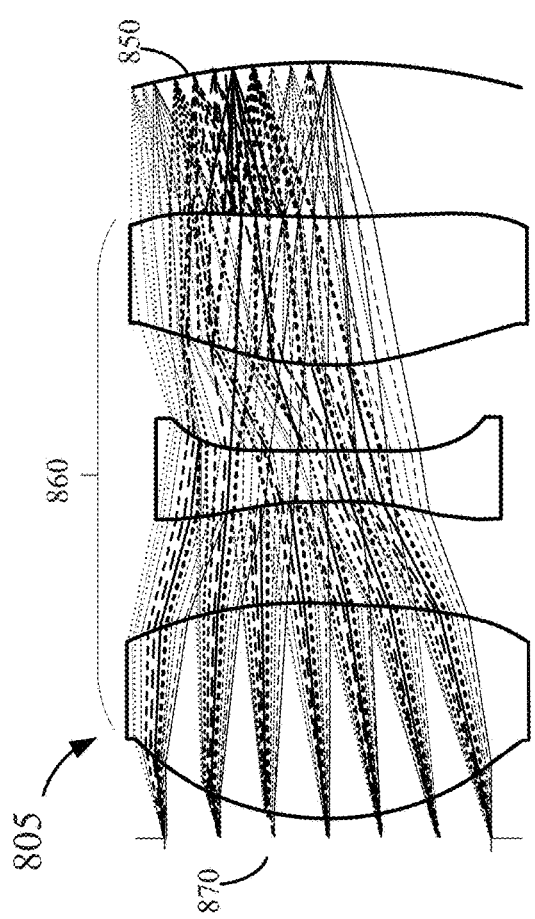
FIG. 8B
FIG. 8D
FIG. 8A
FIG. 8C

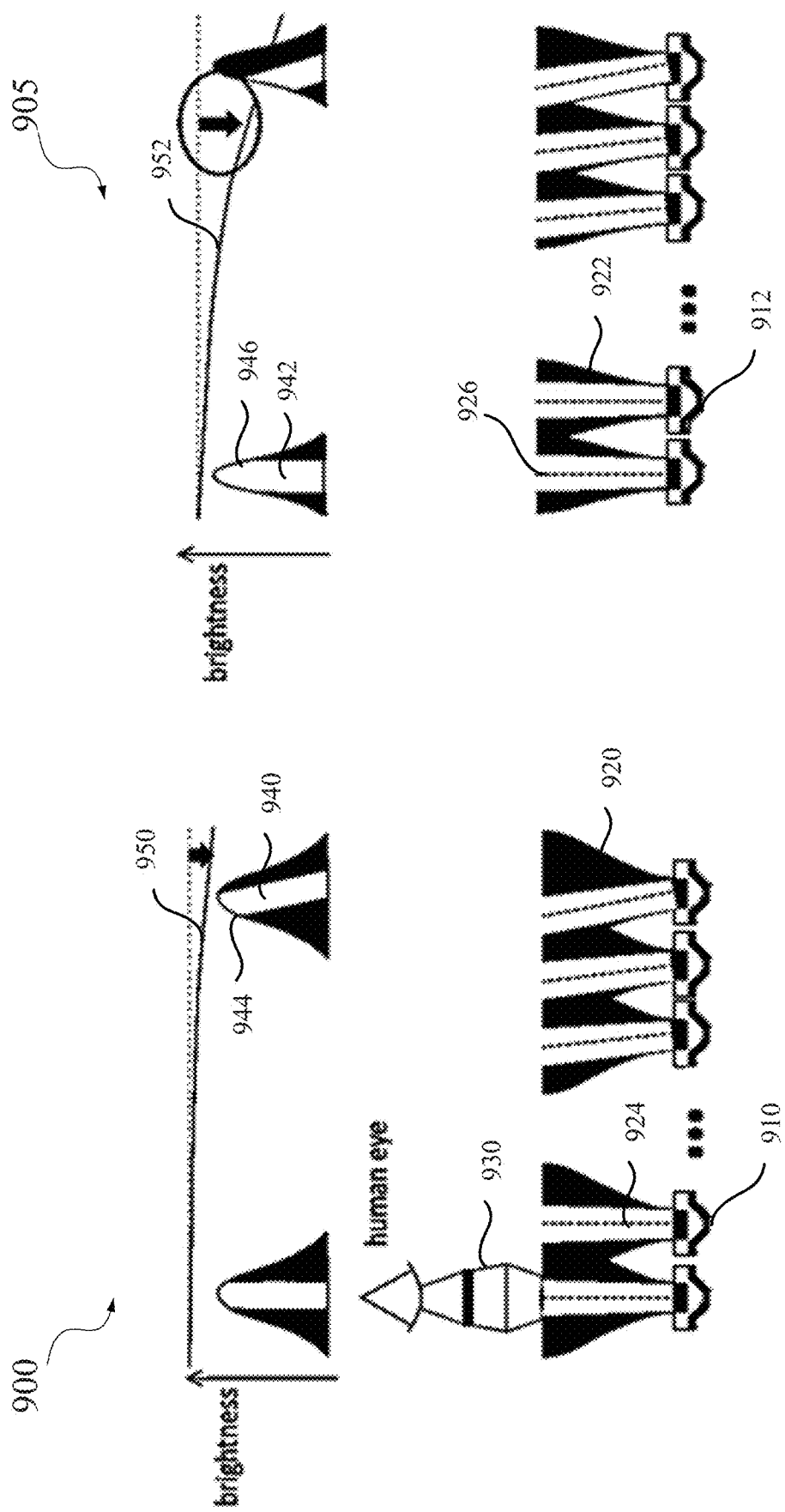

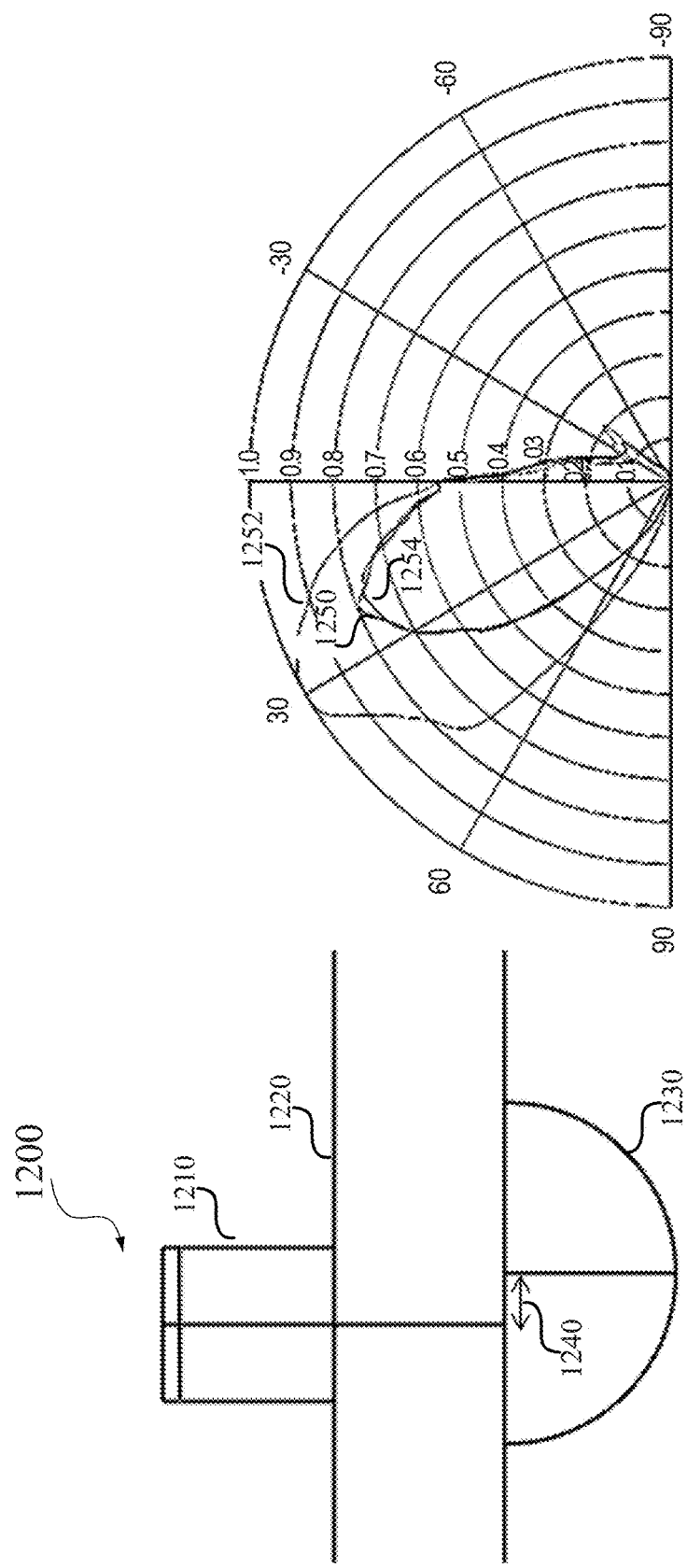

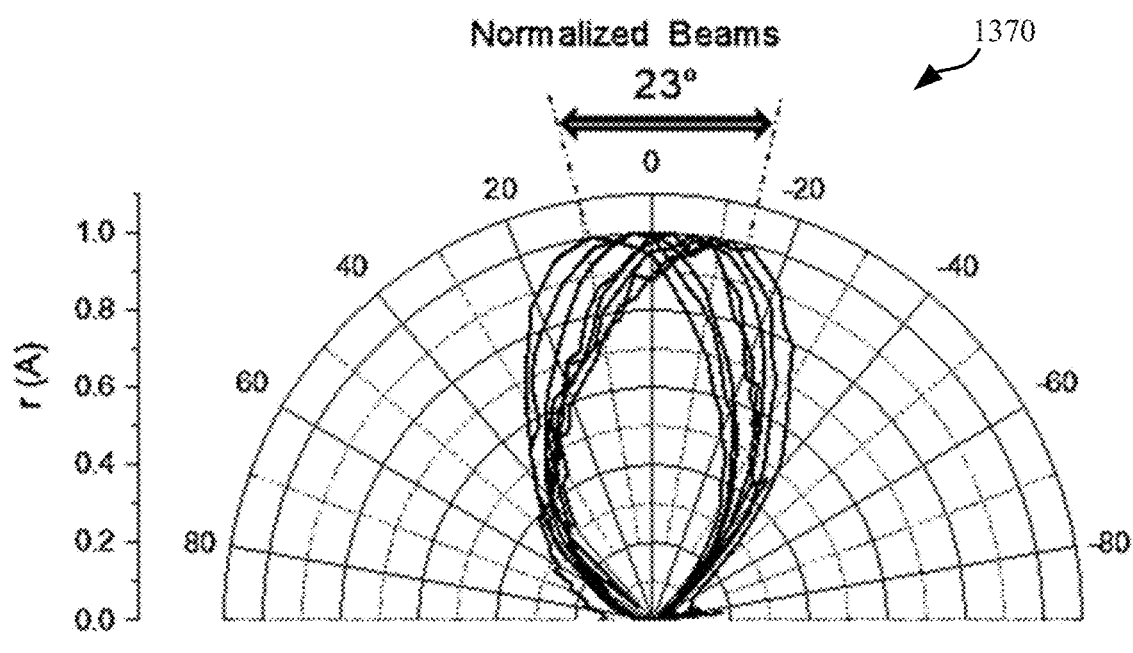
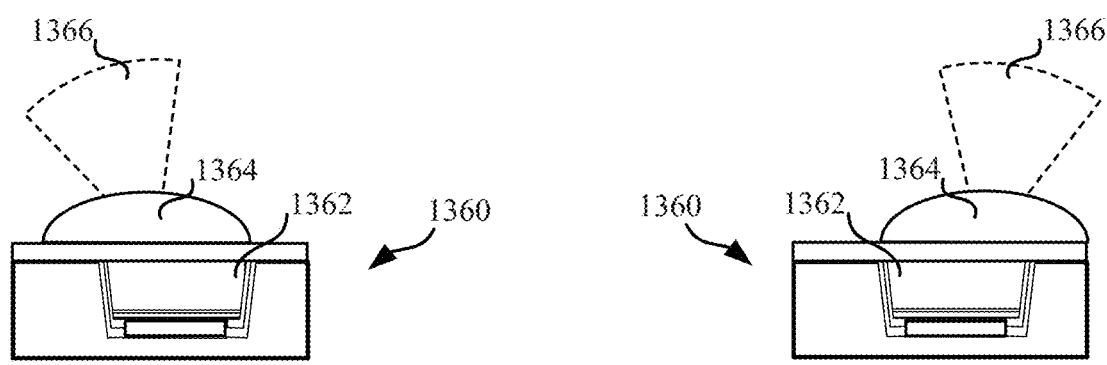
FIG. 13B

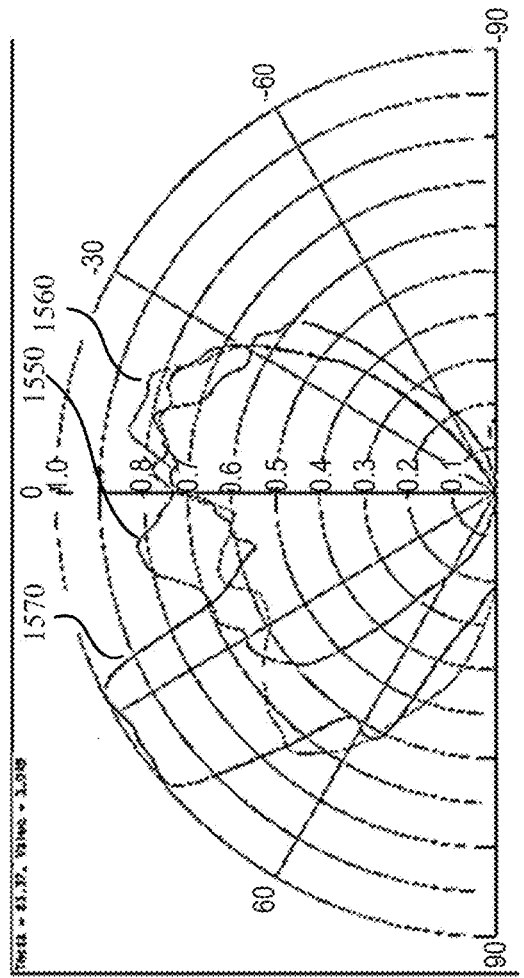
FIG. 15B
FIG. 15A
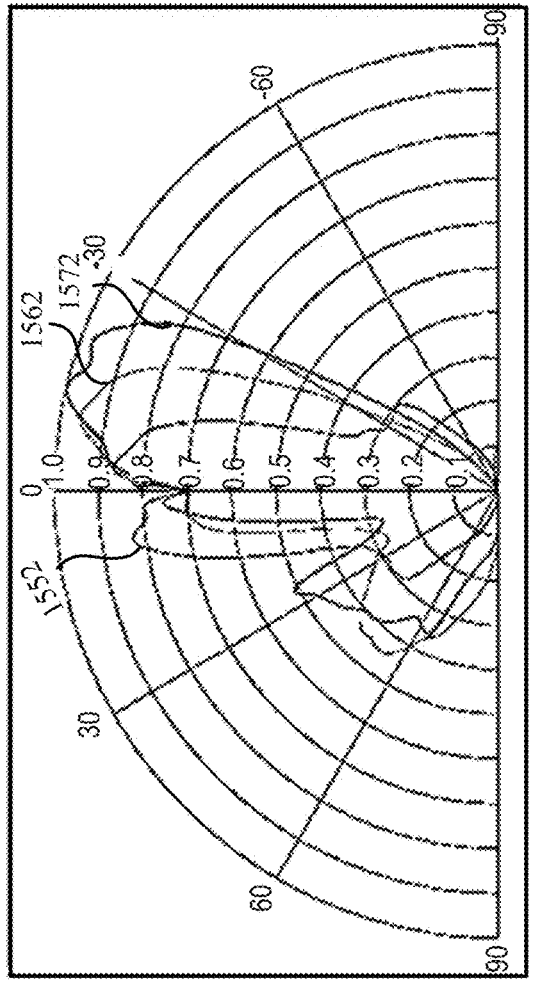
FIG. 15D
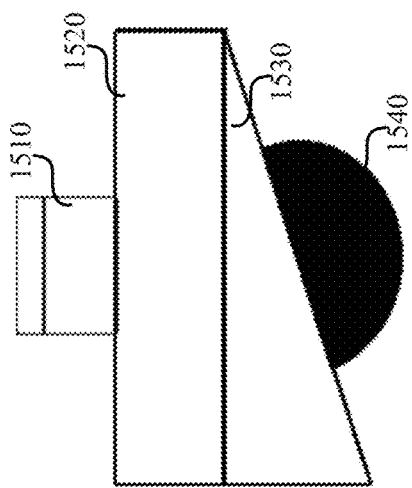
FIG. 15C

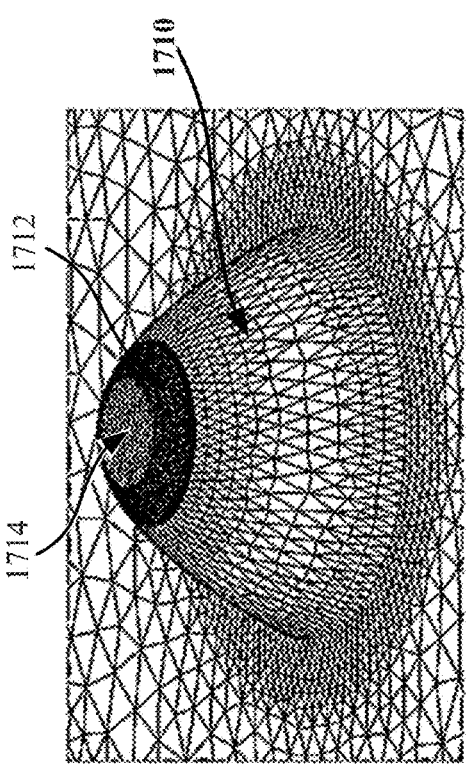
FIG. 17B
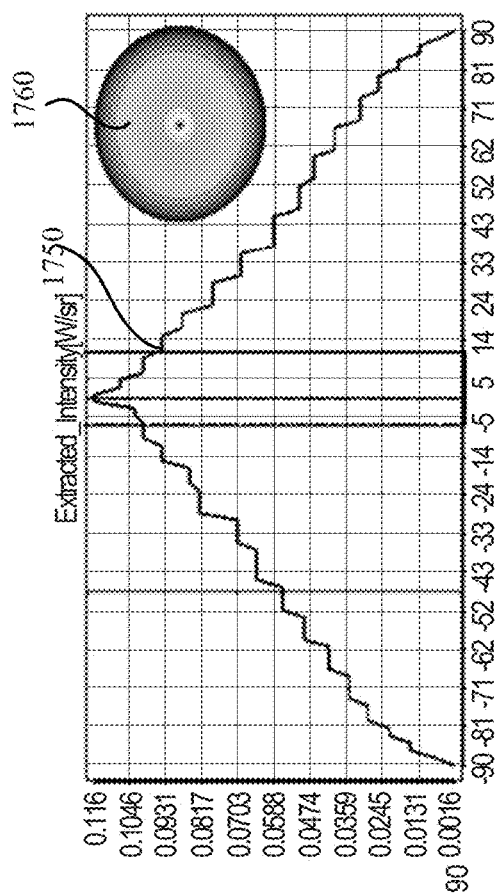
FIG. 17D
FIG. 17A
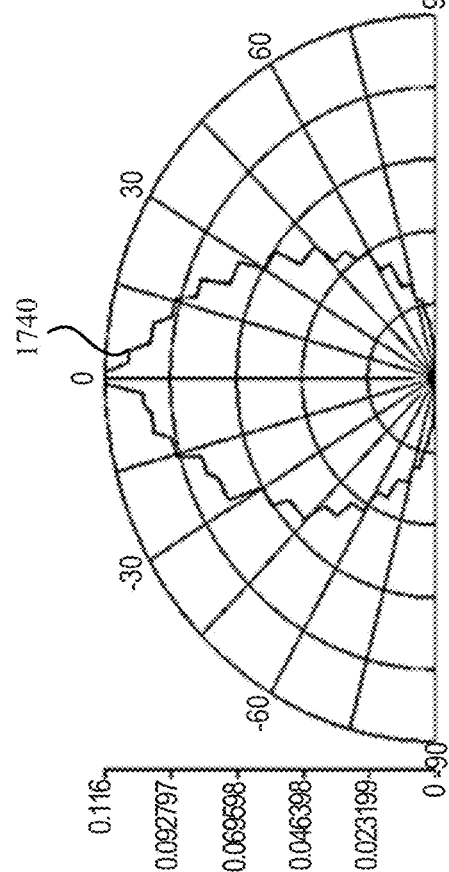
FIG. 17C

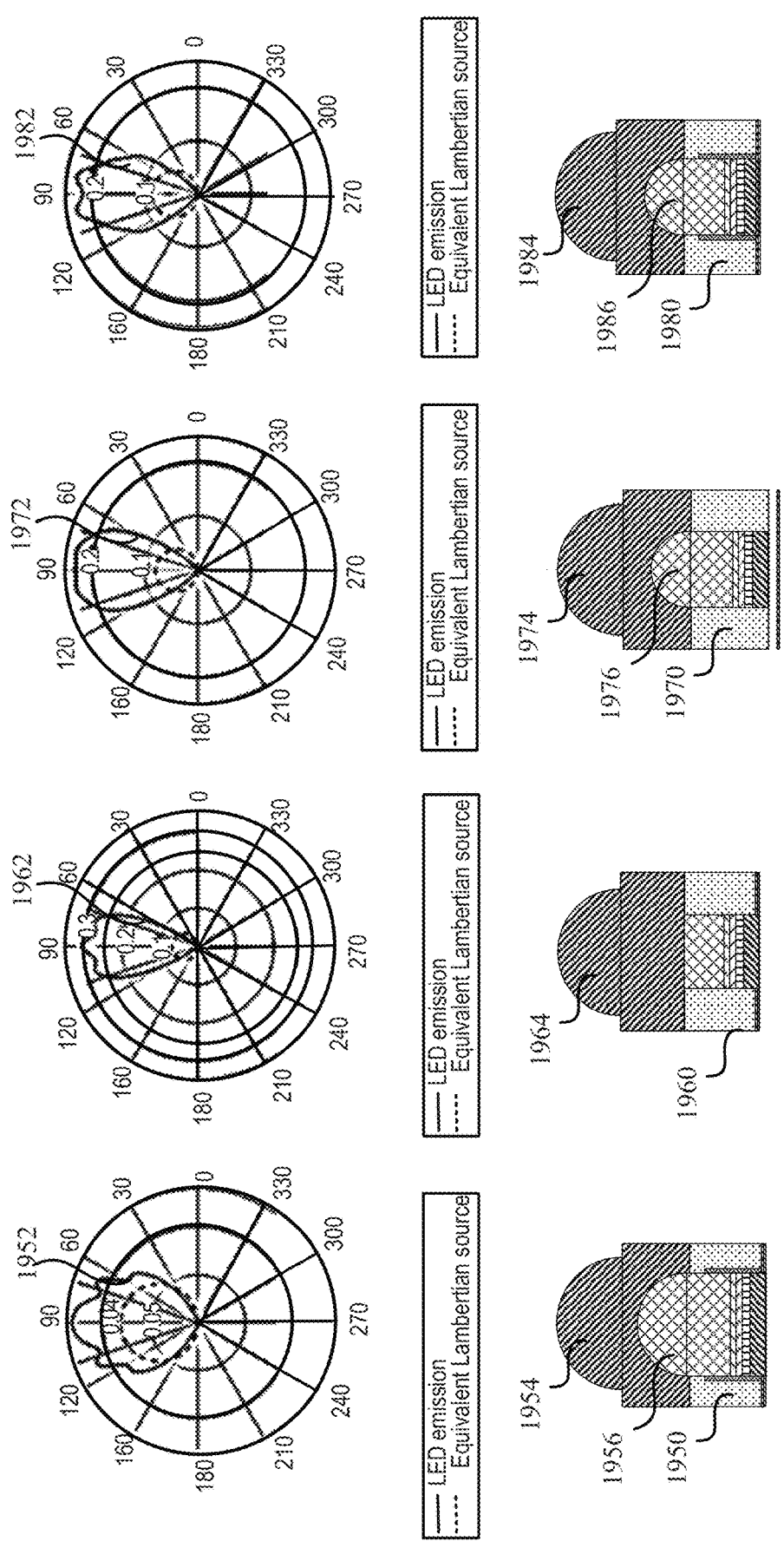

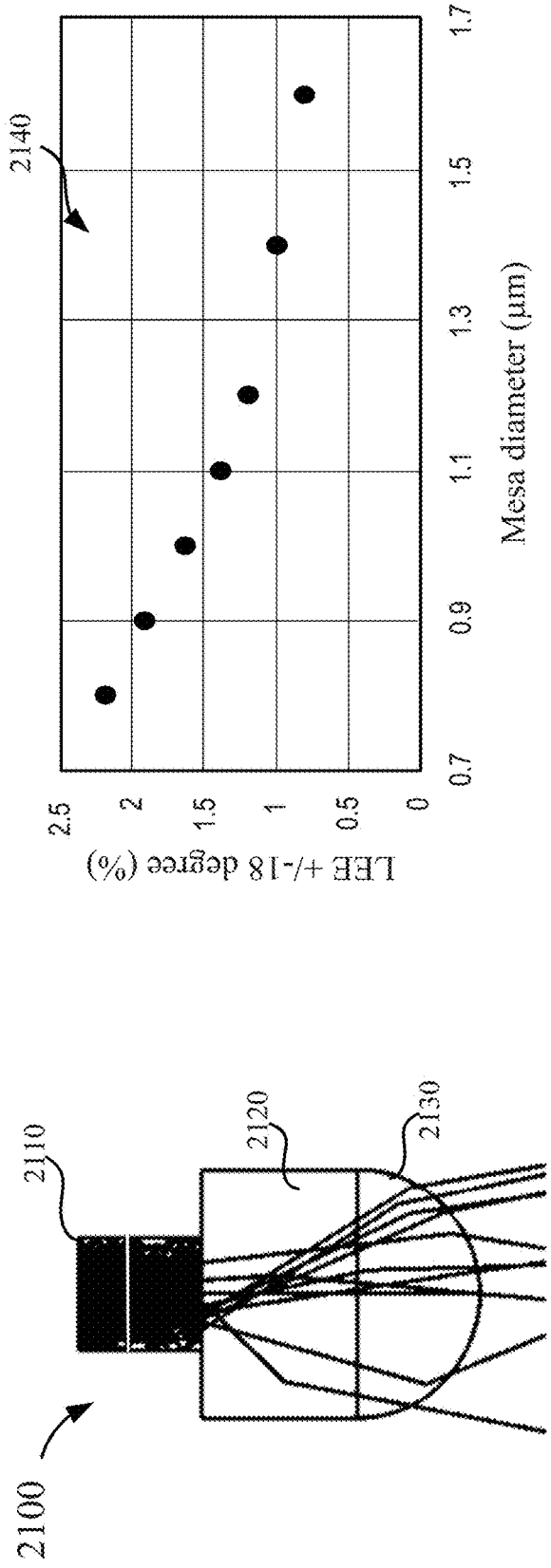
FIG. 21B
FIG. 21A
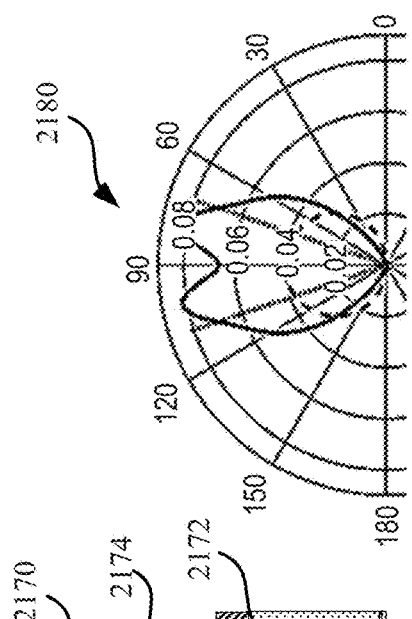
FIG. 21F
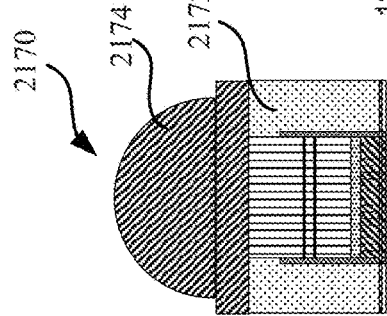
FIG. 21E
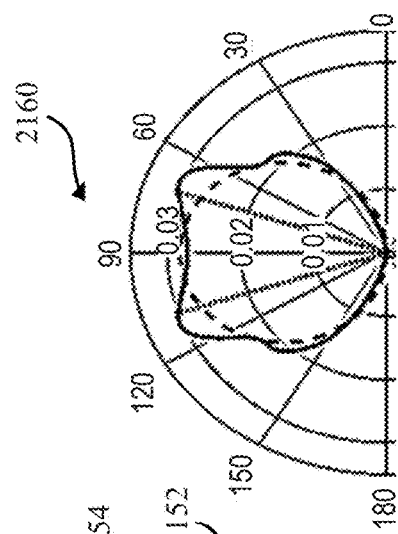
FIG. 21D
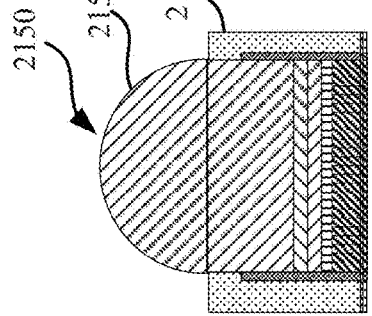
FIG. 21C

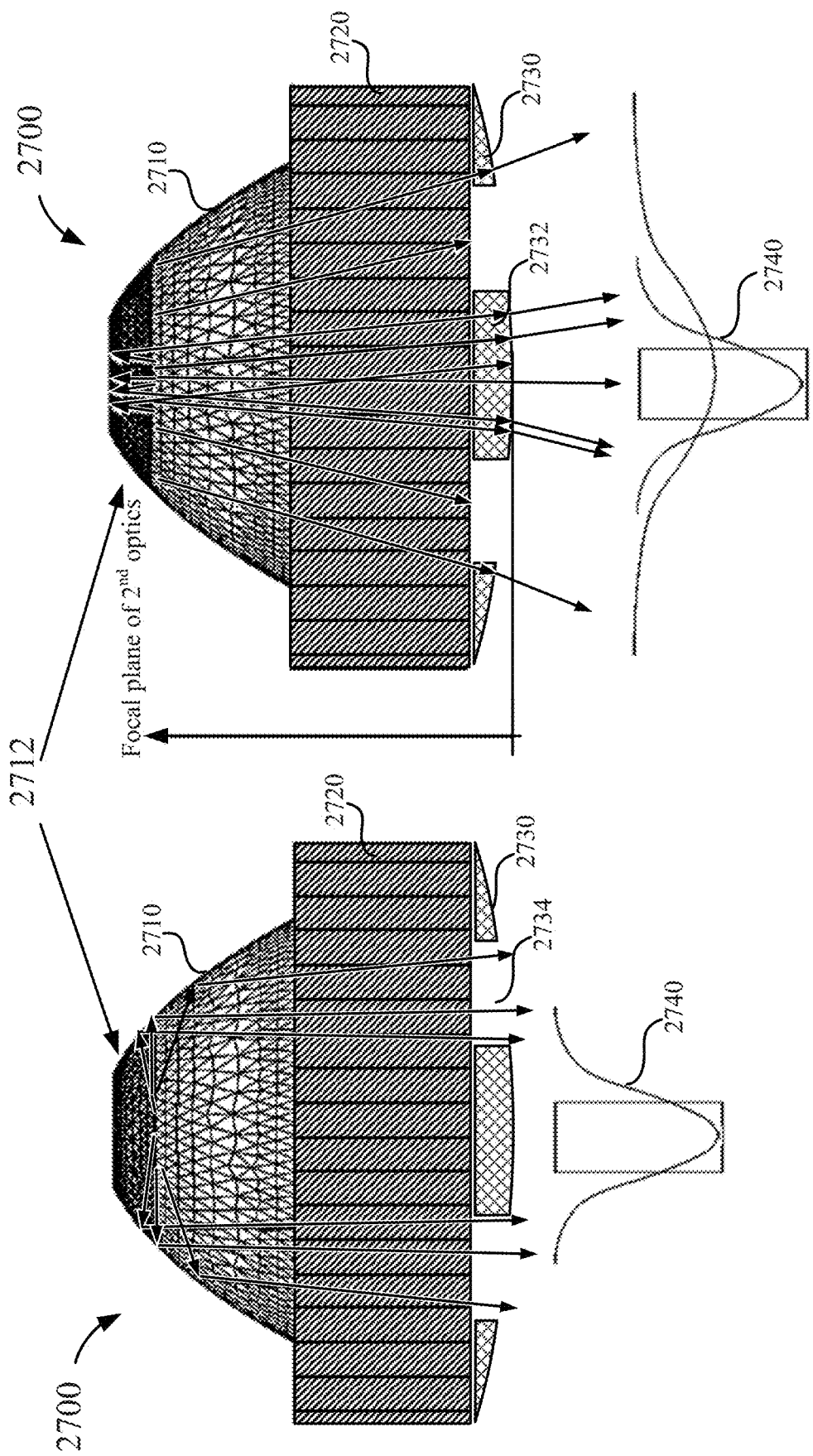

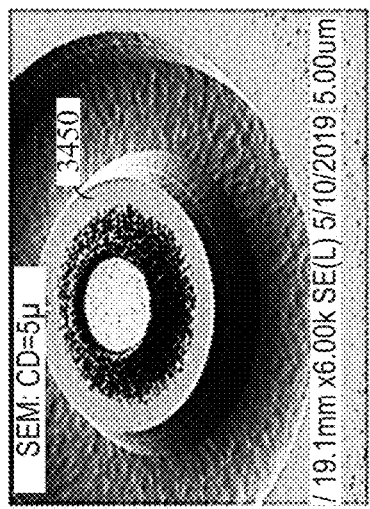
FIG. 34C
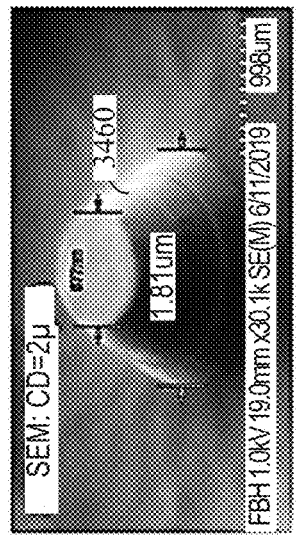
FIG. 34D
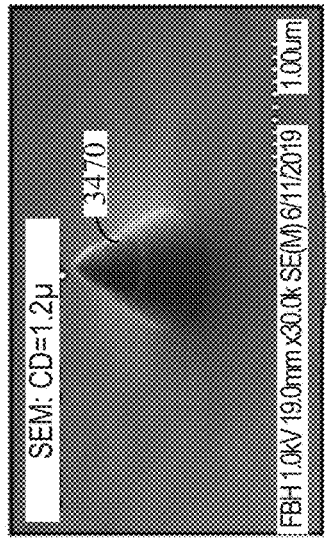
FIG. 34E
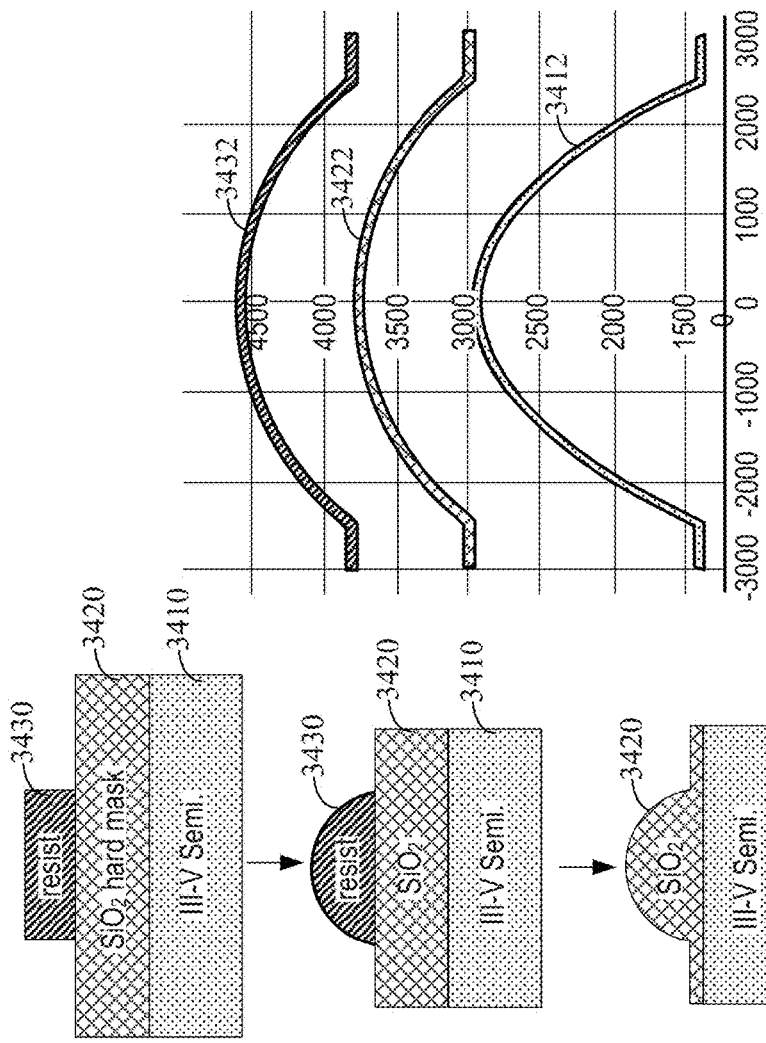
FIG. 34B
FIG. 34A

MICRO-LED DESIGN FOR CHIEF RAY WALK-OFF COMPENSATION

CROSS-REFERENCE TO RELATED APPLICATION

This patent application claims benefit of and priority to U.S. Provisional Patent Application Ser. No. 62/914,892, filed Oct. 14, 2019, entitled "Micro-LED Design For Chief Ray Walk-Off Compensation," the disclosure of which is hereby incorporated by reference in its entirety for all purposes.

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-V semiconductors, such as alloys of AlN, GaN, InN, GaAs, quaternary phosphide compositions (e.g., AlGaInP), and the like, have begun to be developed for various display applications due to their small size (e.g., with a linear dimension less than 100 µm, less than 50 µm, less than 10 µm, or less than 5 µm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to micro light emitting diodes (micro-LEDs). More specifically, this disclosure relates to micro-LEDs with micro-lenses for chief ray walk-off compensation and high-efficiency light coupling from a micro-LED array into a display system and eventually into the user's eyes. According to certain embodiments, a device may include a micro light emitting diode (micro-LED), and a micro-lens on top of the micro-LED and configured to extract light emitted by the micro-LED. The micro-LED may include a mesa structure including semiconductor materials and sidewalls that are vertical or inwardly tilted in a light emitting direction, and a backside reflector on a back surface of the mesa structure. A lateral size of the micro-lens may be equal to or greater than about 80% of a lateral size of the mesa structure. A distance between a focal point of the micro-lens and a top surface of the mesa structure may be between about 0.8 and about 1.25 times of a thickness of the semiconductor materials in the mesa structure.

In some embodiments, the micro-lens may be offset from the micro-LED by a horizontal displacement that is equal to or greater than zero. The micro-lens may include a spherical micro-lens, an aspherical micro-lens, or a toroidal micro-lens, and may include a semiconductor material, a dielectric material (such as $SiO_2$, $TiO_2$, SiN, HfO, or AlN), or a polymer. In some embodiments, the device may also include at least one of a second micro-lens, a wedge, a prism, a roughened surface, an antireflective coating, a diffractive optical element, or a photonic crystal. In some embodiments, the micro-LED may also include a mesa reflector on the sidewalls of the mesa structure. In some embodiments, the lateral size of the mesa structure may be less than about 5 µm. The device may be characterized by a light extraction efficiency greater than about 1% with a ±18° acceptance angle range. In some embodiments, the micro-LED may be configured to emit infrared light, and the lateral size of the vertical mesa structure may be less than about 50 µm.

In some embodiments, the device may include an array of micro-LEDs including a one-dimensional or two-dimensional array of micro-LEDs, and an array of micro-lenses optically coupled to the array of micro-LEDs. Each micro-lens in the array of micro-lenses may be configured to direct a chief ray of light emitted by a corresponding micro-LED in the array of micro-LEDs to a different respective direction. Each micro-lens in the array of micro-lenses may be configured to collimate light emitted by the corresponding micro-LED in the array of micro-LEDs. In some embodiments, each micro-lens in the array of micro-lenses may be characterized by a different respective horizontal displacement from the corresponding micro-LED. In some embodiments, light emitted by the array of micro-LEDs and directed by the array of micro-lenses may form a one-dimensional or two-dimensional illumination pattern.

According to some embodiments, a device may include a micro light emitting diode (micro-LED), and a micro-lens on top of the micro-LED and configured to extract light emitted by the micro-LED. The micro-LED may include a mesa structure having semiconductor materials and sidewalls that are outwardly tilted in a light emitting direction, and a backside reflector on a back surface of the mesa structure. A lateral size of the micro-lens may be equal to or greater than about 80% of a lateral size of the mesa structure. A distance between a focal point of the micro-lens and a top surface of the mesa structure may be between about 1.2 and 4 times of a thickness of the semiconductor materials in the mesa structure.

In some embodiments, the micro-LED may include a mesa reflector conformally formed on the sidewalls of the mesa structure. In some embodiments, the mesa structure may be characterized by a parabolic or conic shape. In some embodiments, the mesa structure may be characterized by a conic shape and a mesa facet angle between about 30° and about 40°. The micro-LED may be characterized by a half-width half-magnitude light emission angle less than about 60°. In some embodiments, the micro-LED may be characterized by a half-width half-magnitude light emission angle between about 30° and about 50°. In some embodiments, the micro-LED may be characterized by a half-width half-magnitude light emission angle between about 15° and about 30°. In some embodiments, the micro-LED may be characterized by a half-width half-magnitude light emission angle less than about 15°. In some embodiments, the micro-LED may be configured to emit visible light, and the lateral size of the mesa structure may be between about 0.5 µm and about 10 µm. In some embodiments, the micro-LED may be configured to emit infrared light, and the lateral size of the mesa structure may be less than about 50 µm.

In some embodiments, the micro-lens may be offset from the micro-LED by a horizontal displacement that is equal to or greater than zero. The micro-lens may include a spherical micro-lens, an aspherical micro-lens, or a toroidal micro-lens. The micro-lens may include a semiconductor material, a dielectric material (such as $SiO_2$, $TiO_2$, SiN, HfO, or AlN), or a polymer. In some embodiments, the device may also include at least one of a second micro-lens, a wedge, a prism, a roughened surface, an antireflective coating, a diffractive optical element, or a photonic crystal.

In some embodiments, the device may include an array of micro-LEDs including a one-dimensional or two-dimensional array of micro-LEDs, and an array of micro-lenses optically coupled to the array of micro-LEDs. Each micro-lens in the array of micro-lenses may be configured to direct a chief ray of light emitted by a corresponding micro-LED in the array of micro-LEDs to a different respective direction. Each micro-lens in the array of micro-lenses may be characterized by a different respective horizontal displacement from the corresponding micro-LED. In some embodiments, the array of micro-LEDs may be characterized by a pitch less than about 10 µm. In some embodiments, the light emitted by the array of micro-LEDs and directed by the array of micro-lenses may form a one-dimensional or two-dimensional illumination pattern. In some embodiments, each micro-lens in the array of micro-lenses may be configured to collimate light emitted by each corresponding micro-LED in the array of micro-LEDs. In some embodiments, the device may include an electrical integrated circuit bonded to the array of micro-LEDs.

According to certain embodiments, a display system may include an array of micro light emitting diodes (micro-LEDs), an array of output couplers optically coupled to the array of micro-LEDs and configured to extract light emitted by respective micro-LEDs in the array of micro-LEDs, display optics, and a waveguide display. The display optics may be configured to couple the light emitted by the array of micro-LEDs and extracted by the array of output couplers into the waveguide display. Each output coupler in the array of output couplers may be configured to direct a chief ray of the light emitted by a respective micro-LED in the array of micro-LEDs to a different respective direction.

Each micro-LED in the array of micro-LEDs may include a mesa structure that has an inward tilted, vertical, or outward tilted shape. The mesa structure may include a mesa reflector on sidewalls of the mesa structure, and a back reflector including a semiconductor layer and a metal electrode. In some embodiments, each micro-LED in the array of micro-LEDs may be characterized by a half-width half-magnitude light emission angle less than 60°. In some embodiments, the array of micro-LEDs may be configured to emit visible light, and the mesa structure may be characterized by a linear dimension between about 0.5 µm and about 10 µm. In some embodiments, the array of micro-LEDs is characterized by a pitch less than about 10 µm. In some embodiments, the mesa structure may be characterized by a conic shape and a mesa facet angle between about 30° and about 40°. In some embodiments, the device may include an electrical integrated circuit bonded to the array of micro-LEDs.

In some embodiments, each output coupler in the array of output couplers may be offset from a respective micro-LED in the array of micro-LEDs by at least one of a vertical or horizontal displacement that is equal to or greater than zero. Each output coupler in the array of output couplers may include at least one of a micro-lens, a wedge, a prism, a roughened surface, an antireflective coating, a diffractive optical element, or a photonic crystal. The micro-lens may include a dielectric material, an organic material, or a semiconductor material. The micro-lens may include a spherical micro-lens, an aspherical micro-lens, or a toroidal micro-lenses. In some embodiments, each output coupler in the array of output couplers may include a first micro-lens, a first diffractive optical element, or a first photonic crystal; and at least one of a second micro-lens, a second diffractive optical element, a second photonic crystal, a wedge, a prism, a roughened surface, or an antireflective coating.

In some embodiments, the array of output couplers may include an array of micro-lenses, such as spherical micro-lenses, aspherical micro-lenses, or toroidal micro-lenses, where each micro-lens in the array of micro-lenses may correspond to a respective micro-LED in the array of micro-LEDs. Each micro-lens in the array of micro-lenses may be offset from the corresponding micro-LED in the array of micro-LEDs by a respective horizontal or vertical displacement value, where a first displacement value for a first micro-lens in the array of micro-lenses may be different from a second displacement value for a second micro-lens in the array of micro-lenses. Each micro-lens in the array of micro-lenses may be configured to collimate light from each corresponding micro-LED in the array of micro-LEDs. In some embodiments, the array of micro-LEDs may include a two-dimensional array of micro-LEDs, and the array of output couplers may include a two-dimensional array of micro-lenses. The array of output couplers may include a dielectric material, an organic material, or a semiconductor material. The dielectric material may include silicon oxide or silicon nitride.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 8A illustrates an example of a micro-LED-based display system including a linear micro-LED array and display optics according to certain embodiments. FIG. 8B illustrates angles of light incident on the display optics from the linear micro-LED array according to certain embodiments. FIG. 8C illustrates an example of a micro-LED-based display system including a curved micro-LED array and display optics according to certain embodiments. FIG. 8D illustrates angles of light incident on the display optics from the curved micro-LED array according to certain embodiments.

FIG. 9A illustrates uniformity and brightness of light extracted from a micro-LED array having broad beam profiles according to certain embodiments. FIG. 9B illustrates uniformity and brightness of light extracted from a micro-LED array having narrow beam profiles according to certain embodiments.

FIG. 12A illustrates an example of a micro-LED including a vertical mesa structure and a horizontally offset micro-lens and having a narrow beam profile according to certain embodiments. FIG. 12B illustrates a simulated beam profile of the example of the micro-LED shown in FIG. 12A according to certain embodiments.

FIG. 13B illustrates simulation results of chief ray angle modification for examples of red micro-LEDs using micro-lenses with different displacements according to certain embodiments.

FIG. 15A illustrates an example of a micro-LED including a vertical mesa structure and a wedge according to certain embodiments. FIG. 15B illustrates simulated beam profiles of examples of micro-LEDs having the structure of the micro-LED shown in FIG. 15A according to certain embodiments. FIG. 15C illustrates an example of a micro-LED including a vertical mesa structure, a wedge, and a micro-lens according to certain embodiments. FIG. 15D illustrates simulated beam profiles of examples of micro-LEDs having the structure of the micro-LED shown in FIG. 15C according to certain embodiments.

FIGS. 17A-17D illustrate simulation results of a beam profile of a light beam extracted from an example of a red micro-LED having a parabolic mesa and an anti-reflection coating layer at an out-coupling surface according to certain embodiments.

FIGS. 19A-19H illustrate simulation results of light extracted from examples of green micro-LEDs including vertical mesas according to certain embodiments.

FIG. 21A illustrates an example of a red micro-LED including a vertical mesa and a remote lens according to certain embodiments. FIG. 21B illustrates simulation results of light extraction efficiencies for examples of red micro-LEDs having the structure of the micro-LED shown in FIG. 21A and having different sizes according to certain embodiments. FIG. 21C illustrates an example of a red micro-LED including a vertical mesa and a native lens according to certain embodiments. FIG. 21D illustrates a beam profile of the example of red micro-LED of FIG. 21C according to certain embodiments. FIG. 21E illustrates an example of a red micro-LED including a vertical mesa and a non-native lens according to certain embodiments. FIG. 21F illustrates a beam profile of the example of red micro-LED of FIG. 21E according to certain embodiments.

FIGS. 27A-27B illustrate an example of a micro-LED having a parabolic mesa and a micro-lens according to certain embodiments.

FIG. 34A illustrates an example of a method for fabricating a micro-lens array for light extraction from a micro-LED array or fabricating mesa structures of the micro-LED array according to certain embodiments. FIG. 34B illustrates examples of height profiles of a photoresist layer, a dielectric layer, and a semiconductor layer at different stages of the fabrication of the micro-lens array or mesa structures according to certain embodiments. FIGS. 34C-34E illustrate examples of mesa structures or lenses fabricated using the method described with respect to FIG. 34A.

Figure 1:
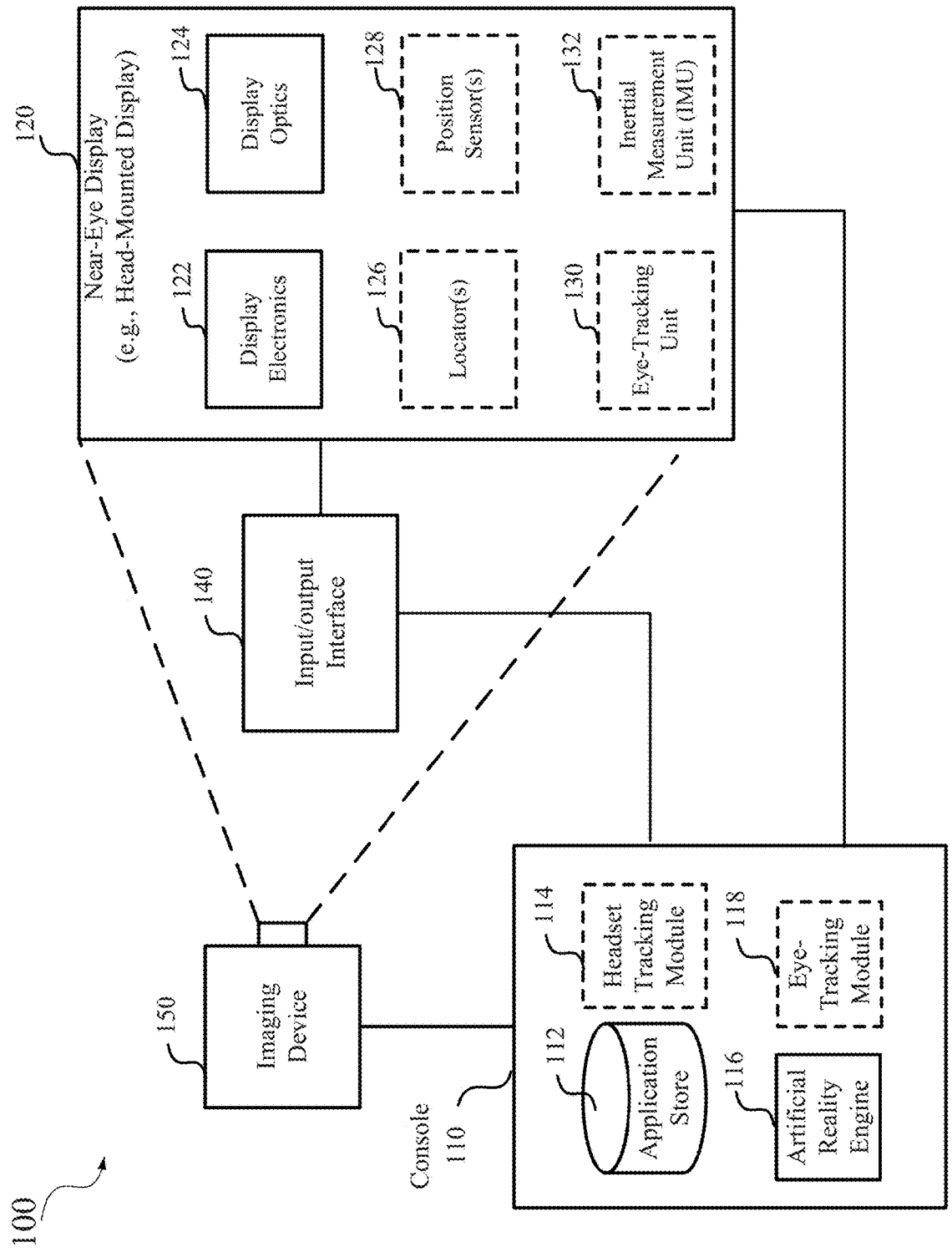
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to light emitting diodes (LEDs). More specifically, and without limitation, disclosed herein are techniques for optimizing the beam profiles and directions of light extracted from a micro-LED array to more efficiently couple the extracted light through a display system onto the user's eyes. In some micro-LED-based display systems, light emitted from a micro-LED array may be collimated and coupled into a display (e.g., a waveguide display) for delivering images to an output pupil (or eyebox). The overall efficiency $\eta_{tot}$ of a micro-LED-based display system may be determined by $\eta_{tot}=\eta_{EQE}\times\eta_{in}\times\eta_{out}$, where $\eta_{EQE}$ is the external quantum efficiency (EQE) of each micro-LED and may be proportional to the carrier (e.g., electron) injection efficiency, the internal quantum efficiency, and the light extraction efficiency (LEE), $\eta_{in}$ is the in-coupling efficiency of display light from the micro-LEDs into the waveguide, and $\eta_{out}$ is the out-coupling efficiency of the display light from the waveguide towards the user's eye. For example, only a fraction of the extracted light that is within a certain solid angle may be coupled into the waveguide and eventually reach the user's eyes due to the limited field of view and/or exit pupil (or eyebox) of the display system. In some embodiments, the micro-LED array may be used to illuminate user's eyes for eye tracking.

According to certain embodiments, a micro-lens array may be used to extract light from a micro-LED array and direct the light to desired directions for coupling into a waveguide in a waveguide-based display system (e.g., using additional coupling optics) or onto user's eyes from different directions for eye illumination in eye tracking. The micro-lens array may be characterized by a pitch different from the pitch of the micro-LED array in at least one dimension such that the offset between the center of a micro-lens and the center of a corresponding micro-LED may vary across the micro-lens array in at least one dimension. As such, the chief ray of the light extracted from each micro-LED may propagate in a desired respective direction due to the different offsets, such that the part of the light beam with higher intensity may reach the user's eyes through the waveguide-based display system that may have a limited field of view and/or exit pupil (or eyebox). In addition, parameters of the micro-LED (e.g., the mesa structure and the dimensions of the micro-LED) may be chosen to achieve a narrow beam profile (e.g., with a half-width half-magnitude (HWHM) angle less than 60°, such as less than 30°) and a high external quantum efficiency. As a result, the micro-LED array and the micro-lens array may, in combination, more efficiently extract light from the micro-LED array and direct the light beams to the desired directions in the display system, such that light generated by the micro-LED array can be projected through the display system into the user's eyes with a high overall efficiency.

The micro-lens array can be fabricated using various techniques, such as reflowing patterned polymers (e.g., photoresist) or using a gray-scale photomask and a photoresist with a linear response to exposure dosage to form the micro-lens array in the photoresists, and/or dry-etching the polymers or the photoresist to transfer the pattern and shape of the micro-lens array into a dielectric material layer or a semiconductor layer (e.g., a substrate or an oxide layer). The micro-lens array can also be fabricated using direct E-beam etching. Various inventive embodiments are described herein, including devices, systems, methods, materials, processes, and the like.

The micro-LEDs and micro-lenses described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs) each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

I. Artificial Reality System

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
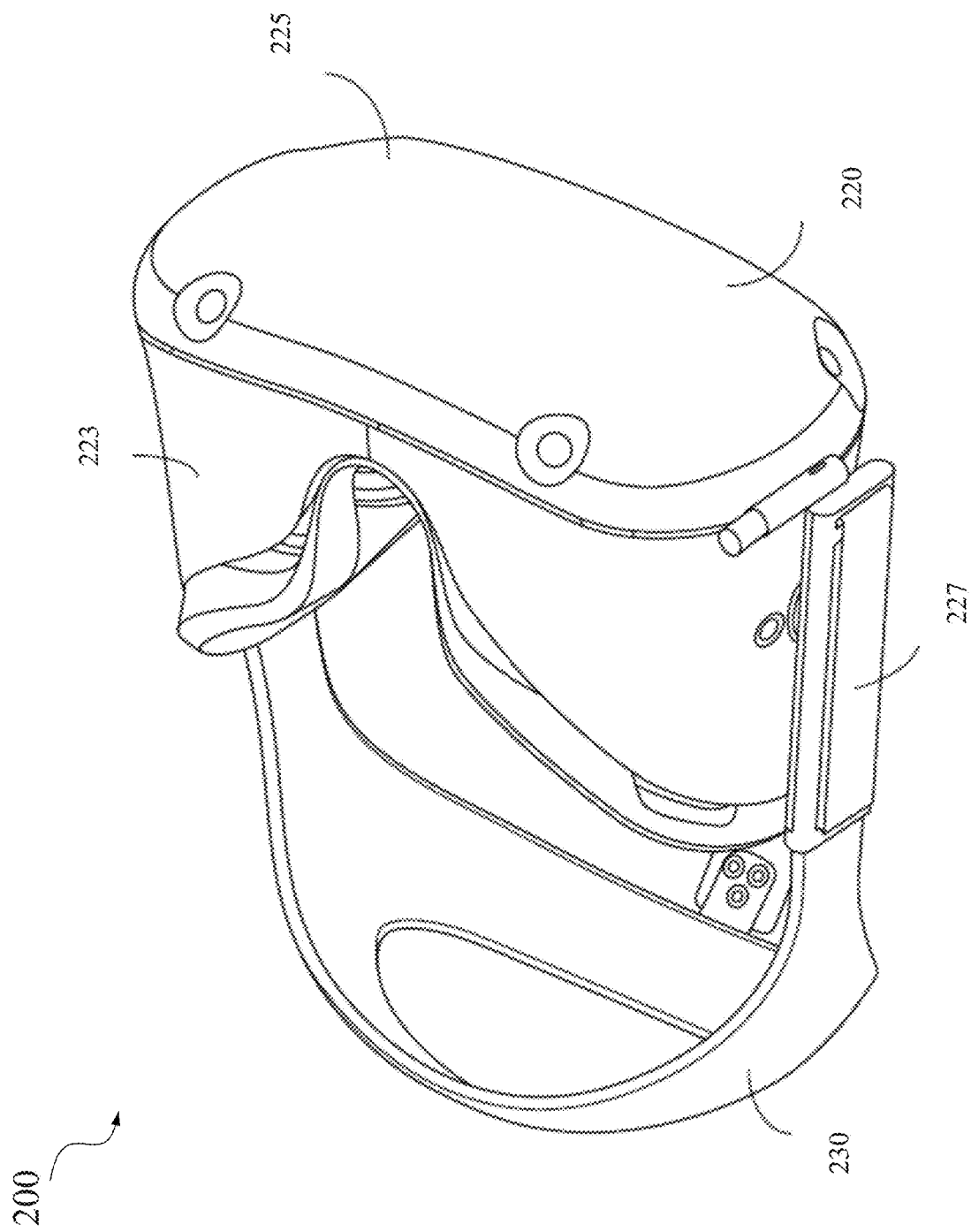
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a µLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
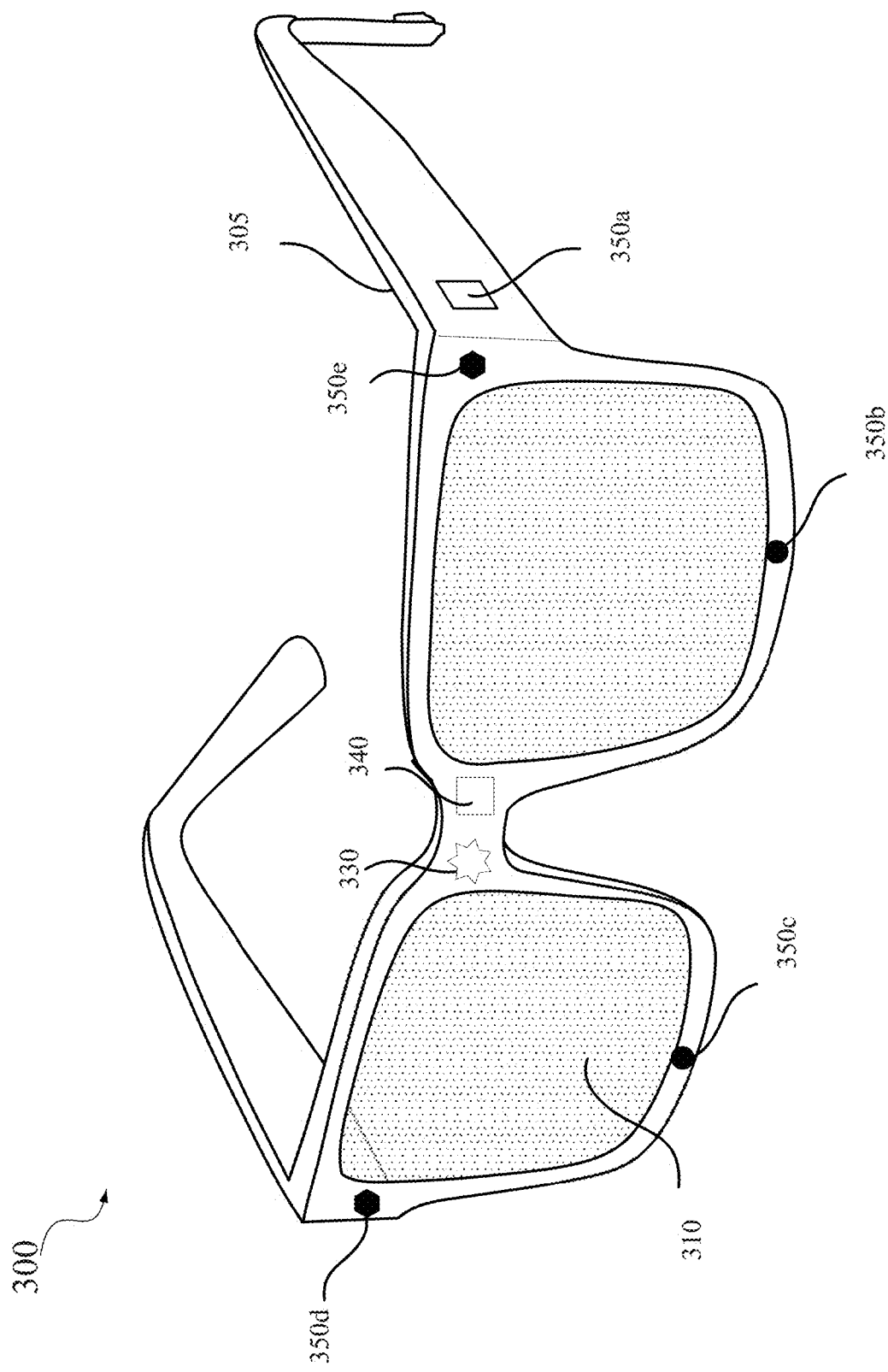
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

II. Waveguide Display

Figure 4:
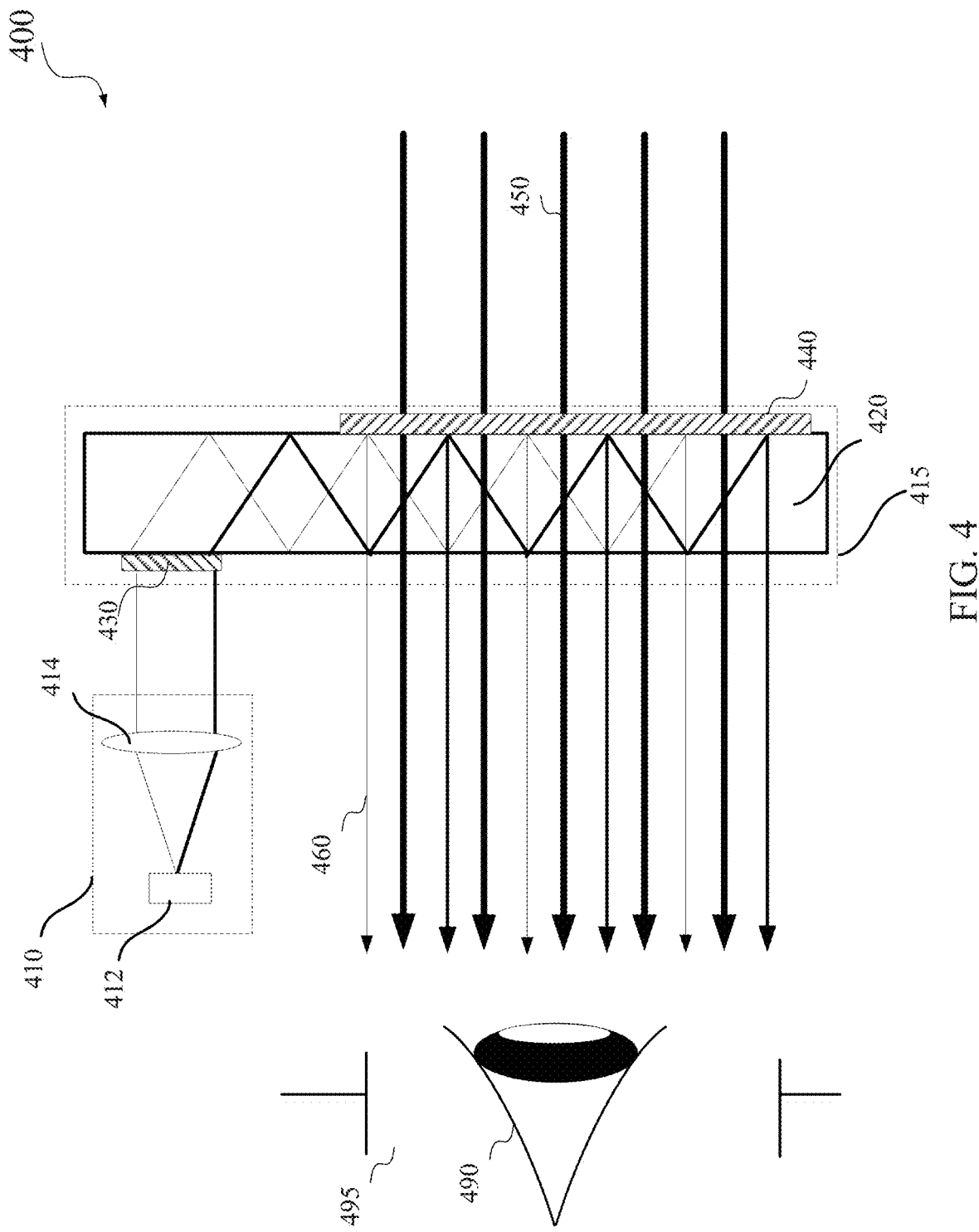
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above) each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440 each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or a transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 to certain desired directions (i.e., diffraction angles) with little loss. As a result, the user may be able to view combined images of the environment in front of combiner 415 and images of virtual objects projected by projector 410.

Figure 5B:
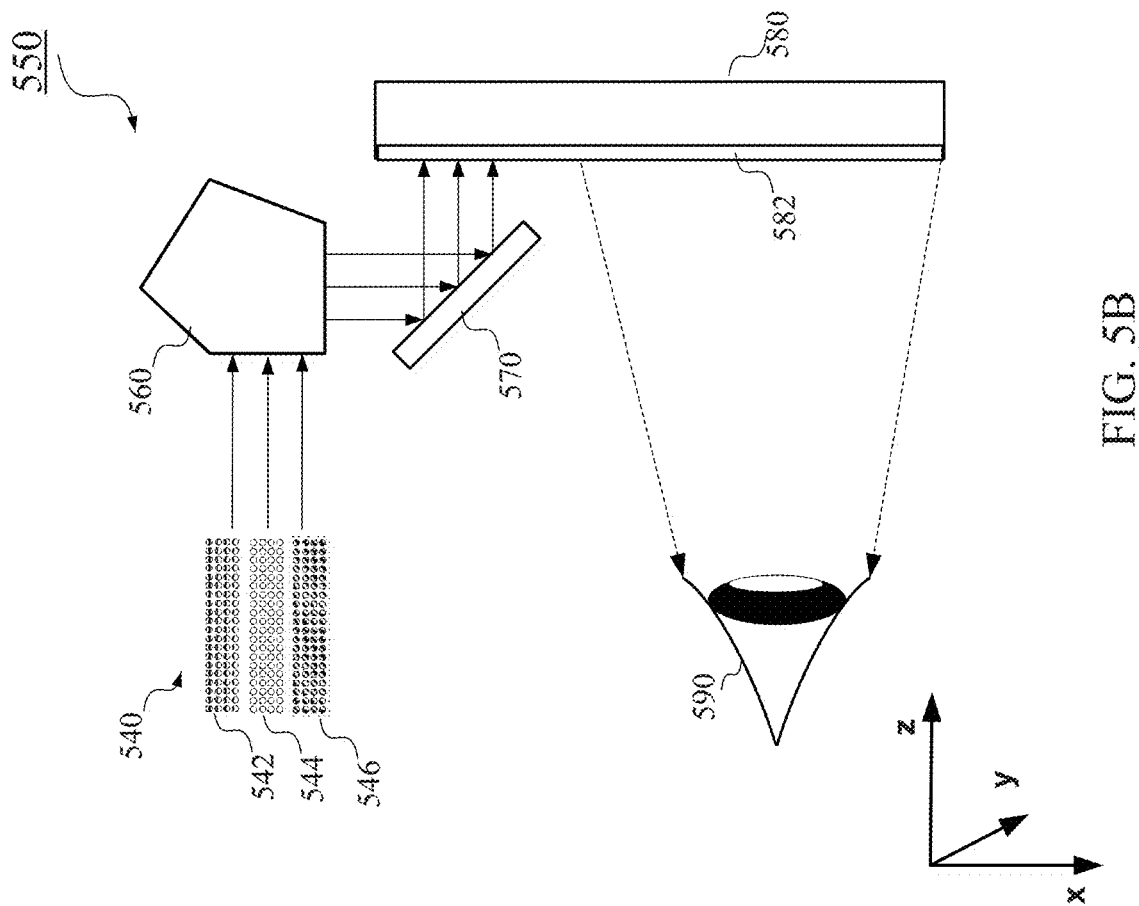
FIG. 5B illustrates an example of a near-eye display device including a waveguide display according to certain embodiments.
Figure 5A:
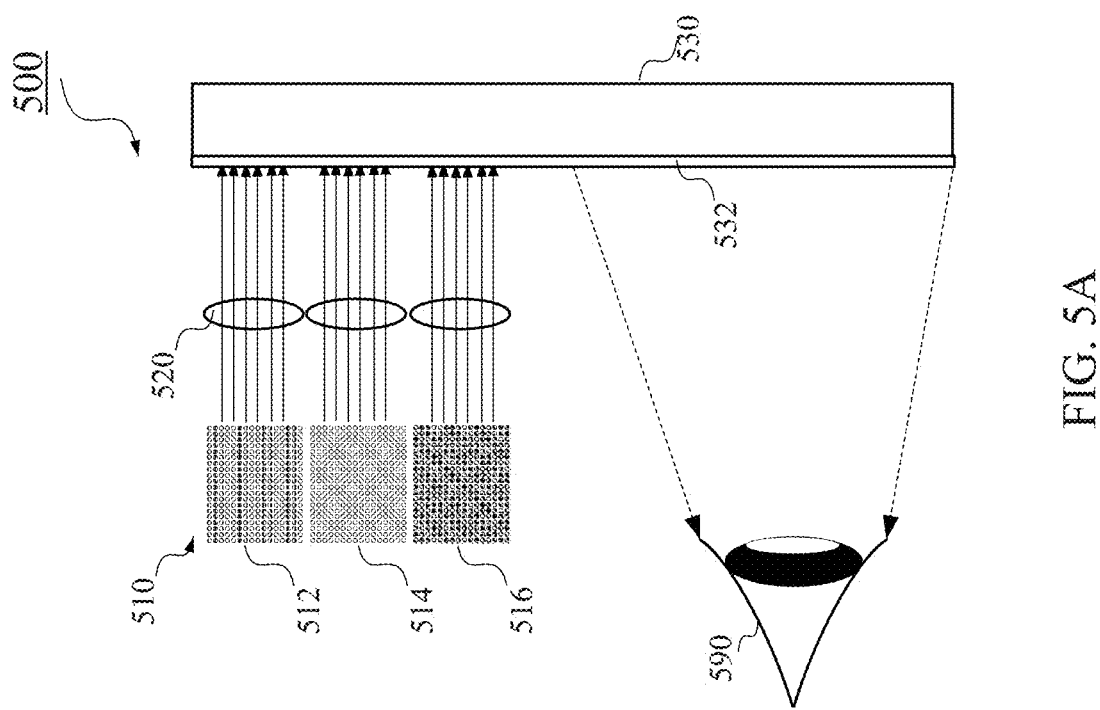
FIG. 5A illustrates an example of a near-eye display device including a waveguide display according to certain embodiments.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 µm (e.g., about 1.2 µm) and the pitch may be less than 2 µm (e.g., about 1.5 µm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 µm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facets prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different areas of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
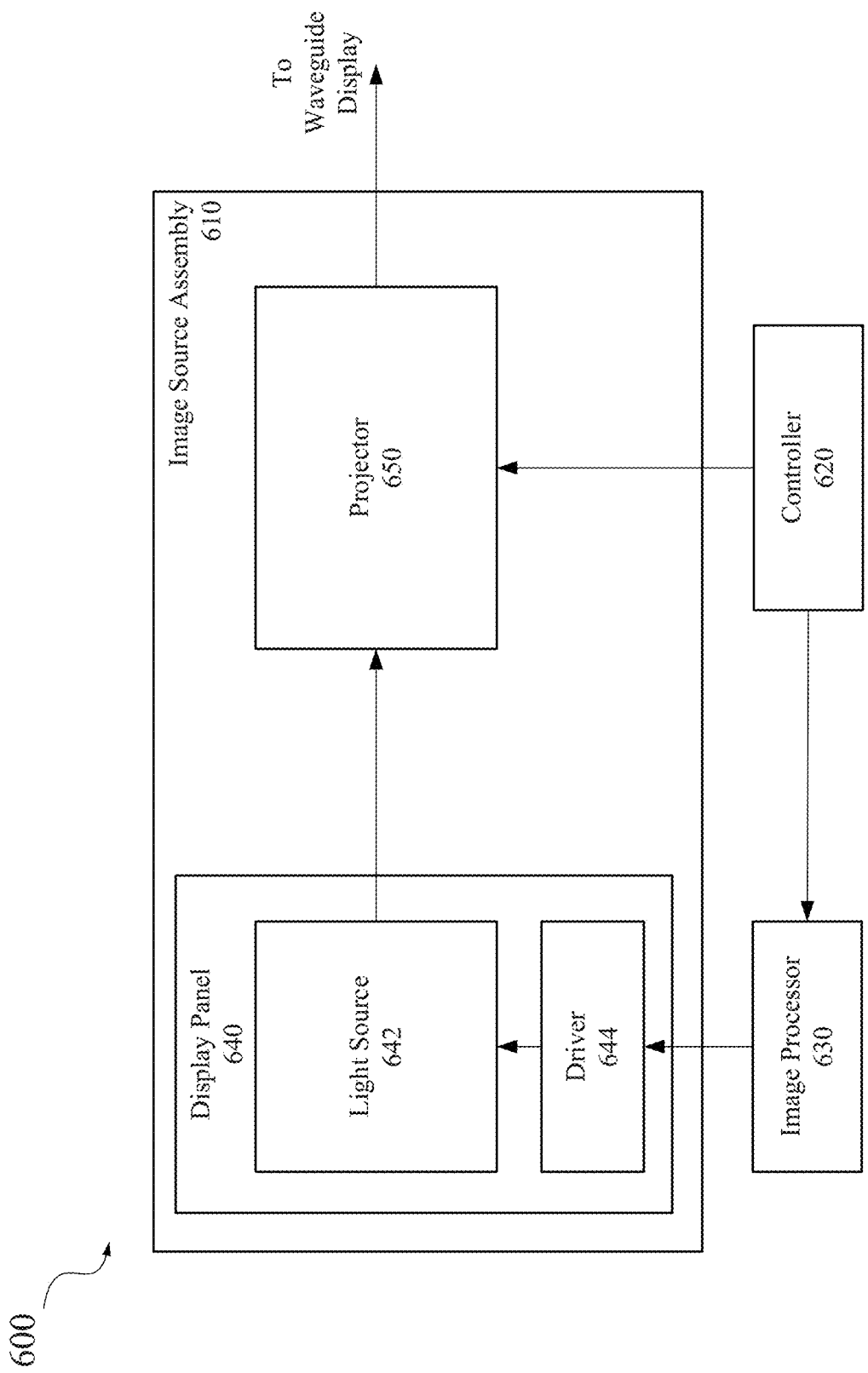
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include heterostructures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

III. Micro-LEDs

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
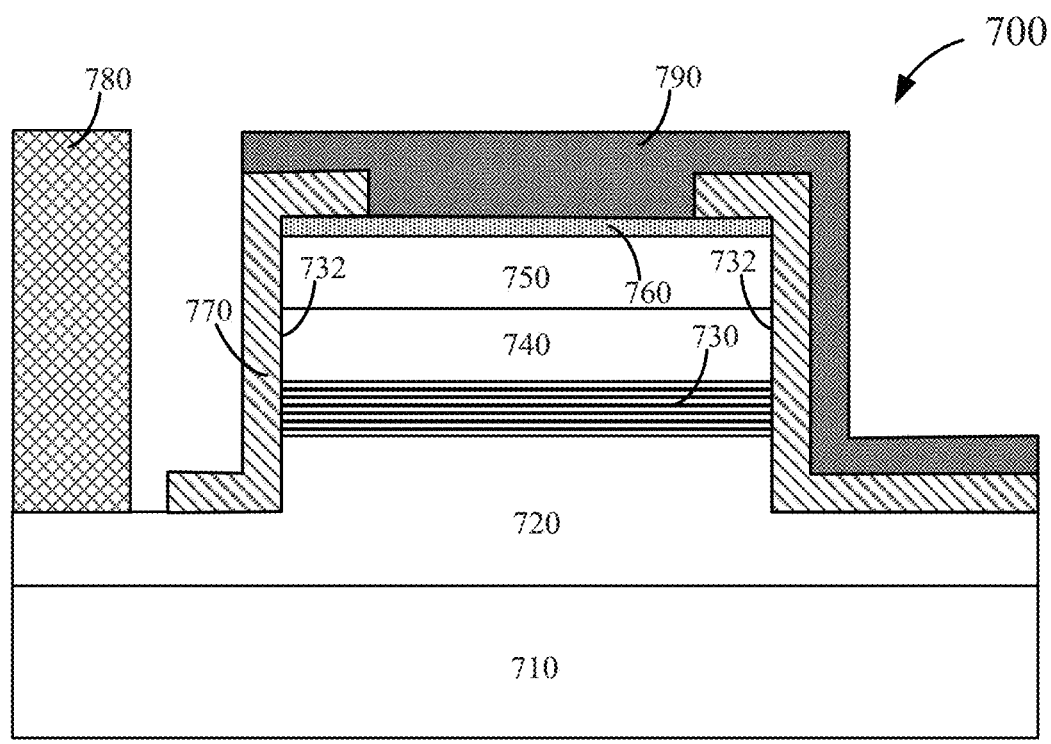
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
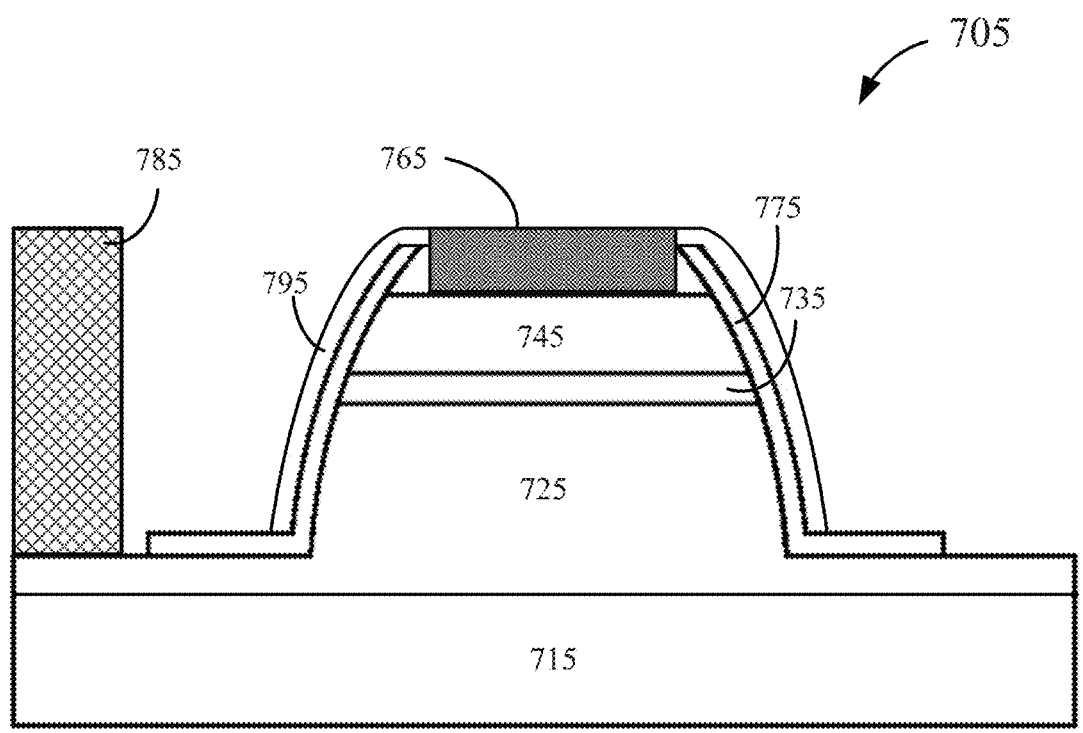
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across electrical contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

IV. Chief Ray Walk-Off Compensation

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

As described above, the overall efficiency of a waveguide-based display system may be the product of the efficiency of individual components in the display system and may also depend on how the components are coupled together. In a simplified example, the overall efficiency $\eta_{tot}$ of a waveguide-based display system may be determined as $\eta_{tot}=\eta_{EQE} \times \eta_{in} \times \eta_{out}$, where $\eta_{EQE}$ is the external quantum efficiency of a micro-LED, $\eta_{in}$ is the in-coupling efficiency of display light from the micro-LED into the waveguide, and $\eta_{out}$ is the out-coupling efficiency of the display light from the waveguide towards the user's eye. Thus, the overall efficiency $\eta_{tot}$ can be improved by improving one or more of $\eta_{EQE}$, $\eta_{in}$ and $\eta_{out}$.

FIG. 8A illustrates an example of a micro-LED-based display system 800 including a linear micro-LED array 810 and display optics 820 according to certain embodiments. FIG. 8B illustrates angles of light incident on display optics 820 from micro-LED array 810 according to certain embodiments. As illustrated in the example, due to the limited field of view (or acceptance angle) and/or the size of exit pupil (or eyebox) of display system 800, different angular portions of light from the respective micro-LEDs in micro-LED array 810 may pass through an exit pupil 830 of display system 800. For example, as shown by a line 840 in FIG. 8B, the chief ray of the light beam from a micro-LED at the center of micro-LED array 810 that may reach the user's eyes may be incident on display optics 820 at about 0°, while the chief ray of the light beam from a micro-LED at the edge of micro-LED array 810 that may reach the user's eyes may be incident on display optics 820 at about 20°. Lines 842 and 844 show the angular range of the light from each micro-LED at a respective height in micro-LED array 810 that can reach the user's eyes. When the light intensity of the light beam from each micro-LED is not uniform in each direction (such as having a narrow beam profile), light from different micro-LEDs may be projected to the user's eyes at different efficiencies due to the different angular portions of light from the respective micro-LEDs in micro-LED array 810 that pass through exit pupil 830. As such, the picture displayed to the user may have a non-uniform intensity. In some embodiments, in order to compensate for the chief ray walk-off described above, the micro-LED array may be arranged on a curved surface.

FIG. 8C illustrates an example of a micro-LED-based display system 805 including a curved micro-LED array 850 and display optics 860 according to certain embodiments. FIG. 8D illustrates angles of light incident on display optics 860 from micro-LED array 850 according to certain embodiments. As illustrated in the example, due to the limited field of view (or acceptance angle) and/or the size of exit pupil (or eyebox) of display system 805, different angular portions of light from the respective micro-LEDs in micro-LED array 850 may pass through an exit pupil 870 of display system 805. For example, as shown by a line 880 in FIG. 8D, the chief ray of the light beam from a micro-LED at the center of micro-LED array 850 that may reach the user's eyes may be incident on display optics 860 at about 0°, while the chief ray of the light beam from a micro-LED at the edge of micro-LED array 850 that may reach the user's eyes may be incident on display optics 860 at about 10° or lower, which is much lower than the incident angle shown in FIGS. 8A and 8B. In addition, in the example shown in FIGS. 8C and 8D, the chief ray may walk off at a lower rate (shown by the lower slope of line 880) compared with the chief ray shown in FIGS. 8A and 8B. Lines 882 and 884 show the angular range of the light from each micro-LED at a respective height in micro-LED array 850 that can reach the user's eyes. Because the chief ray walk-off is reduced, the angular range of the light from each micro-LED at a respective height in micro-LED array 850 that can reach the user's eyes, and thus the in-coupling efficiency, may be relatively uniform for micro-LEDs in micro-LED array 850. However, micro-LED array 850 may be difficult to manufacture.

The light coupling efficiencies and the uniformity of the light coupling efficiencies for micro-LEDs in a micro-LED array in a display system may also be affected by the beam profile of the light beam emitted by the micro-LEDs. For example, for a display system with a limited acceptance angle (e.g., with an HWHM angle less than 20°), if the light beam has a wide beam profile (e.g., a Lambertian emission profile), less than 10% of the total light emitted by a micro-LED may be captured by the display optics and delivered to the user's eyes, even though the light coupling efficiencies for the micro-LEDs in the micro-LED array may be relatively uniform.

FIG. 9A illustrates uniformity and brightness of light extracted from a micro-LED array 910 having broad beam profiles in an example of a display system 900 according to certain embodiments. In the example shown in FIG. 9A, each micro-LED in micro-LED array 910 may have a linear dimension of, for example, about 3 µm, and may include a mesa structure. Due to the small dimension and the mesa structure, the beam profile of a light beam 920 emitted from each micro-LED in micro-LED array 910 may have an HWHM angle of about 40°. Due to the limited acceptance angles (e.g., within about ±7°) and/or the limited size of the exit pupil of display system 900, only a portion 924 of each light beam 920 may reach a user's eye through display optics 930. In addition, due to the chief way walk-off described above, the portion 924 of each light beam 920 that can reach the user's eyes may be within a different respective angular range for each respective micro-LED as shown in FIG. 9A. The total power of each light beam 920 may be indicated by the area below a curve 944 that represents the beam brightness profile of light beam 920, while the total power of each light beam 920 that may reach the user's eye may be indicated by the total area of a region 940 below curve 944, which may only be a small fraction of the total area below curve 944. However, because of the broad beam profile, the brightness of the light beam that can reach the user's eyes may not decrease much within the respective angular range. In other words, the area of region 940 may be relatively uniform for the micro-LEDs in micro-LED array 910. Thus, the coupling efficiency for the micro-LEDs in micro-LED array 910 may be relative uniform as shown by a curve 950. For example, the light coupling efficiency for micro-LEDs with Lambertian beam profiles may remain constant in a display system with a small acceptance angle (e.g., within ±10-20°) and a chief ray walk-off from 0° to about 20°.

FIG. 9B illustrates uniformity and brightness of light extracted from a micro-LED array 912 having narrow beam in an example of a display system 905 according to certain embodiments. Each micro-LED in micro-LED array 910 may have a linear dimension of, for example, about 3 µm. The beam profile of a light beam 922 emitted from each micro-LED in micro-LED array 912 may have an HWHM angle of about 15°. Due to the limited acceptance angles (e.g., within about ±7°) and/or the limited size of the exit pupil of display system 905, only a portion 926 of each light beam 922 may reach a user's eye through the display optics. In addition, due to the chief way walk-off described above, the portion 926 of each light beam 922 that may reach the user's eyes may be within a different respective angular range for each respective micro-LED as shown in FIG. 9B. The total power of each light beam 922 may be indicated by the area below a curve 946 that represents the brightness profile of light beam 922, while the total power of each light beam 922 that can reach the user's eye may be indicated by the area of a region 942 below curve 946, which may only be a portion of the total area below curve 946. Because of the narrow beam profile of light beam 922, the area of region 942 may be a large portion of the total area below curve 946 for micro-LEDs at the center of micro-LED array 912, and thus the coupling efficiencies may be high for micro-LEDs at the center of micro-LED array 912. However, for micro-LEDs at the edge of micro-LED array 912, the area of region 942 may only be a small portion of the total area below curve 946. In other words, the area of region 942, and thus the coupling efficiency of the micro-LEDs in micro-LED array 910, may decrease significantly from the center to the edges of micro-LED array 910 as shown by a curve 952.

In some embodiments, to increase the external quantum efficiency (e.g., the light extraction efficiency), one or more other optical components (e.g., a micro-lens), in addition to the mesa structure and reflector described above, may be formed on the light emission surface, such as substrate 710 or 715, to extract the emitted light within a certain solid angle out of an LED, and/or to focus or collimate the emitted light. For example, in some embodiments, a micro-lens array may be formed on a micro-LED array, where the light emitted from each micro-LED may be collected and extracted by a corresponding micro-lens, and may be collimated, focused, or expanded, and then directed to a waveguide in a waveguide-based display system. The micro-lenses may help to increase the acceptance angle and improve the light extraction efficiency and coupling efficiency. In some embodiments, to improve the coupling efficiency of display light from the micro-LED into user's eyes through a waveguide-based display system, it may be desirable that the light from each micro-LED is directed to the waveguide at a different respective angle. The light emitted from the micro-LEDs can be redirected to desired directions using, for example, micro-lenses, wedges or prisms, gratings, or the like.

Figure 10:
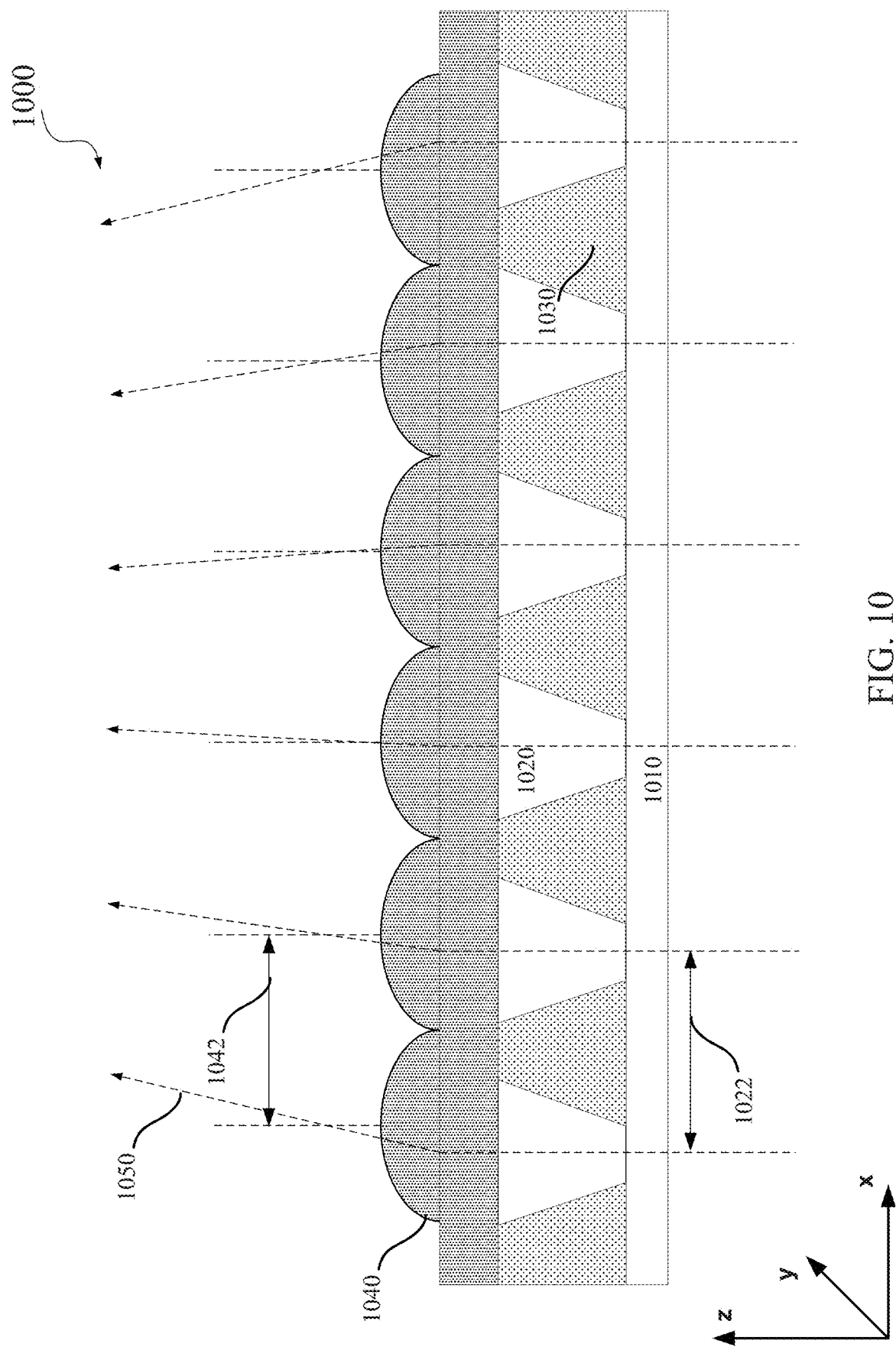
FIG. 10 illustrates an example of a device including a micro-LED array and an array of micro-lenses for light extraction and chief ray angle modification according to certain embodiments.

FIG. 10 illustrates an example of a device 1000 including a micro-LED array 1020 and a micro-lens array 1040 for extracting and converging light from micro-LED array 1020 according to certain embodiments. Micro-LED array 1020 may include a one-dimensional or two-dimensional array of micro-LEDs, where the micro-LEDs may be uniformly distributed and may be separated by insulators 1030. Micro-LED array 1020 may include epitaxial structures formed on a substrate 1010 as described above with respect to, for example, FIGS. 7A and 7B. Insulators 1030 may include, for example, passivation layers (e.g., passivation layer 770), light reflection layers, filling materials (e.g., polymers), and the like.

Micro-lens array 1040 may be formed directly on micro-LED array 1020 or may be formed on a substrate and then bonded to micro-LED array 1020. For example, micro-lens array 1040 may be etched in a dielectric layer or a semiconductor layer of micro-LED array 1020, such as a substrate or an oxide layer (e.g., a $SiO_2$ layer) of micro-LED array 1020, or may be formed on a dielectric layer deposited on micro-LED array 1020, such as an oxide layer or a polymer layer, as described in detail below. The focal length and the distance of the micro-lenses from the corresponding micro-LEDs may be configured such that light beam from each micro-lens may be a collimated beam, a converging beam, or a diverging beam.

A pitch 1022 of micro-LED array 1020 may be different from (e.g., less than or greater than) a pitch 1042 of micro-lens array 1040, and thus the optical axis of each micro-lens in micro-lens array 1040 may be offset from the center of a respective micro-LED in micro-LED array 1020 by a different distance. As such, the chief ray 1050 of the light from each micro-LED after passing through the corresponding micro-lens may be different. In the example shown in FIG. 10, pitch 1022 of micro-LED array 1020 may be greater than pitch 1042 of micro-lens array 1040, and thus the optical axis of each micro-lens in micro-lens array 1040 may be offset from the center of a respective micro-LED in micro-LED array 1020 by a different distance. The offset may be a function of the location of the micro-lens. For example, the offset may linearly increase as a function of the distance of the micro-lens from the center of device 1000. As a result, the chief rays 1050 of the light extracted from the micro-LEDs after passing through the corresponding micro-lenses may be in different propagation directions and may converge as shown in the example.

Because of the chief ray direction modification by micro-lens array 1040, the portion of the light that may reach the user's eyes from each micro-LED in micro-LED array 1020 may be substantially the same, which may be the portion of the light beam that has the highest intensity or brightness. Therefore, both the coupling efficiencies and the uniformity of the coupling efficiencies may be improved for the micro-LEDs in micro-LED array 1020.

In various embodiments, the pitch of micro-lens array may be uniform or non-uniform. For example, the pitch of a two-dimensional micro-lens array may be uniform in two orthogonal directions, uniform in one direction only, or non-uniform in both directions. The pitch may also be the same or different in the two orthogonal directions. The pitch of the micro-lens array may be different from the pitch of the micro-LED array in one or two dimensions.

Figure 11:
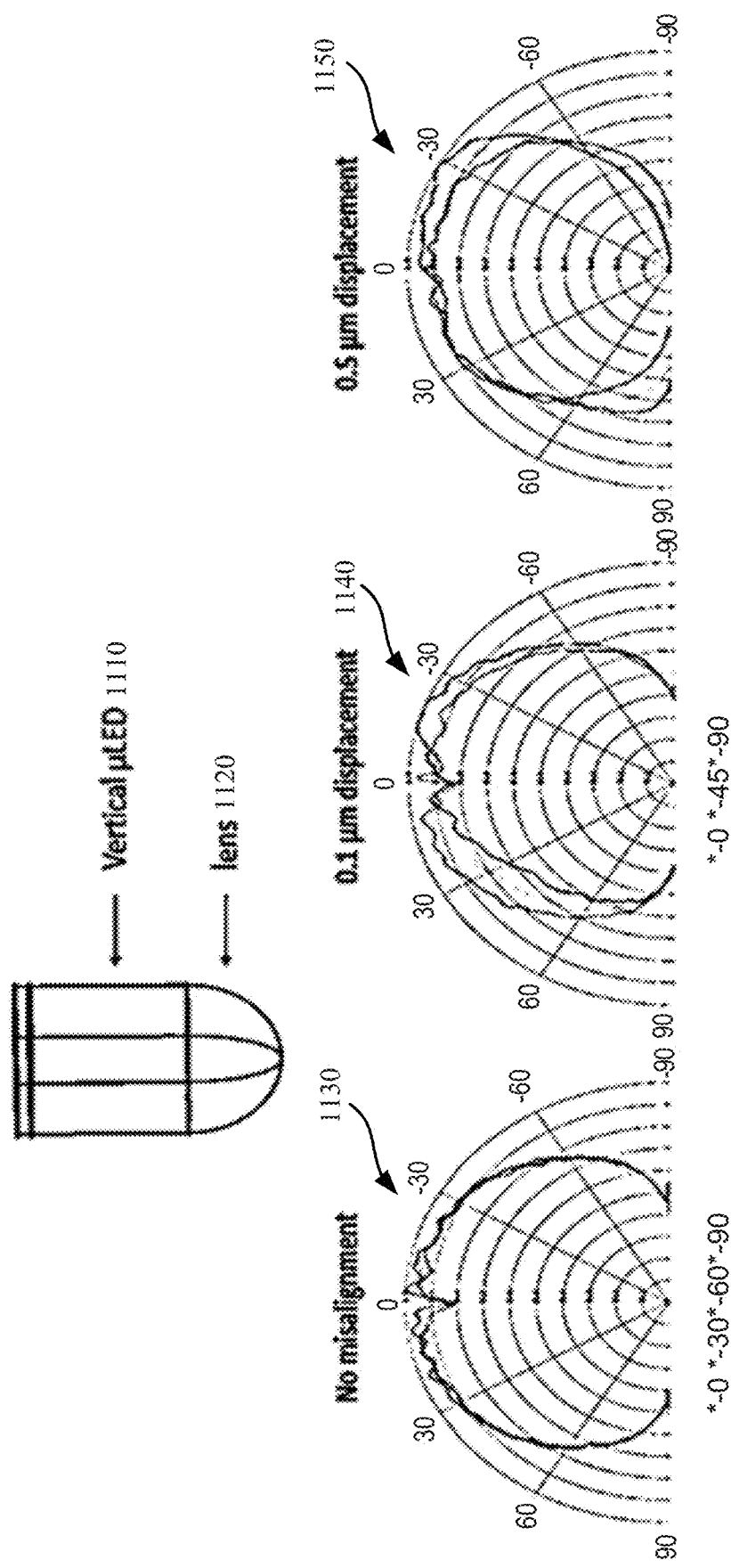
FIG. 11 illustrates simulation results of light extraction from an example of a micro-LED having a vertical mesa and a broad beam profile using micro-lenses with different displacements according to certain embodiments.

FIG. 11 illustrates simulation results of light extraction from an example of a micro-LED 1110 having a vertical mesa and a broad beam profile using micro-lenses 1120 with different displacements according to certain embodiments. In the example shown in FIG. 11, micro-LED 1110 may have a linear dimension less than about 3 µm. Due to the small dimension and the vertical mesa structure, the beam profile of the emitted light from micro-LED 1110 may have an HWHM angle greater than 60°, such as close to a Lambertian distribution profile or wider. Thus, the light intensity of the emitted beam may be substantially the same within a large viewing angle range.

Micro-lens 1120 may include a spherical lens. When the center of micro-lens 1120 is at the center of micro-LED 1110, the emitted light beam may be characterized by a beam profile 1130. When the center of micro-lens 1120 is offset from the center of micro-LED 1110 by about 0.1 µm, the emitted light beam may be characterized by a beam profile 1140. When the center of micro-lens 1120 is offset from the center of micro-LED 1110 by about 0.5 µm, the emitted light beam may be characterized by a beam profile 1150. As shown by beam profiles 1130-1250, due to the wide beam profile, offsetting micro-lens 1120 with respect to micro-LED 1110 may have relatively minor impact on the tilting of the light beam, and thus may only cause minor improvement on the coupling efficiency. Thus, the broad beam profile may help to achieve a more uniform light extraction and coupling efficiency with chief-ray walk-off, but the coupling efficiency may be low. Therefore, the power consumption of micro-LED 1110 may be large in order to achieve a target brightness, such as about 500 nits, at the exit pupil or the eyebox.

FIG. 12A illustrates an example of a micro-LED 1200 including a vertical mesa structure 1210 and a horizontally offset micro-lens 1230 and having a narrow beam profile according to certain embodiments. Micro-LED 1200 may include different semiconductor materials in different embodiments as described above to emit light of different colors. Micro-lens 1230 may be vertically displaced from vertical mesa structure 1210 by a dielectric layer 1220. The center of micro-lens 1230 may also be horizontally offset from the center of vertical mesa structure 1210 by a horizontal displacement 1240. As such, the chief ray of the light emitted from vertical mesa structure 1210 may be tilted from the vertical direction of the vertical mesa structure.

FIG. 12B illustrates simulated beam profiles of micro-LED 1200 shown in FIG. 12A according to certain embodiments. A beam profile 1250 corresponds to a red micro-LED having the structure of micro-LED 1200. A beam profile 1252 corresponds to a green micro-LED having the structure of micro-LED 1200. A beam profile 1254 corresponds to a blue micro-LED having the structure of micro-LED 1200.

Figure 12C:
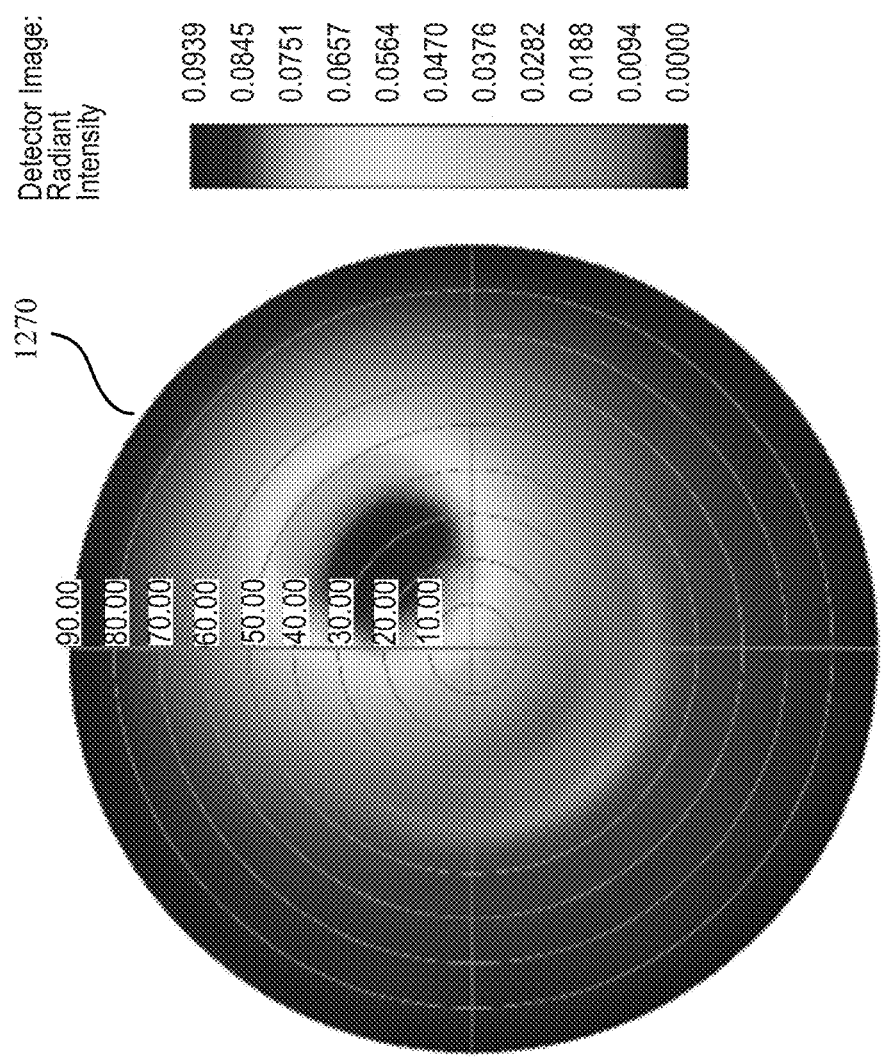
FIG. 12C illustrates a simulated light intensity map of a light beam from the example of the micro-LED shown in FIG. 12A according to certain embodiments.

FIG. 12C illustrates a simulated light intensity map 1270 of a light beam from an example of a micro-LED having the structure of micro-LED 1200 shown in FIG. 12A according to certain embodiments. FIG. 12C shows that the peak light intensity of the light beam is shifted in both directions in the cross-section.

Figure 13A:
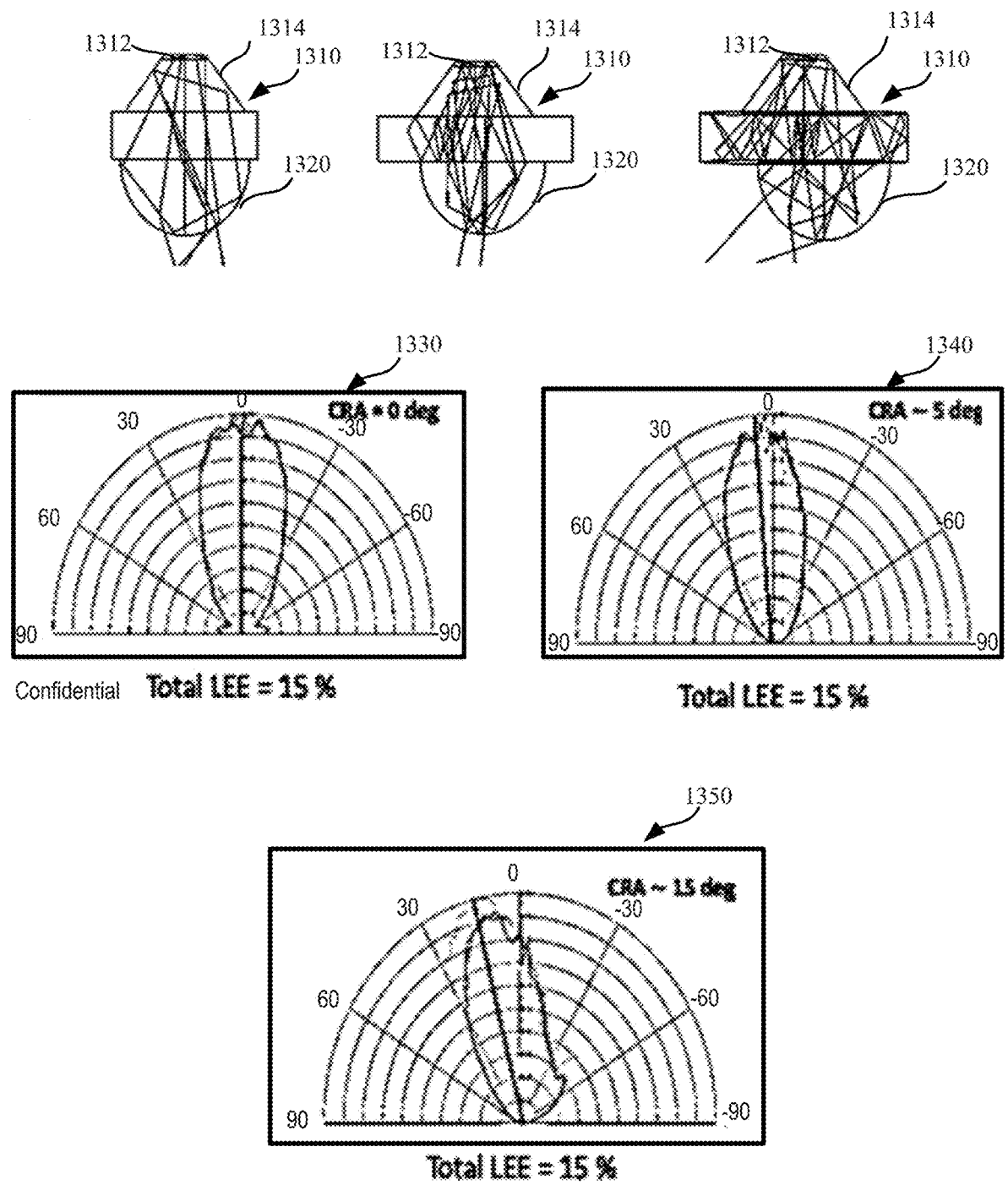
FIG. 13A illustrates simulation results of light extraction from an example of a micro-LED having a conical mesa and a narrow beam profile using micro-lenses with different displacements according to certain embodiments.

FIG. 13A illustrates simulation results of light extraction from a micro-LED 1310 having a conical mesa and a narrow beam profile using micro-lenses 1320 with different displacements according to certain embodiments. Micro-LED 1310 may have a linear dimension less than about 3 µm. Micro-LED 1310 may include a flat back reflector 1312 (e.g., including high reflective p-contact, such as TCO/Ag or TCO/Au) with a reflectivity greater than about 90%. Micro-LED 1310 may also include a mesa reflector 1314 (e.g., SiN or SiO$_2$/TCO/Ag, Al, or Au) with a reflectivity greater than about 95%. Due to the conical mesa structure and the reflectors, the light extraction efficiency may be higher and the beam profile of the emitted light from micro-LED 1310 may have an HWHM angle less than, for example, about 30°, such as about 25°.

Micro-lens 1320 may include a spherical lens. In some embodiments, micro-lens 1320 may be non-native lens formed in a layer, such as a SiN, SiO$_2$, or polymer layer, on top of the semiconductor layers of micro-LED 1310. In some embodiments, micro-lens 1320 may be a native lens etched in the semiconductor layers of micro-LED 1310 to reduce losses caused by Fresnel reflection and improve the light extraction efficiency (LEE). When the center of micro-lens 1320 is at the center of micro-LED 1310, the emitted light beams may be characterized by beam profiles 1330 for micro-LEDs of different colors, where the light extraction efficiency may be about 15%. When the center of micro-lens 1320 is offset from the center of micro-LED 1310 by about 0.1 µm, the emitted light beams may be characterized by beam profiles 1340 for micro-LEDs of different colors, which show a chief ray angle about 5° that may compensate for the chief ray walk-off due to the location of the micro-LED in a micro-LED array. The light extraction efficiency may remain about 15%. When the center of micro-lens 1320 is offset from the center of micro-LED 1310 by about 0.5 µm, the emitted light beams may be characterized by beam profiles 1350 of micro-LEDs of different colors, which show a chief ray angle of about 15° that may compensate for the chief ray walk-off due to the location of the micro-LED (e.g., at the edge) in a micro-LED array. The light extraction efficiency may remain about 15%. In this way, the conical mesa structure, in combination with the differently displaced micro-lenses, may improve the coupling efficiencies and the uniformity of the coupling efficiencies for the micro-LEDs across the micro-LED array.

FIG. 13B illustrates simulation results of chief ray angle modification for examples of red micro-LEDs 1360 using micro-lenses 1364 with different displacements according to certain embodiments. Each red micro-LED 1360 may include an outward tilted mesa structure 1362 and a micro-lens 1364 on mesa structure 1362. In the examples shown in FIG. 13B, mesa structure 1362 may include a mesa reflector that includes SiN/ITO/Au. Micro-lens 1364 may be formed in a SiO$_2$ layer through a reflow process. The HWHM angle of an emitted beam 1366 may be about 25° to about 30°, resulting in over about 30% increase in EQE. The chief ray angle of emitted beam 1366 may be steerable within ±12° when micro-lens 1364 is laterally displaced within ±300 nm, or about 26 nm per degree. FIG. 13B also shows beam profiles 1370 of emitted beams 1366 from red micro-LEDs 1360 when micro-lens 1364 is laterally shifted within ±300 nm at a 75-nm step.

Figure 14:
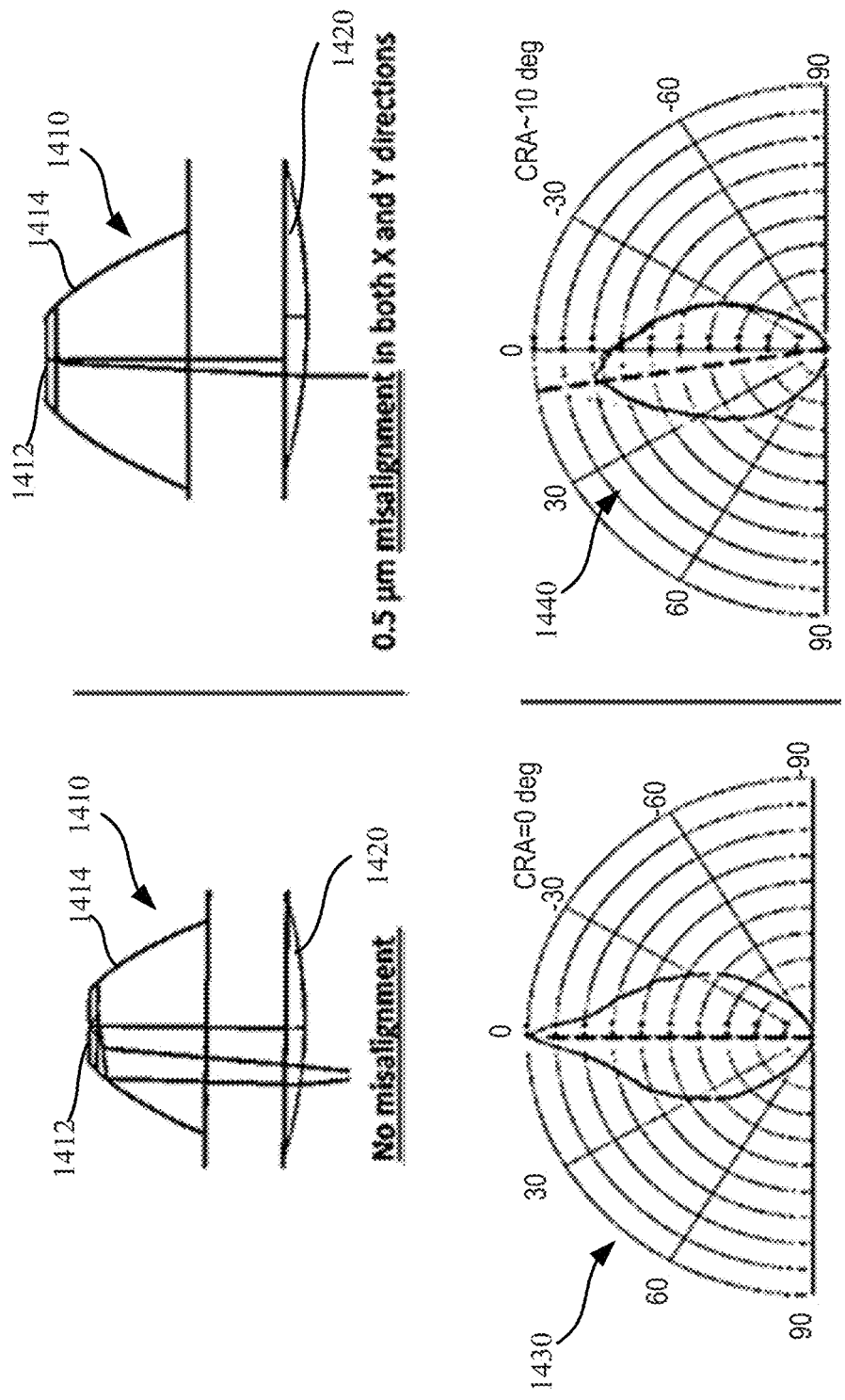
FIG. 14 illustrates simulation results of light extraction from an example of a micro-LED having a parabolic mesa and a narrow beam profile using micro-lenses with different displacements according to certain embodiments.
Figure 14:
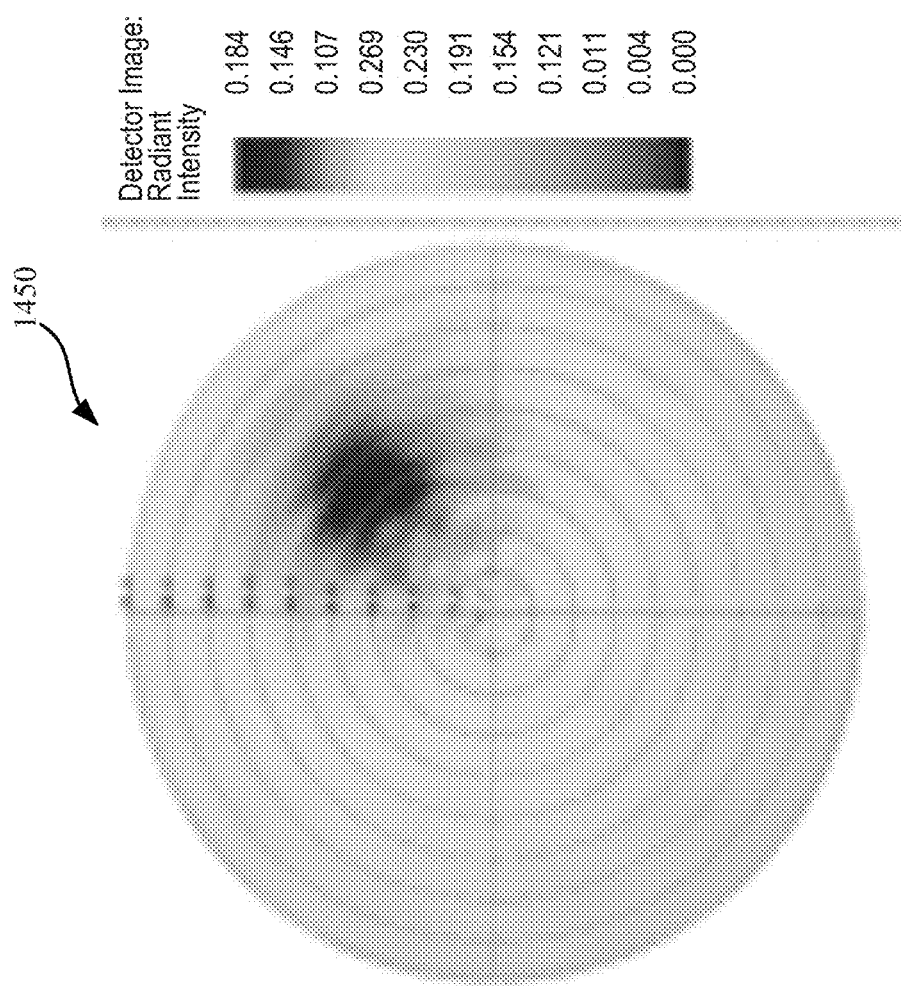

FIG. 14 illustrates simulation results of light extraction from an example of a micro-LED 1410 having a parabolic mesa and a narrow beam profile using micro-lenses 1420 with different displacements according to certain embodiments. Micro-LED 1410 may include a back reflector 1412 and/or a mesa reflector 1414 as described above with respect to micro-LED 1310. Due to the parabolic mesa structure and the reflectors, the light extraction efficiency may be high and the beam profile of the emitted light from micro-LED 1410 may have an HWHM angle less than, for example, about 30°.

Micro-lens 1420 may include a spherical lens as described above with respect to micro-lens 1320. When the center of micro-lens 1420 is at the center of micro-LED 1410, the emitted light beams may be characterized by beam profiles 1430 for micro-LEDs of different colors, which show a chief ray angle about 0°. When the center of micro-lens 1420 is offset from the center of micro-LED 1410 by about 0.5 µm in both the x and y directions, the emitted light beams may be characterized by beam profiles 1440 for micro-LEDs of different colors and the intensity of the light beam at a cross-section may be shown by a light intensity map 1450. Beam profiles 1440 show a chief ray angle of about 10° that may at least partially compensate for the chief ray walk-off due to the location of the micro-LED (e.g., at the edge) in a micro-LED array. Therefore, and the light extraction efficiency may be about the same for micro-LEDs at different locations of the micro-LED array. In this way, the parabolic mesa structure, in combination with the differently displaced micro-lenses, may improve the coupling efficiencies and the uniformity of the coupling efficiencies for the micro-LEDs across the micro-LED array.

FIG. 15A illustrates an example of a micro-LED including a vertical mesa structure 1510 and a wedge 1530 according to certain embodiments. Wedge 1530 may be formed on a dielectric layer 1520 that is on vertical mesa structure 1510. Wedge 1530 may be used to refract light emitted from vertical mesa structure 1510 towards the thicker side of wedge 1530.

FIG. 15B illustrates simulated beam profiles of examples of micro-LEDs of different colors having the structure of the micro-LED shown in FIG. 15A according to certain embodiments. In the examples shown in FIG. 15B, a beam profile 1550 corresponds to a light beam emitted by a red micro-LED having the structure of the micro-LED shown in FIG. 15A, a beam profile 1560 corresponds to a light beam emitted by a green micro-LED having the same structure, and a beam profile 1570 corresponds to a light beam emitted by a blue micro-LED having the same structure.

FIG. 15C illustrates an example of a micro-LED including vertical mesa structure 1510, wedge 1530, and a micro-lens 1540 according to certain embodiments. Wedge 1530 may be formed on dielectric layer 1520 and may refract light emitted from vertical mesa structure 1510 towards the thicker side of wedge 1530. Micro-lens 1540 may be used to collimate the light emitted from vertical mesa structure 1510 and refracted by wedge 1530.

FIG. 15D illustrates simulated beam profiles of examples of micro-LEDs of different colors having the structure of the micro-LED shown in FIG. 15C according to certain embodiments. In the examples shown in FIG. 15D, a beam profile 1552 corresponds to a light beam emitted by a red micro-LED having the structure of the micro-LED shown in FIG. 15C, a beam profile 1562 corresponds to a light beam emitted by a green micro-LED having the same structure, and a beam profile 1572 corresponds to a light beam emitted by a blue micro-LED having the same structure.

V. Light Extraction Efficiency Improvement

As described above, the overall efficiency of the waveguide display systems can also be a function of the external quantum efficiency of the individual micro-LEDs. In addition to improving the carrier (e.g., electron) injection efficiency and the internal quantum efficiency of the micro-LEDs by improving the semiconductor layers of the micro-LEDs, the light extraction efficiency (LEE) of the micro-LEDs may also be improved to improve the external quantum efficiency.

Figures 16A, 16B:
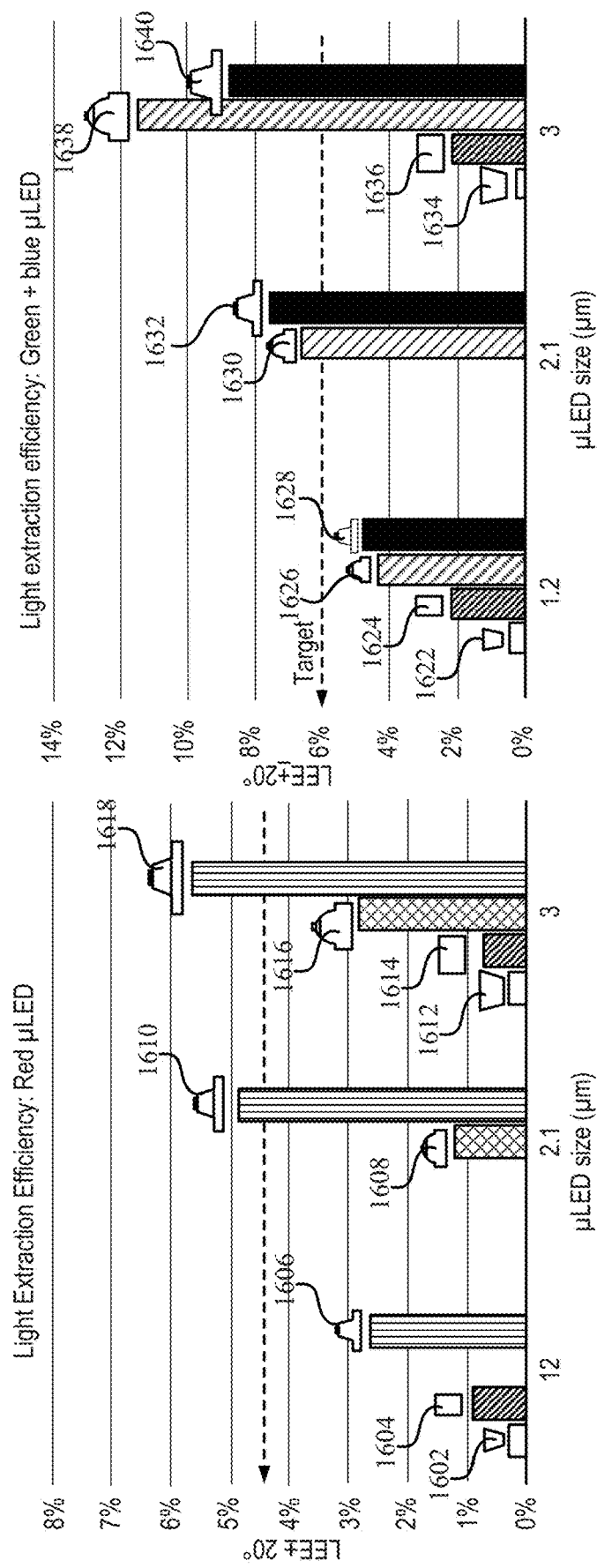
FIG. 16A illustrates simulated light extraction efficiencies for examples of red micro-LEDs with different mesa structures and sizes according to certain embodiments.
FIG. 16B illustrates simulated light extraction efficiencies for examples of green or blue micro-LEDs with different mesa structures and sizes according to certain embodiments.

FIG. 16A illustrates simulated light extraction efficiencies of examples of red micro-LEDs with different mesa structures and sizes according to certain embodiments. The vertical axis represents the light extraction efficiency within the ±20° acceptance angle range. A bar 1602 indicates the simulated LEE of a red micro-LED with a mesa structure that has a mesa facet angle between about 10-15° and a diameter about 1.2 µm. A bar 1604 indicates the simulated LEE of a red micro-LED with a vertical mesa structure that has a diameter about 1.2 µm. A bar 1606 indicates the simulated LEE of a red micro-LED with a conical mesa structure that has a diameter about 1.2 µm. A bar 1608 indicates the simulated LEE of a red micro-LED with a parabolic mesa structure that has a diameter about 2.1 µm. A bar 1610 indicates the simulated LEE of a red micro-LED with a conical mesa structure that has a diameter about 2.1 µm. A bar 1612 indicates the simulated LEE of a red micro-LED with a mesa structure that has a mesa facet angle between about 10-15° and a diameter about 3 µm. A bar 1614 indicates the simulated LEE of a red micro-LED with a vertical mesa structure that has a diameter about 3 µm. A bar 1616 indicates the simulated LEE of a red micro-LED with a parabolic mesa structure that has a diameter about 3 µm. A bar 1618 indicates the simulated LEE of a red micro-LED with a conical mesa structure that has a diameter about 3 µm.

The examples of red micro-LEDs shown in FIG. 16A do not include micro-lenses. Greater than a target LEE (e.g., about 4.5%) can be achieved for micro-LEDs with conical mesa structures that have diameters about 2.1 µm or larger and have appropriate mesa reflectors. FIG. 16A shows that red micro-LEDs with conical or parabolic mesa structures can have much higher light extraction efficiency compared with red micro-LEDs with mesa structures having vertical or small mesa facet angles.

FIG. 16B illustrates simulated light extraction efficiencies of examples of green or blue micro-LEDs with different mesa structures and sizes according to certain embodiments. The vertical axis represents the light extraction efficiency within the ±20° acceptance angle range. A bar 1622 indicates the simulated LEE of a green (or blue) micro-LED with a mesa structure that has a mesa facet angle between about 10-15° and a diameter about 1.2 µm. A bar 1624 indicates the simulated LEE of a green (or blue) micro-LED with a vertical mesa structure that has a diameter about 1.2 µm. A bar 1626 indicates the simulated LEE of a green (or blue) micro-LED with a parabolic mesa structure that has a diameter about 1.2 µm. A bar 1628 indicates the simulated LEE of a green (or blue) micro-LED with a conical mesa structure that has a diameter about 1.2 µm. A bar 1630 indicates the simulated LEE of a green (or blue) micro-LED with a parabolic mesa structure that has a diameter about 2.1 µm. A bar 1632 indicates the simulated LEE of a green (or blue) micro-LED with a conical mesa structure that has a diameter about 2.1 µm. A bar 1634 indicates the simulated LEE of a green (or blue) micro-LED with a mesa structure that has a mesa facet angle between about 10-15° and a diameter about 3 µm. A bar 1636 indicates the simulated LEE of a green (or blue) micro-LED with a vertical mesa structure that has a diameter about 3 µm. A bar 1638 indicates the simulated LEE of a green (blue) micro-LED with a parabolic mesa structure that has a diameter about 3 µm. A bar 1640 indicates the simulated LEE of a green (blue) micro-LED with a conical mesa structure that has a diameter about 3 µm.

The examples of green or blue micro-LEDs shown in FIG. 16B do not include micro-lenses. Greater than a target LEE (e.g., about 6.0%) can be achieved for micro-LEDs with conical or parabolic mesa structures that have diameters greater than about 2.0 µm and have appropriate mesa reflectors. FIG. 16B shows that green (or blue) micro-LEDs with conical or parabolic mesa structures can have much higher light extraction efficiency compared with green (or blue) micro-LEDs with mesa structures having vertical or small mesa facet angles.

FIG. 17 illustrates simulation results of the beam profile of a light beam emitted from an example of a red micro-LED 1700 having a parabolic mesa 1710 and an anti-reflection coating layer 1720 according to certain embodiments. Micro-LED 1700 may have a linear dimension of about 3 µm and may emit light at about 620 nm. Micro-LED 1700 may include a back reflector formed by a p-type semiconductor layer 1712 and a p-contact layer 1714 (e.g., including Ag, Pt, and/or Au), and a parabolic mesa reflector (e.g., including $SiO_2$ or SiN, and Ag, Pt, and/or Au, not shown in FIG. 17). Anti-reflection coating layer 1720 may be formed on the out-coupling surface (e.g., on an n-type semiconductor layer) of micro-LED 1700, and may include, for example, a thin SiN layer that has an optical thickness equal to about a quarter of the emitted light wavelength.

A graph 1740 illustrates the beam profile in polar coordinates, a graph 1750 illustrates the beam intensity as a function of the propagation direction, and a graph 1760 shows the light intensity in a cross-section of the light beam extracted from micro-LED 1700. The HWHM angle of red micro-LED 1700 may be about 36°. The light extraction efficiency may be about 30.5% within the ±90° acceptance angle range, or about 1.45% within the ±10° acceptance angle range. FIG. 17 shows that adding an anti-reflection layer at the output surface of the micro-LED can reduce the HWHM angle of the beam profile and improve the light extraction efficiency.

In some embodiments, the shape of the mesa structure of the micro-LED may be selected to improve the beam profile and the light extraction efficiency of the micro-LED. In addition, the parameters of the micro-lens may be selected based on the structure of the micro-LED, such as the shape of the mesa structure, the position of the active region (e.g., the quantum well or MQW), the thickness of the n-type layer, and the like, to collimate the light from the micro-LED and/or to improve the light extraction efficiency and coupling efficiency. For example, in some cases, a thin micro-lens may work better for a micro-LED with a parabolic mesa, while a thicker micro-lens may work better for a micro-LED with a conical mesa.

The light extraction and/or collimation optical components, such as the micro-lenses that are aligned with or offset from the micro-LEDs, may be native components made in the semiconductor materials (e.g., an n-type material layer) of the micro-LEDs, or may be non-native components that are made in a material layer (e.g., a dielectric layer, such as $SiO_2$, $SiN_x$, PMMA, etc.) deposited on the micro-LEDs or in a substrate that can be bonded to the micro-LEDs.

Figures 18A, 18B, 18C:
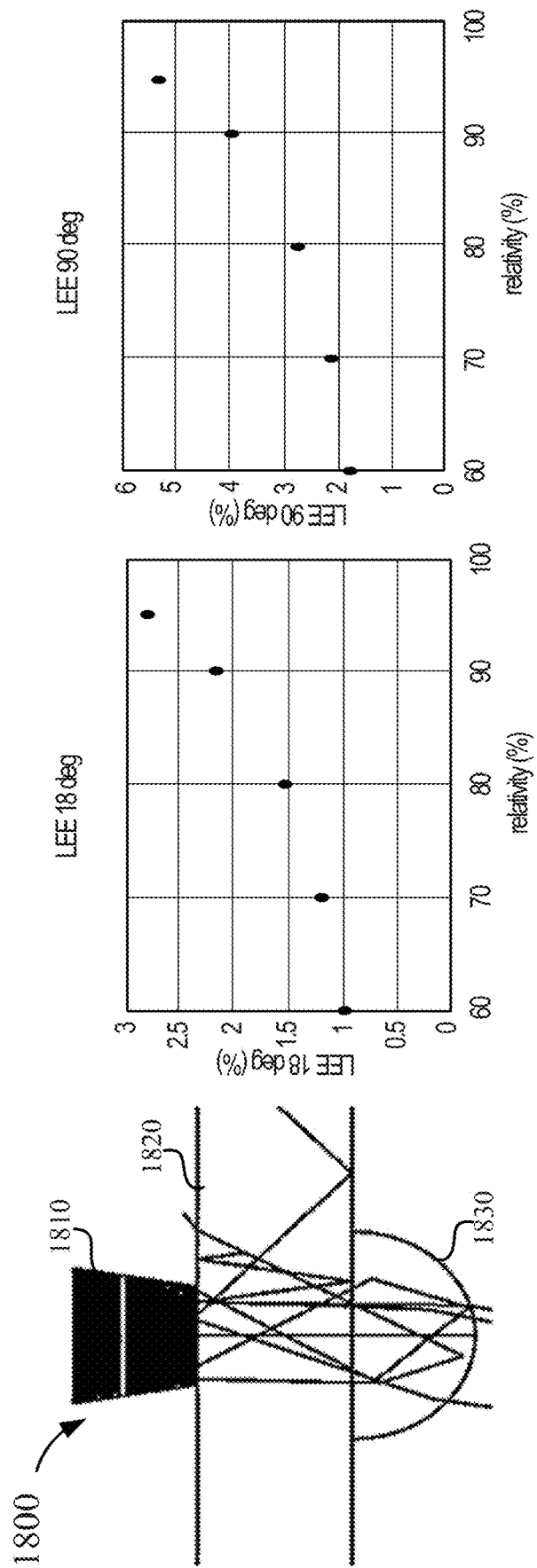
FIG. 18A illustrates an example of a micro-LED including an inward-tilted mesa structure and a micro-lens according to certain embodiments.
FIG. 18B illustrates simulated light extraction efficiencies of examples of micro-LEDs having the structure of the micro-LED shown in FIG. 18A as a function of the reflectivity of the mesa reflector according to certain embodiments.
FIG. 18C illustrates simulated light extraction efficiencies of examples of micro-LEDs having the structure of the micro-LED shown in FIG. 18A as a function of the reflectivity of the mesa reflector according to certain embodiments.

FIG. 18A illustrates an example of a micro-LED 1800 including an inward-tilted mesa structure 1810 and a micro-lens 1830 according to certain embodiments. Inward-tilted mesa structure 1810 of micro-LED 1800 may be processed from the n-side after the epitaxial layer growth and, for example, wafer-to-wafer bonding. The sidewalls of inward-tilted mesa structure 1810 may be tilted inward (e.g., with a tilt angle about 10°) from the p-side to the n-side of the micro-LED 1800 and may include a mesa reflector formed on the sidewall of inward-tilted mesa structure 1810. Inward-tilted mesa structure 1810 may include different semiconductor materials in different embodiments as described above to emit light of different colors. Micro-lens 1830 may be vertically displaced from inward-tilted mesa structure 1810 by a dielectric layer 1820.

FIG. 18B illustrates simulated light extraction efficiencies of examples of micro-LEDs having the structure of micro-LED 1800 shown in FIG. 18A as a function of the reflectivity of the mesa reflector according to certain embodiments. FIG. 18B shows the simulated light extraction efficiencies within a ±18° acceptance angle range for the examples of micro-LEDs including mesa reflectors having reflectivity from about 60% to about 95%. As illustrated in FIG. 18B, the light extraction efficiency may increase with the reflectivity of the mesa structure.

FIG. 18C illustrates simulated light extraction efficiencies of examples of micro-LEDs having the structure of micro-LED 1800 shown in FIG. 18A as a function of the reflectivity of the mesa reflector according to certain embodiments. FIG. 18C shows the simulated light extraction efficiencies within a ±90° acceptance angle range for the examples of micro-LEDs including mesa reflectors having reflectivity from about 60% to about 95%. As illustrated in FIG. 18C, the light extraction efficiency may increase with the reflectivity of the mesa structure.

Figure 18D:
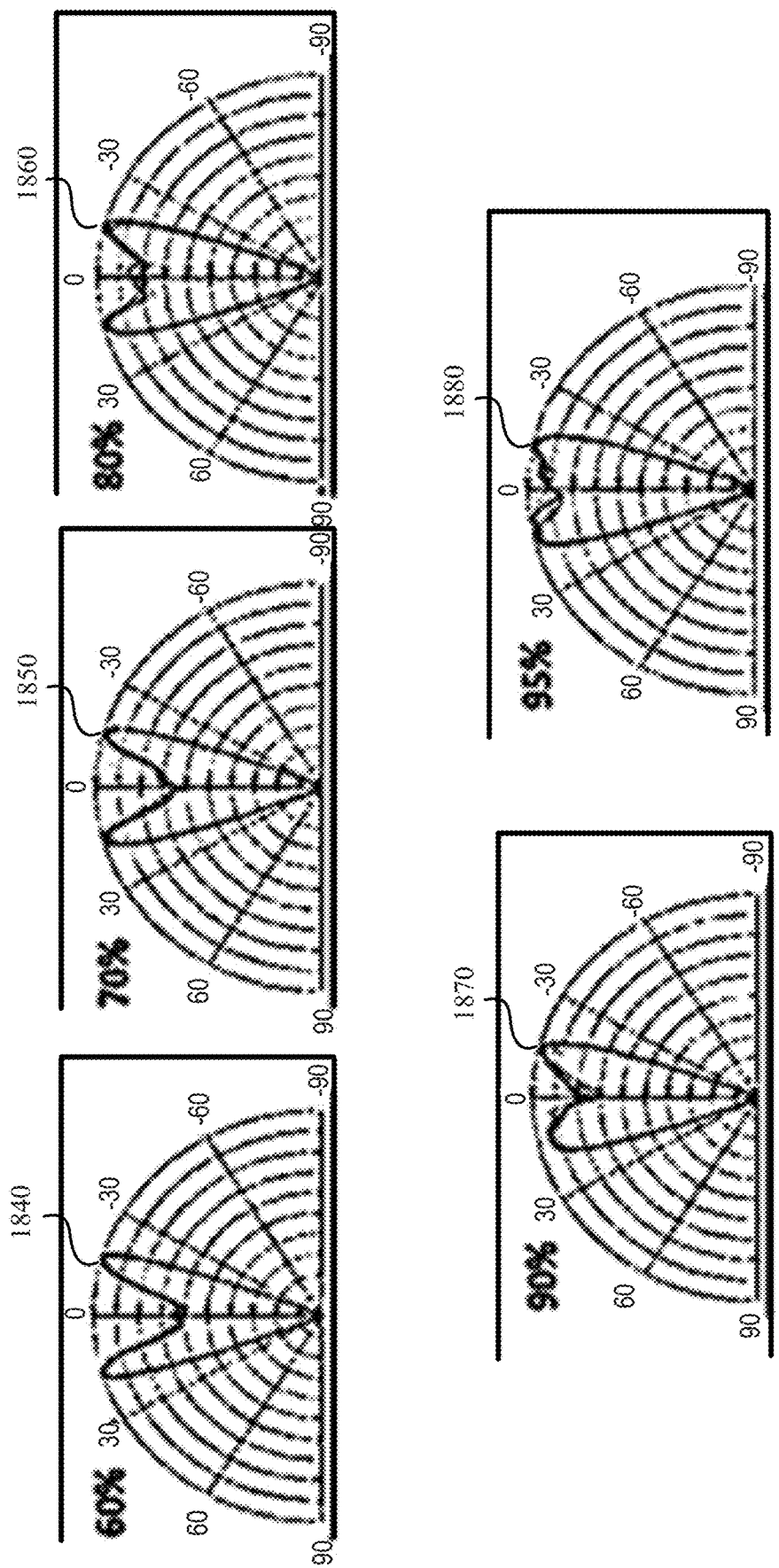
FIG. 18D illustrates simulated beam profiles of examples of micro-LEDs having the structure of the micro-LED shown in FIG. 18A as a function of the reflectivity of the mesa reflector according to certain embodiments.

FIG. 18D illustrates simulated beam profiles of examples of the micro-LEDs having the structure of micro-LED 1800 shown in FIG. 18A as a function of the reflectivity of the mesa reflector according to certain embodiments. A simulated beam profile 1840 may correspond to a micro-LED having the structure of micro-LED 1800 and including a mesa reflector with reflectivity of 60%. Simulated beam profiles 1850, 1860, 1870, and 1880 may correspond to micro-LEDs having the structure of micro-LED 1800 and including mesa reflectors with reflectivity of 70%, 80%, 90%, and 95%, respectively.

FIGS. 19A-19H illustrates simulation results of light emitted from examples of green micro-LEDs including vertical mesa structures according to certain embodiments. In the example shown in FIG. 19A, a micro-LED 1910 may include a vertical mesa structure and have no micro-lenses at the out-coupling surface. Micro-LED 1910 may have a pixel size 1.6 µm. The beam profile of the light beam extracted from the micro-LED 1910 is shown by a curve 1912. The dotted circle corresponds to the beam profile of an equivalent Lambertian source.

Figure 19A:
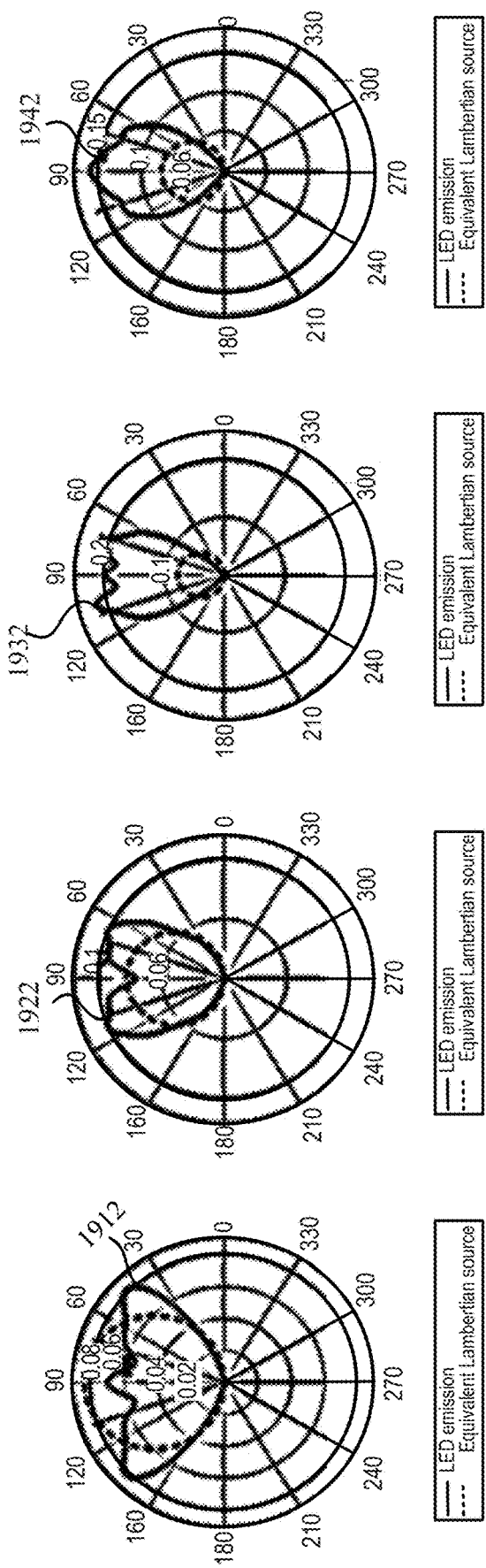
Figure 19B:
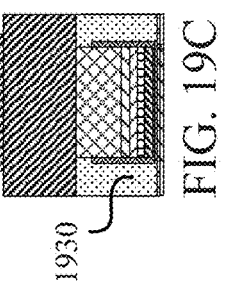

In the example shown in FIG. 19B, a micro-LED 1920 may include a vertical mesa structure and a native micro-lens 1924 at the out-coupling surface, where micro-lens 1924 may be etched in a semiconductor layer (e.g., GaN). Micro-LED 1920 may have a pixel size 1.6 µm. The beam profile of the light beam extracted from micro-LED 1920 may be shown by a curve 1922.

Figure 19C:
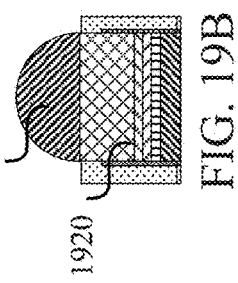

In the example shown in FIG. 19C, a micro-LED 1930 may include a vertical mesa structure and a non-native micro-lens 1934 at the out-coupling surface, where micro-lens 1934 may be formed in a dielectric layer, such as a $SiO_2$ layer. In some embodiments, micro-lens 1934 may be formed in a dielectric substrate and then bonded to micro-LED 1930. In some embodiments, the dielectric layer may be deposited on micro-LED 1930 and may then be etched to form micro-lens 1934. Micro-LED 1930 may have a pixel size 1.6 µm. The beam profile of the light beam emitted by micro-LED 1930 is shown by a curve 1932, which may be narrower than the beam profiles of micro-LEDs 1910 and 1920. Therefore, the light extraction efficiency for micro-LED 1930 within the ±18° acceptance angle range may be improved.

Figure 19D:
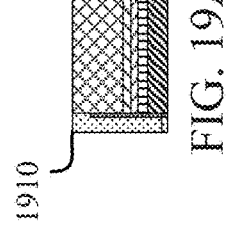

In the example shown in FIG. 19D, a micro-LED 1940 may include a vertical mesa structure, a native micro-lens 1946, and a non-native micro-lens 1944. Native micro-lens 1946 may be etched in a semiconductor (e.g., GaN) layer. Non-native micro-lens 1944 may be formed in a dielectric layer, such as a $SiO_2$ layer, deposited on native micro-lens 1946. Micro-LED 1940 may have a pixel size 1.6 µm. The beam profile of the light beam emitted by micro-LED 1940 is shown by a curve 1942.

In the example shown in FIG. 19E, a micro-LED 1950 may include a vertical mesa structure, a native micro-lens 1956, and a non-native micro-lens 1954. Native micro-lens 1956 may be etched in a semiconductor (e.g., GaN) layer. Non-native micro-lens 1954 may be formed in a dielectric layer having a high refractive index, such as a $Si_3N_4$ layer, deposited on native micro-lens 1956. Micro-LED 1950 may have a pixel size 1.6 µm. The beam profile of the light beam emitted by micro-LED 1950 is shown by a curve 1952.

In the example shown in FIG. 19F, a micro-LED 1960 may include a vertical mesa structure and a non-native micro-lens 1964 at the out-coupling surface, where micro-lens 1934 may be formed in a dielectric layer, such as a $SiO_2$ layer. Micro-LED 1960 includes a vertical mesa structure and a non-native micro-lens 1964 at the out-coupling surface, where micro-lens 1964 may be formed in a dielectric layer, such as a $SiO_2$ or $SiN_x$ layer. Micro-LED 1960 may have a pixel size 1.2 µm. The beam profile of the light beam extracted from micro-LED 1960 is shown by a curve 1962, which may be narrower than the beam profiles of micro-LEDs 1910-1950.

In the example shown in FIG. 19G, a micro-LED 1970 may include a vertical mesa structure, a native micro-lens

1976, and a non-native micro-lens 1974. Native micro-lens 1976 may be etched in a semiconductor (e.g., GaN) layer. Non-native micro-lens 1974 may be formed in a dielectric layer, such as a $SiO_2$ layer, deposited on native micro-lens 1976. Micro-LED 1970 may have a pixel size 1.2 μm. The beam profile of the light beam emitted by micro-LED 1970 is shown by a curve 1972.

In the example shown in FIG. 19H, a micro-LED 1980 may include a vertical mesa structure, a native micro-lens 1986, and a non-native micro-lens 1984. Native micro-lens 1986 may be etched in a semiconductor (e.g., GaN) layer. Non-native micro-lens 1984 may be formed in a dielectric layer having a high refractive index, such as a $Si_3N_4$ layer, deposited on native micro-lens 1986. Micro-LED 1980 may have a pixel size 1.2 μm. The beam profile of the light beam emitted by micro-LED 1980 is shown by a curve 1982.

Figures 20A, 20B:
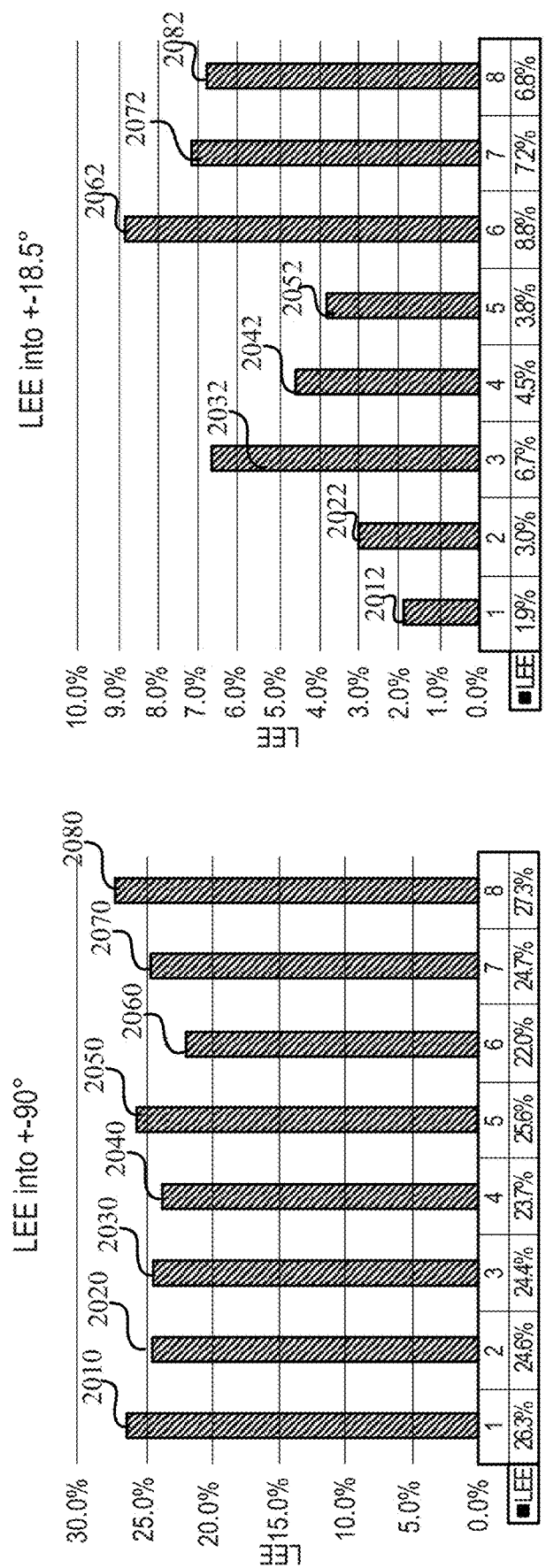
FIG. 20A illustrates simulated light extraction efficiencies of the examples of green micro-LEDs shown in FIGS. 19A-19H according to certain embodiments.
FIG. 20B illustrates simulated light extraction efficiencies of the examples of green micro-LEDs shown in FIGS. 19A-19H according to certain embodiments.

FIG. 20A illustrates simulated light extraction efficiencies of the examples of green micro-LEDs shown in FIGS. 19A-19H according to certain embodiments. In the examples shown in FIG. 20A, bars 2010, 2020, 2030, 2040, 2050, 2060, 2070, and 2080 indicate the simulated light extraction efficiencies within a ±90° acceptance angle range for micro-LEDs 1910, 1920, 1930, 1940, 1950, 1960, 1970, and 1980, respectively. Micro-LED 1960 may have the lowest light extraction efficiency within the ±90° angular range.

FIG. 20B illustrates simulated light extraction efficiencies of the examples of green micro-LEDs shown in FIGS. 19A-19H according to certain embodiments. In FIG. 20B, bars 2012, 2022, 2032, 2042, 2052, 2062, 2072, and 2082 indicate the simulated light extraction efficiencies within a ±18.5° acceptance angle range for micro-LEDs 1910, 1920, 1930, 1940, 1950, 1960, 1970, and 1980, respectively. Micro-LED 1960 may have the highest light extraction efficiency within the ±18.5° angular range.

FIG. 21A illustrates an example of a red micro-LED 2100 having a vertical mesa 2110 and a remote lens 2130 according to certain embodiments. A dielectric layer 2120 (e.g., a $SiO_2$ layer) may be formed (e.g., deposited or bonded) on vertical mesa 2110, and remote lens 2130 may be formed on or in dielectric layer 2120.

FIG. 21B is a chart 2140 illustrating simulation results of light extraction efficiencies for examples of red micro-LEDs having different sizes according to certain embodiments. The examples of the red micro-LEDs may have structures similar to the structure of micro-LED 2100 as shown in FIG. 21A, and may have mesa diameters from about 0.8 μm to about 1.6 μm. FIG. 21B shows that the light extraction efficiency within the ±18° acceptance angle range may be about 2.2% when the micro-LED has a mesa diameter about 0.8 μm, or about 0.8% when the micro-LED has a mesa diameter about 1.6 μm.

FIG. 21C illustrates an example of a red micro-LED 2150 including a vertical mesa 2152 and a native lens 2154 according to certain embodiments. FIG. 21D illustrates a beam profile 2160 of the example of red micro-LED 2150 according to certain embodiments. Red micro-LED 2150 may have a pixel size of about 1.6 μm. Lens 2154 may be formed in a semiconductor layer, such as a substrate (e.g., substrate 710 or 715) or an n-type semiconductor layer. The light extraction efficiency within an about ±18.5° acceptance angle range may be about 0.9%.

FIG. 21E illustrates an example of a red micro-LED 2170 including a vertical mesa 2172 and a non-native lens 2174 according to certain embodiments. FIG. 21F illustrates a beam profile 2180 of the example of red micro-LED 2170 according to certain embodiments. Red micro-LED 2170 may have a pixel size of about 1.2 μm. Lens 2174 may be formed in a $Si_3N_4$ layer deposited on vertical mesa 2172. Beam profile 2180 may have a smaller HWHM angle. The light extraction efficiency within an about ±18.5° acceptance angle range may be greater than about 2.5% or higher.

Figure 22B:
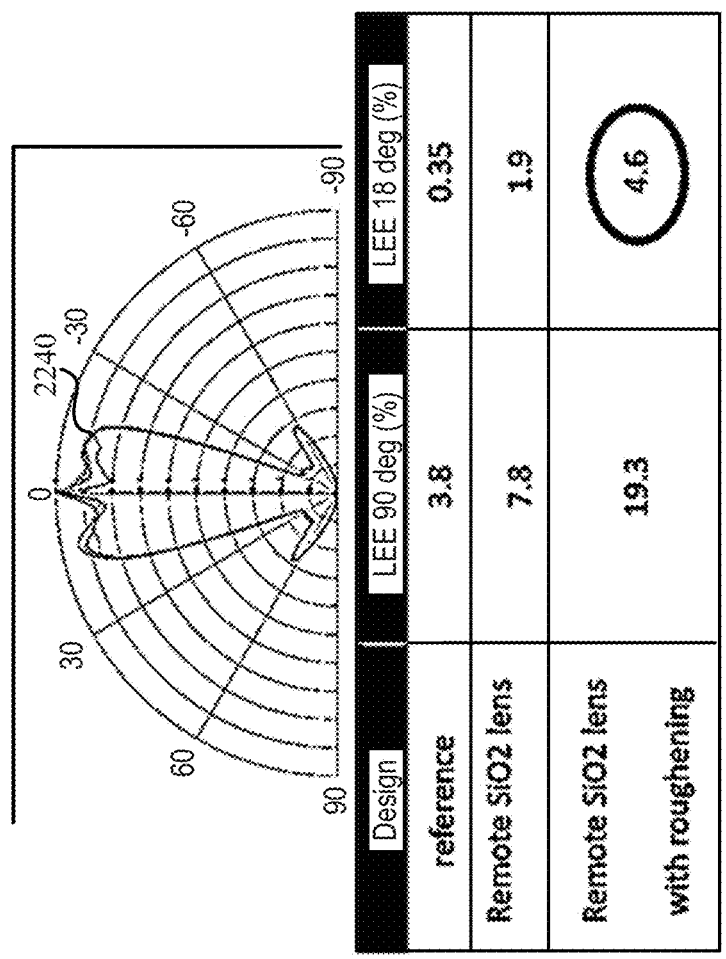
FIG. 22B illustrates simulation results of beam profiles of light extracted from examples of red micro-LEDs having the structure of the micro-LED shown in FIG. 22A according to certain embodiments.
Figure 22A:
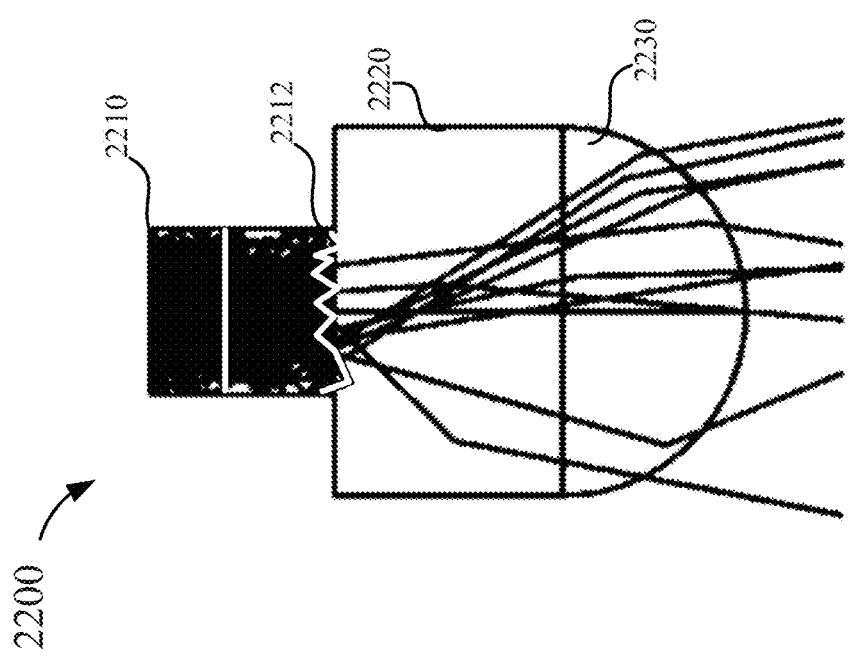
FIG. 22A illustrates an example of a red micro-LED including a vertical mesa, a rough surface, and a micro-lens according to certain embodiments.

FIG. 22A illustrates an example of a red micro-LED 2200 including a vertical mesa 2210, a rough surface 2212, and a micro-lens 2230 according to certain embodiments. Micro-LED 2200 may have a small linear dimension, such as less than about 1 μm. The n-type semiconductor side of the vertical mesa 2210 may have a rough surface. A dielectric (e.g., $SiO_2$) layer 2220 may be formed on the rough surface, where micro-lens 2230 may be formed in or bonded to dielectric layer 2220.

FIG. 22B illustrates simulation results of beam profiles 2240 of light extracted from examples of red micro-LEDs having the structure of micro-LED 2200 according to certain embodiments. For a micro-LED without a micro-lens and a rough surface, the light extraction efficiency for the micro-LED may be about 3.8% within the ±90° acceptance angle range or may be about 0.35% within the ±18° acceptance angle range. For a micro-LED with a micro-lens but not a rough surface, the light extraction efficiency for the micro-LED may be about 7.8% within the ±90° acceptance angle range or may be about 1.9% within the ±18° acceptance angle range. For micro-LED 2200 with a micro-lens 2230 and a rough surface 2212, the light extraction efficiency may be about 19.3% within the ±90° acceptance angle range or may be about 4.6% within the ±18° acceptance angle range.

Figure 23B:
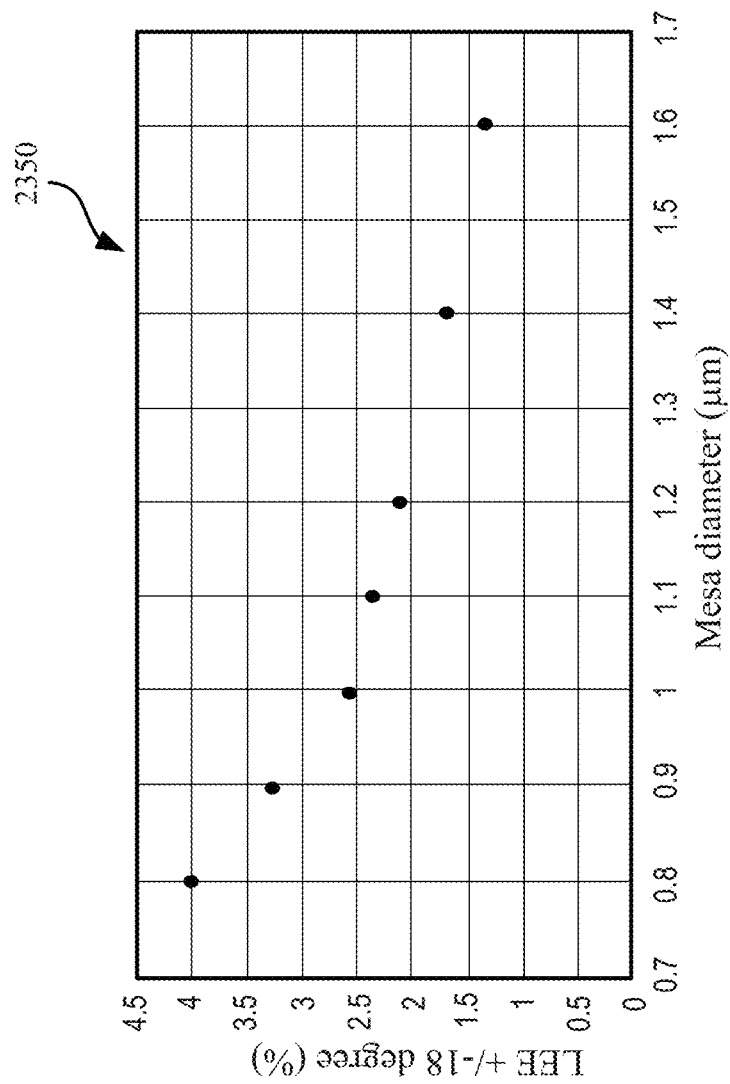
FIG. 23B illustrates simulation results of light extraction efficiencies for examples of red micro-LEDs having the structure of the micro-LED shown in FIG. 23A and different sizes according to certain embodiments.
Figure 23A:
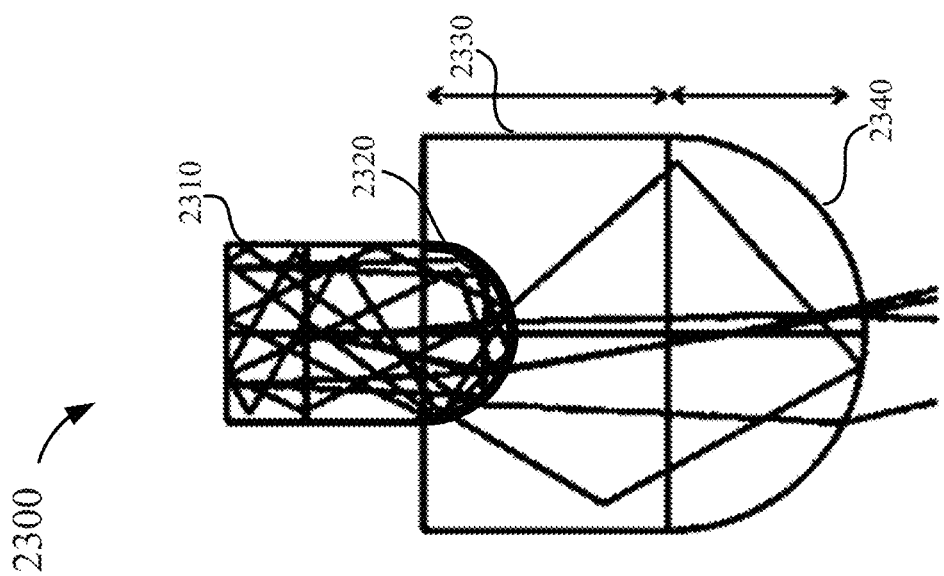
FIG. 23A illustrates an example of a red micro-LED including a vertical mesa, a native lens, and a remote lens according to certain embodiments.

FIG. 23A illustrates an example of a red micro-LED 2300 including a vertical mesa 2310, a native lens 2320, and a remote lens 2340 according to certain embodiments. A dielectric layer 2330 (e.g., a $SiO_2$ layer) may be formed on native lens 2320, and remote lens 2340 may be formed on or in dielectric layer 2330.

FIG. 23B is a chart 2350 illustrating simulation results of light extraction efficiencies for examples of red micro-LEDs having the structure of micro-LED 2300 and different mesa sizes according to certain embodiments. The red micro-LEDs may have a structure as shown in FIG. 23A, and may have mesa diameters from about 0.8 μm to about 1.6 μm. FIG. 23B shows that the light extraction efficiency within the ±18° acceptance angle range may be about 4% when the micro-LED has a mesa diameter about 0.8 μm, which may be about 10 times higher than the light extraction efficiency for a vertical mesa micro-LED without a micro-lens or surface roughening. The light extraction efficiency within the ±18° acceptance angle range may be about 1.4% when the micro-LED has a mesa diameter about 1.6 μm.

Figure 24A:
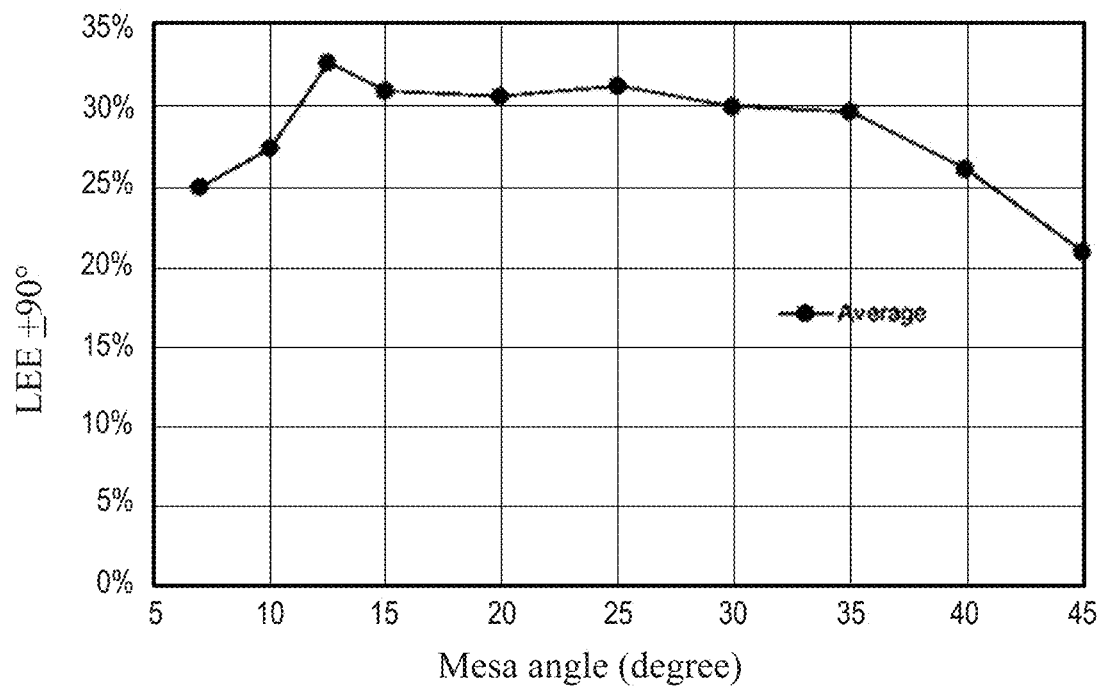
FIG. 24A illustrates simulated light extraction efficiencies for examples of green micro-LEDs with different mesa facet angles according to certain embodiments.
Figure 24B:
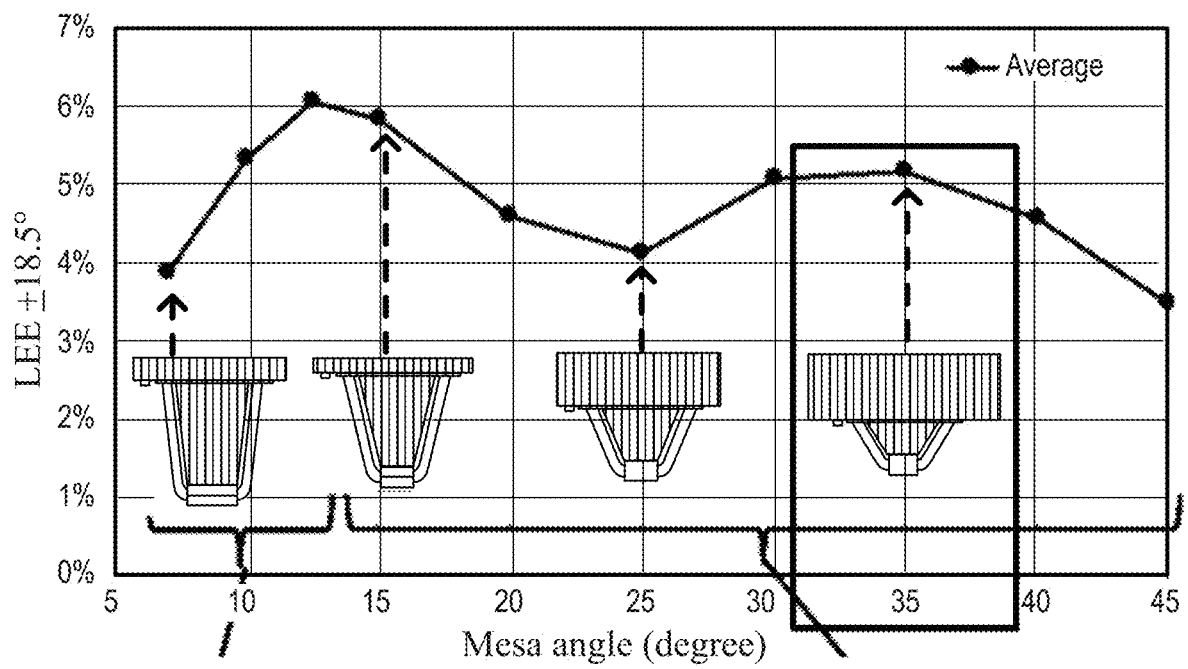
FIG. 24B illustrates simulated light extraction efficiencies for examples of green micro-LEDs with different mesa facet angles and different mesa heights according to certain embodiments.

FIGS. 24A-24B illustrate simulated light extraction efficiencies of examples of green micro-LEDs with conical mesa structures having different mesa facet angles and different mesa heights according to certain embodiments. In the examples shown in FIGS. 24A-24B, the micro-LEDs have mesa facet angles between about 7° and about 45° and a same bottom mesa size, such as 1.6 μm. Thus, the mesa structures in the micro-LEDs may have different heights or depths. In FIG. 24A, the horizontal axis corresponds to the mesa facet angle of the conical mesa structure and the vertical axis corresponds to the light extraction efficiency within the ±90° acceptance angle range. In FIG. 24B, the horizontal axis corresponds to the mesa facet angle of the conical mesa structure and the vertical axis corresponds to the light extraction efficiency within the ±18.5° acceptance angle range.

Figure 25A:
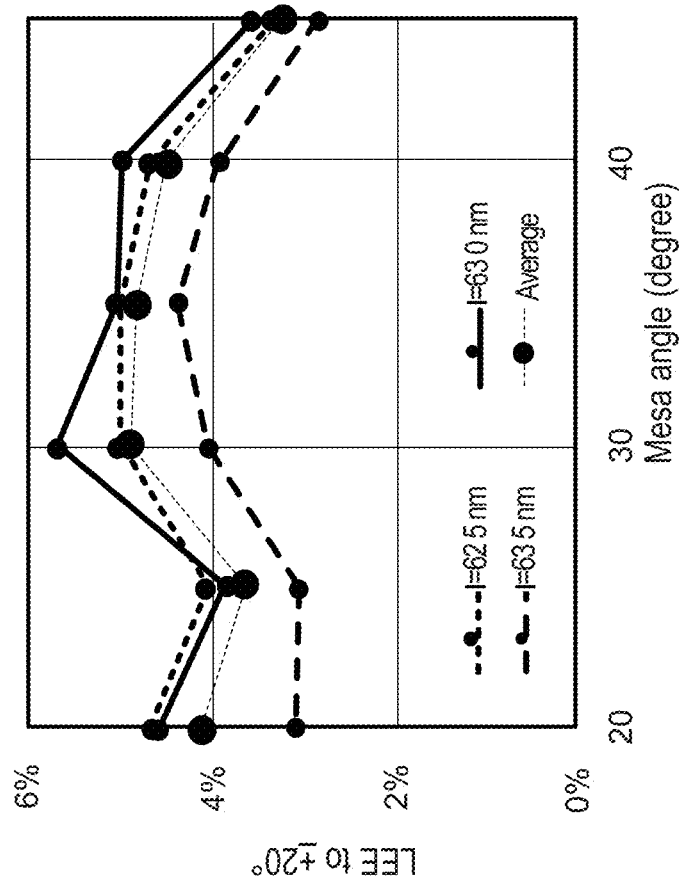
FIG. 25A illustrates simulated light extraction efficiencies for examples of green micro-LEDs with different mesa facet angles and sizes according to certain embodiments.

FIG. 25A illustrates simulated light extraction efficiencies of examples of green micro-LEDs with different mesa facet angles and sizes according to certain embodiments. The horizontal axis of FIG. 25A corresponds to the mesa facet angle of the mesa structure and the vertical axis corresponds to the light extraction efficiency within the ±20° acceptance angle range. The curves in FIG. 25A show the light extraction efficiency as a function of the mesa facet angle (e.g., from about 19° to about 45°) for green light of different wavelengths, such as 525 nm, 530 nm, and 535 nm. As shown by FIG. 25A, the light extraction efficiency is the highest when the mesa facet angle is between about 30° and about 40°.

Figure 25B:
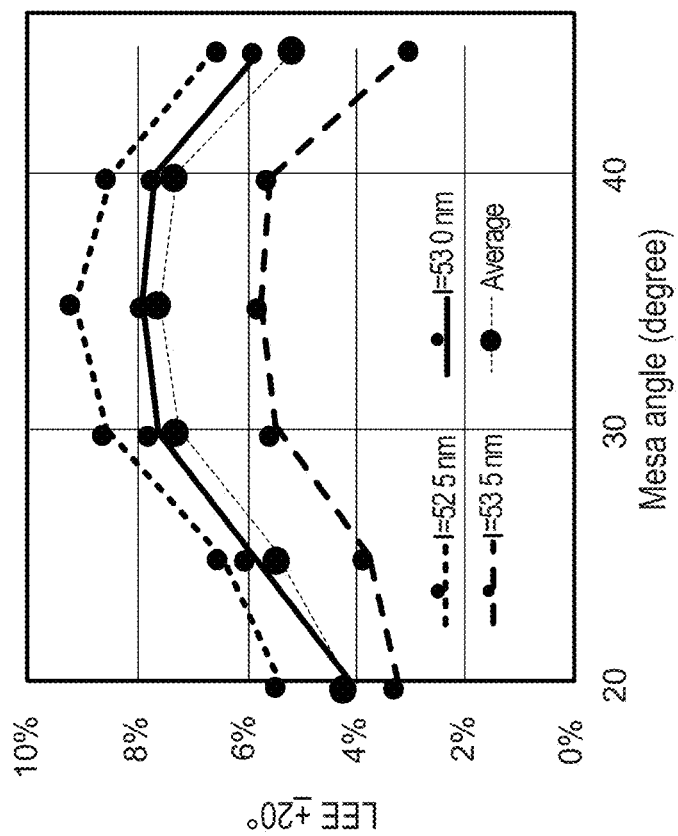
FIG. 25B illustrates simulated light extraction efficiencies for examples of red micro-LEDs with different mesa facet angles and sizes according to certain embodiments.

FIG. 25B illustrates simulated light extraction efficiencies of examples of red micro-LEDs with different mesa facet angles and sizes according to certain embodiments. The horizontal axis of FIG. 25B corresponds to the mesa facet angle of the mesa structure and the vertical axis corresponds to the light extraction efficiency within the ±20° acceptance angle range. The curves in FIG. 25B show the light extraction efficiency as a function of the mesa facet angle (e.g., from about 19° to about 45°) for red light of different wavelengths, such as 625 nm, 630 nm, and 635 nm. As shown by FIG. 25B, the light extraction efficiency is the highest when the mesa facet angle is between about 30° and about 40°.

Figure 26A:
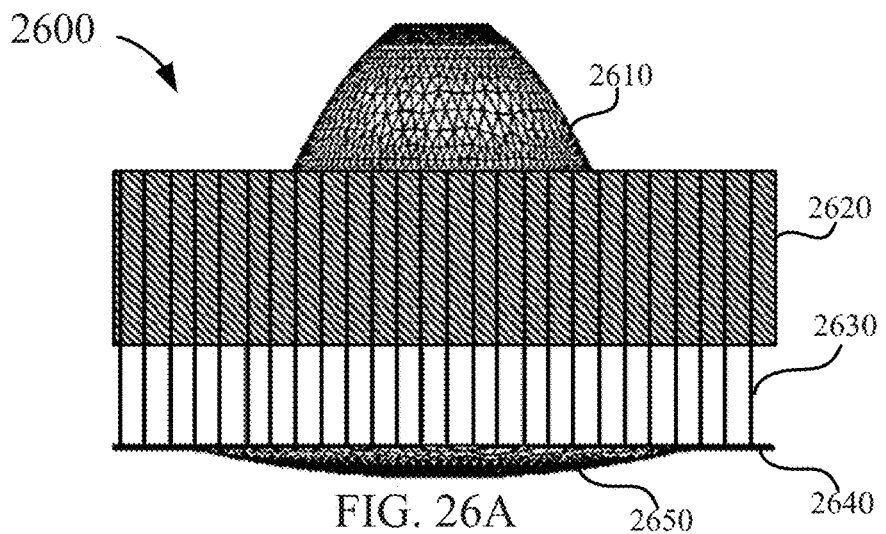
FIGS. 26A-26C illustrate examples of red micro-LEDs having parabolic mesas, anti-reflection coating, and different micro-lenses according to certain embodiments.
Figure 26B:
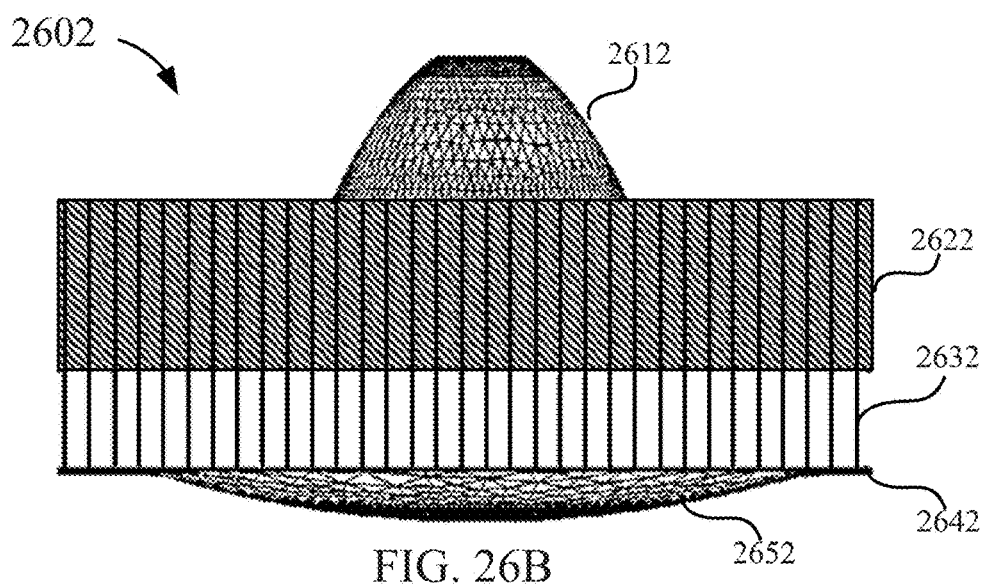
Figure 26C:
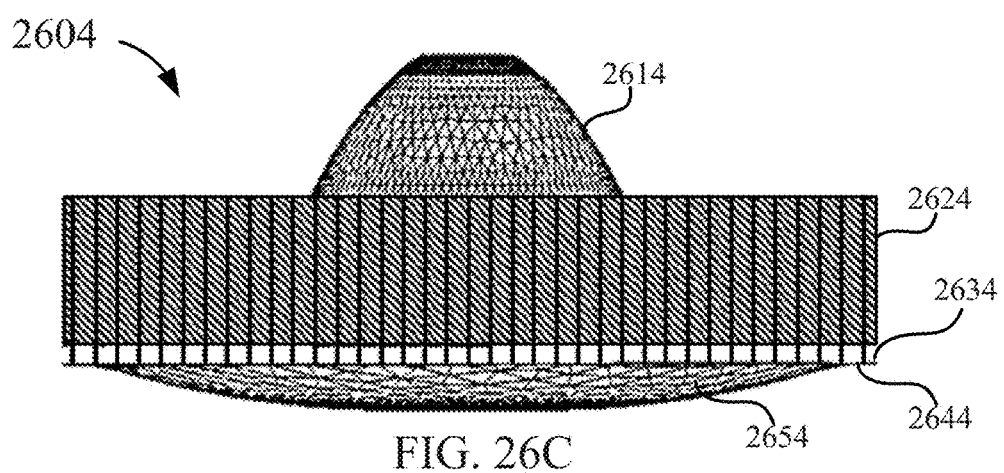

FIGS. 26A-26C illustrate examples of red micro-LEDs having parabolic mesas, anti-reflection coating, and different micro-lenses according to certain embodiments. The micro-lenses may be spherical or aspherical (e.g., toroidal). The micro-lenses may be formed in a layer deposited on the micro-LEDs, may be etched into the semiconductor layers, or may be fabricated on a substrate (e.g., PMA, $SiO_2$, SiNx, etc.) and then bonded to the out-coupling surface of the micro-LEDs.

FIG. 26A illustrates a red micro-LED 2600 that includes a parabolic masa 2610, a current-spreading layer, an anti-reflection layer 2640, and a spherical micro-lens 2650. Parabolic masa 2610 may have a bottom diameter of about 3 μm. The current spreading layer may include, for example, an n-type semiconductor layer 2620, and a substrate layer 2630. Micro-lens 2650 may be a native lens etched in the semiconductor layer (e.g., an n-type semiconductor layer), and may have a focal point at the MQW of micro-LED 2600. The HWHM angle of the red micro-LED 2600 may be about 41°. The light extraction efficiency may be about 61% within the ±90° acceptance angle range, or about 2.2% within the ±10° acceptance angle range.

FIG. 26B illustrates a red micro-LED 2602 that includes a parabolic masa 2612, a current-spreading layer, an anti-reflection layer 2642, and a large spherical micro-lens 2652. Parabolic masa 2612 may have a bottom diameter of about 3 μm. The current spreading layer may include, for example, an n-type semiconductor layer 2622 and a substrate layer 2632. Micro-lens 2652 may be a native lens etched in the semiconductor layer, and may have a focal point at the MQW of micro-LED 2602. Micro-lens 2652 may have a thickness greater than the thickness of micro-lens 2650. The HWHM angle of the red micro-LED 2602 may be about 40°. The light extraction efficiency may be about 76.3% within the ±90° acceptance angle range, or about 3.4% within the ±10° acceptance angle range.

FIG. 26C illustrates a red micro-LED 2604 that includes a parabolic masa 2614, a current-spreading layer, an anti-reflection layer 2644, and a toroidal micro-lens 2654. The current spreading layer may include an n-type semiconductor layer 2624 and a substrate layer 2634. Micro-lens 2654 may be a native lens etched in the semiconductor layer, and may have a focal point at the MQW of micro-LED 2604. The HWHM angle of the red micro-LED 2600 may be about 42°. The light extraction efficiency may be about 62% within the ±90° acceptance angle range, or about 2.1% within the ±10° acceptance angle range.

FIGS. 27A-27B illustrate an example of a micro-LED 2700 having a parabolic mesa 2710 and a micro-lens 2730 according to certain embodiments. Parabolic mesa 2710 may include a p-type semiconductor layer 2712 and a p-type contact (e.g., including Ag, Pt, and/or Au) (not shown in FIGS. 27A and 27B). The p-type semiconductor layer 2712 and the p-type contact may form a back reflector. Parabolic mesa 2710 may also include a mesa reflector (e.g., including $SiO_2$ or SiN, and Ag, Pt, and/or Au, not shown in FIGS. 27A and 27B) formed on the sidewalls or facets of parabolic mesa 2710.

FIG. 27A shows that light approximately laterally emitted in the active region may be reflected by the parabolic mesa reflector and propagate in substantially the vertical direction, where the far-field beam profile may be shown by a curve 2740. FIG. 27B shows that light emitted towards p-type semiconductor layer 2712 may be reflected by the back reflector. The thickness of the p-type semiconductor layer 2712 may be selected such that the light reflected from the back reflector may constructively interfere with light emitted towards an n-type semiconductor layer 2720 to enhance the light extraction. Because of the parabolic shape of the mesa reflector, light reflected by the mesa reflector may have been at least partially collimated, while light reflected by the flat back reflector may not be collimated. Thus, micro-lens 2730 may be a toroidal lens that may have different optical power or focal lengths at different regions. For example, in a center region 2732, micro-lens 2730 may have a focal length approximately equal to the distance between micro-lens 2730 and the active region. In a ring-shaped region 2734 where the light reflected by the parabolic mesa reflector may pass through may have a much lower optical power or a longer focal length. The toroidal lens may be made in a dielectric layer or may be etched into a semiconductor layer (e.g., n-type semiconductor layer 2720), or may be fabricated on a substrate (e.g., PMA, $SiO_2$, SiNx, etc.) and then bonded to the out-coupling surface of micro-LED 2700.

Figure 28:
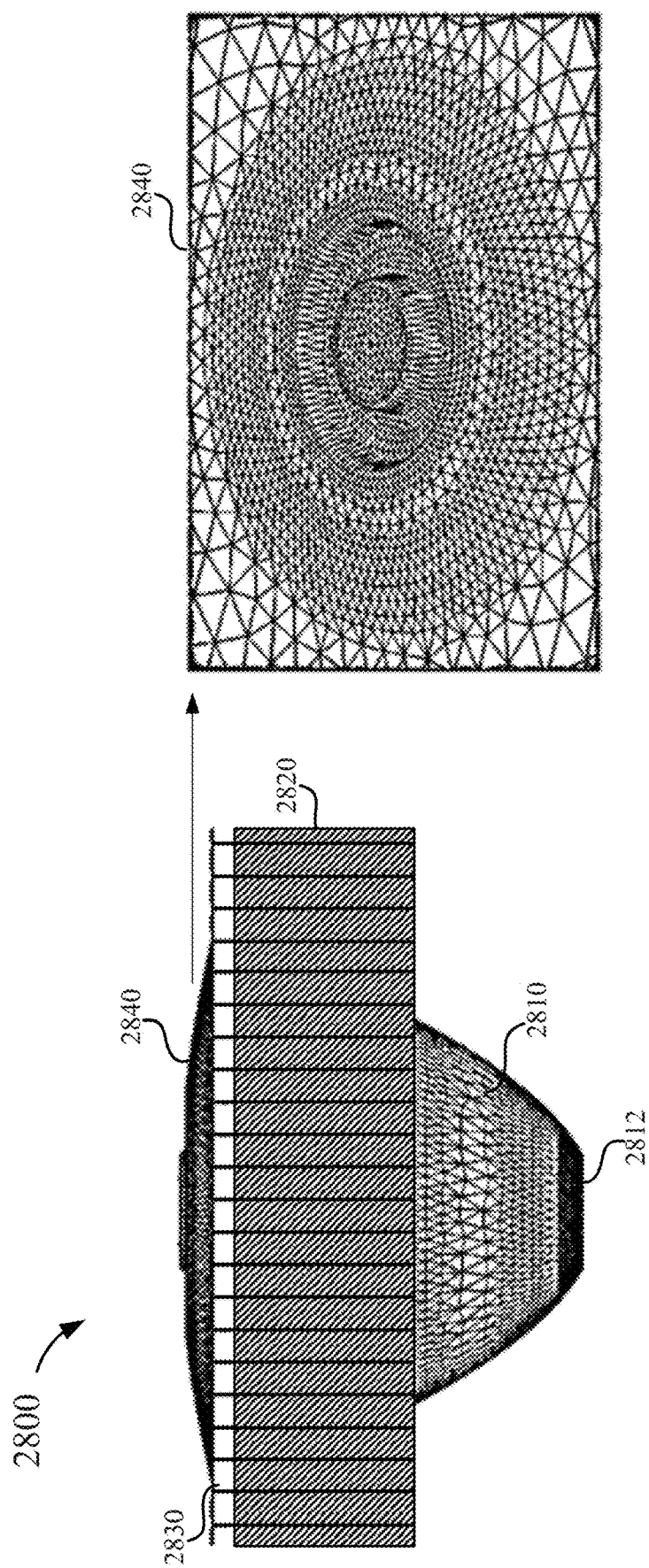
FIG. 28 illustrates an example of a micro-LED having a parabolic mesa and a micro-lens at an out-coupling surface of the micro-LED according to certain embodiments.

FIG. 28 illustrates an example of a micro-LED 2800 having a parabolic mesa 2810 and a micro-lens 2840 at an out-coupling surface of micro-LED 2800 according to certain embodiments. As described above with respect to FIGS. 27A and 27B, parabolic mesa 2810 may include a p-type semiconductor layer 2812 and a p-contact layer (not shown) that form a back reflector. Parabolic mesa 2810 may also include a mesa reflector (not shown) and an n-type layer 2820, which may act as a current spreading layer for making the n-contact. Micro-lens 2840 may be a toroidal lens as shown in the top view inset. Micro-lens 2840 may be etched into a semiconductor layer 2830, such as a GaN (for blue or green LED) or AlGaAs (for red LED) layer.

In the example shown in FIG. 28, micro-LED 2800 may be a red LED. Micro-LED 2800 may include an anti-reflection coating at the out-coupling surface. Micro-lens 2840 may be etched in an AlGaAs layer and may have a focal plane in the active region (e.g., the MQW). The HWHM angle of red micro-LED 2800 may be about 42°. The light extraction efficiency may be about 62% within the ±90° acceptance angle range, or about 2.1% within the ±10° acceptance angle range.

Figure 29:
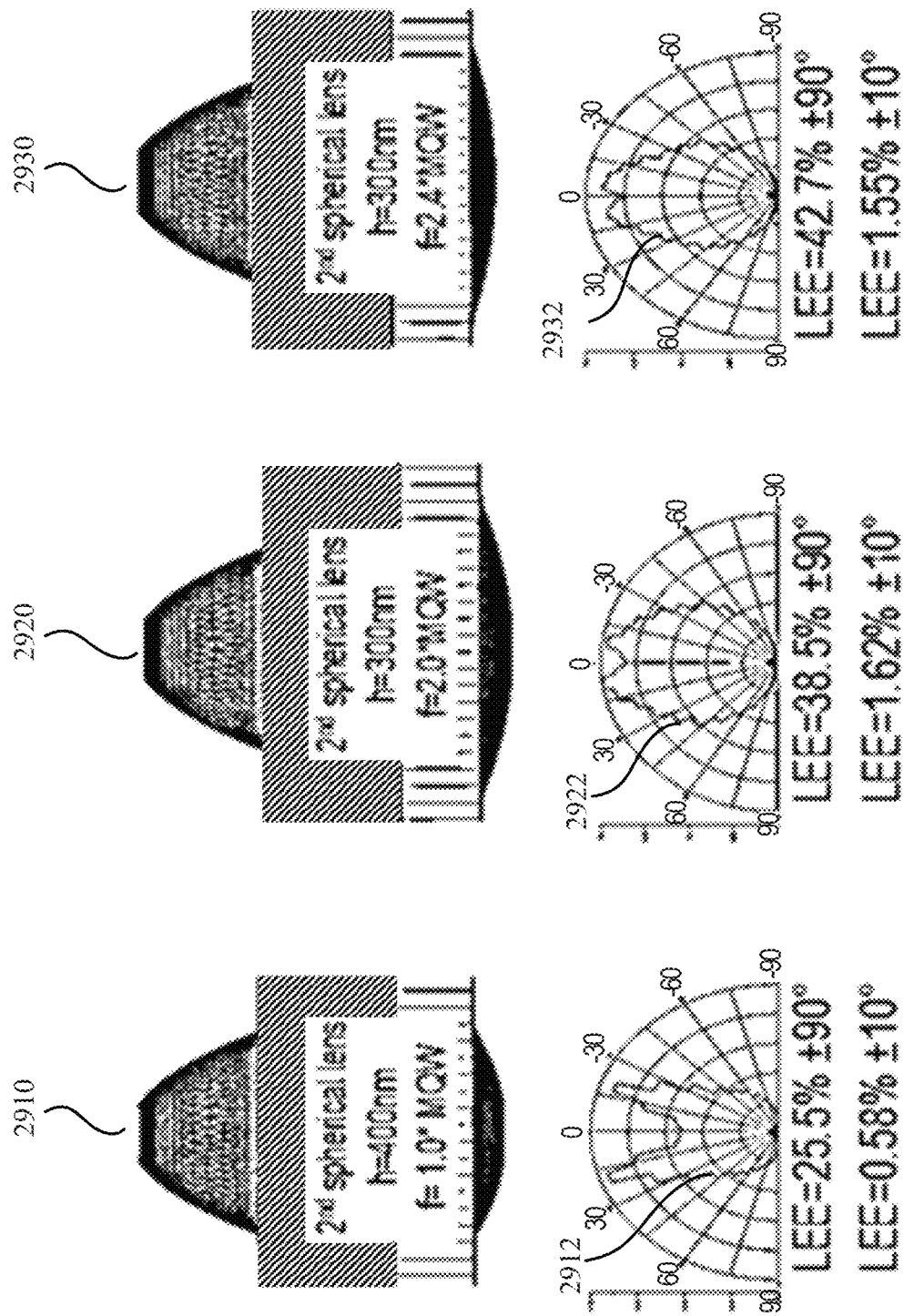
FIG. 29 illustrates simulation results of light extraction from examples of red micro-LEDs using micro-lenses with different focal lengths according to certain embodiments.
Figure 29:
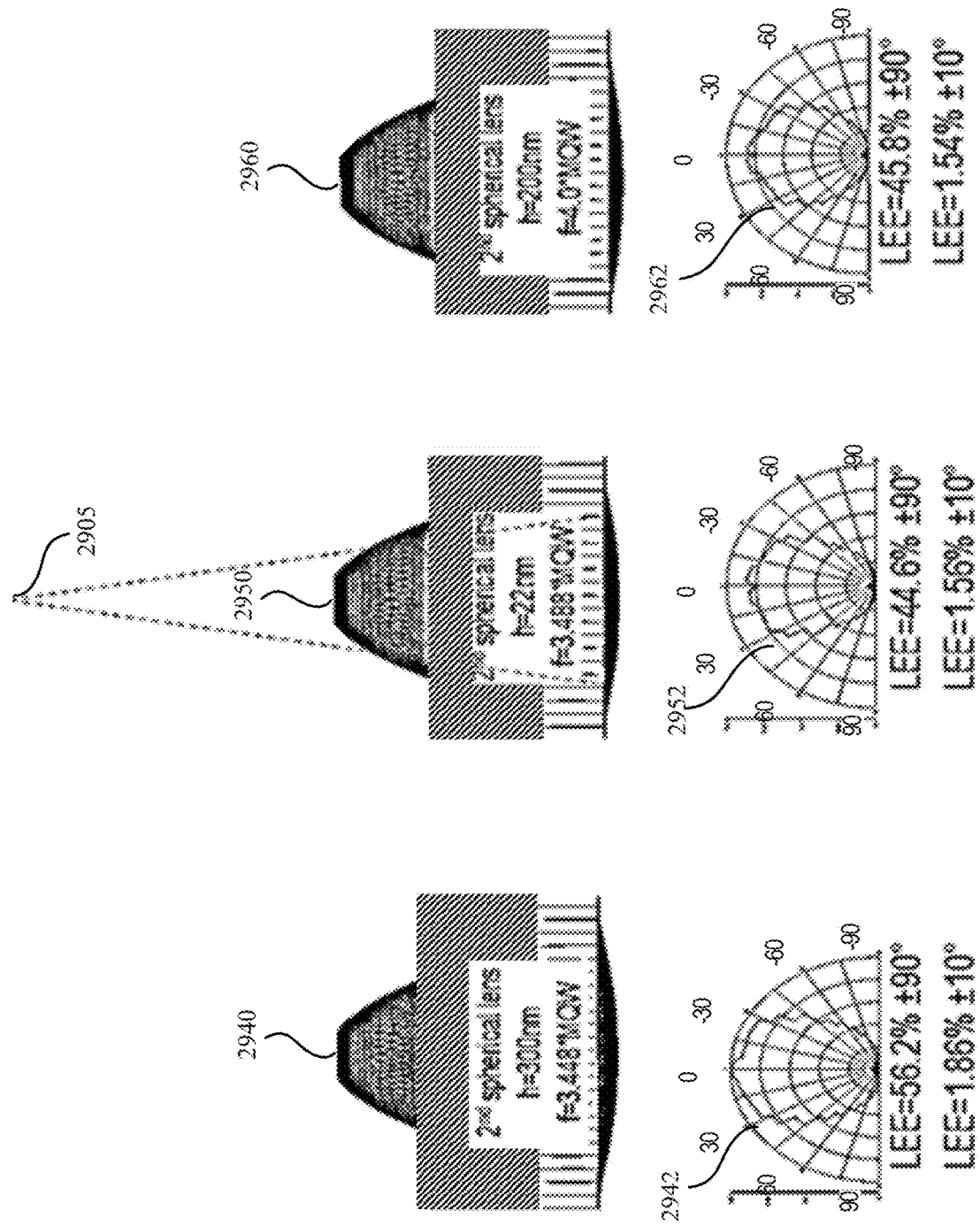

FIG. 29 illustrates simulation results of light extraction from examples of red micro-LEDs using micro-lenses with different focal lengths according to certain embodiments. Micro-LEDs 2910, 2920, 2930, 2940, 2950, and 2960 may have the same back reflectors and mesa reflectors, but may include micro-lenses with different focal lengths and/or focal point locations. FIG. 29 shows that the micro-lens can significantly affect the light extraction efficiency for both large acceptance angles and small acceptance angles. For example, in micro-LED 2910, the micro-lens may have a thickness about 400 nm and a focal length approximately equal to the distance from the micro-lens to the MQW. The extracted light beam may be characterized by a beam profile 2912. The light extraction efficiency may be about 25.5% within a ±90° acceptance angle range, or about 0.58% within a ±10° acceptance angle range.

In micro-LED 2920, the micro-lens may have a thickness about 300 nm and a focal length approximately equal to twice of the distance from the micro-lens to the MQW. The extracted light beam may be characterized by a beam profile 2922. The light extraction efficiency may be about 38.5% within the ±90° acceptance angle range, or about 1.62% within the ±10° acceptance angle range.

In micro-LED 2930, the micro-lens may have a thickness about 300 nm and a focal length approximately equal to 2.4 times of the distance from the micro-lens to the MQW. The extracted light beam may be characterized by a beam profile 2932. The light extraction efficiency may be about 42.7% within the ±90° acceptance angle range, or about 1.55% within the ±10° acceptance angle range.

In micro-LED 2940, the micro-lens may have a thickness about 300 nm and a focal length approximately equal to 3.448 times of the distance from the micro-lens to the MQW. The extracted light beam may be characterized by a beam profile 2942. The light extraction efficiency may be about 56.2% within the ±90° acceptance angle range, or about 1.86% within the ±10° acceptance angle range.

In micro-LED 2950, the micro-lens may have a thickness about 220 nm and a focal length approximately equal to 3.448 times of the distance from the micro-lens to the MQW, where the focal point is at a point 2905. The extracted light beam may be characterized by a beam profile 2952. The light extraction efficiency may be about 44.6% within the ±90° acceptance angle range, or about 1.56% within the ±10° acceptance angle range.

In micro-LED 2960, the micro-lens may have a thickness about 190 nm and a focal length approximately equal to about four times of the distance from the micro-lens to the MQW. The extracted light beam may be characterized by a beam profile 2962. The light extraction efficiency may be about 45.8% within the ±90° acceptance angle range, or about 1.54% within the ±10° acceptance angle range. Thus, micro-LED 2940 may achieve the highest LEE.

Figures 30A, 30B, 30C:
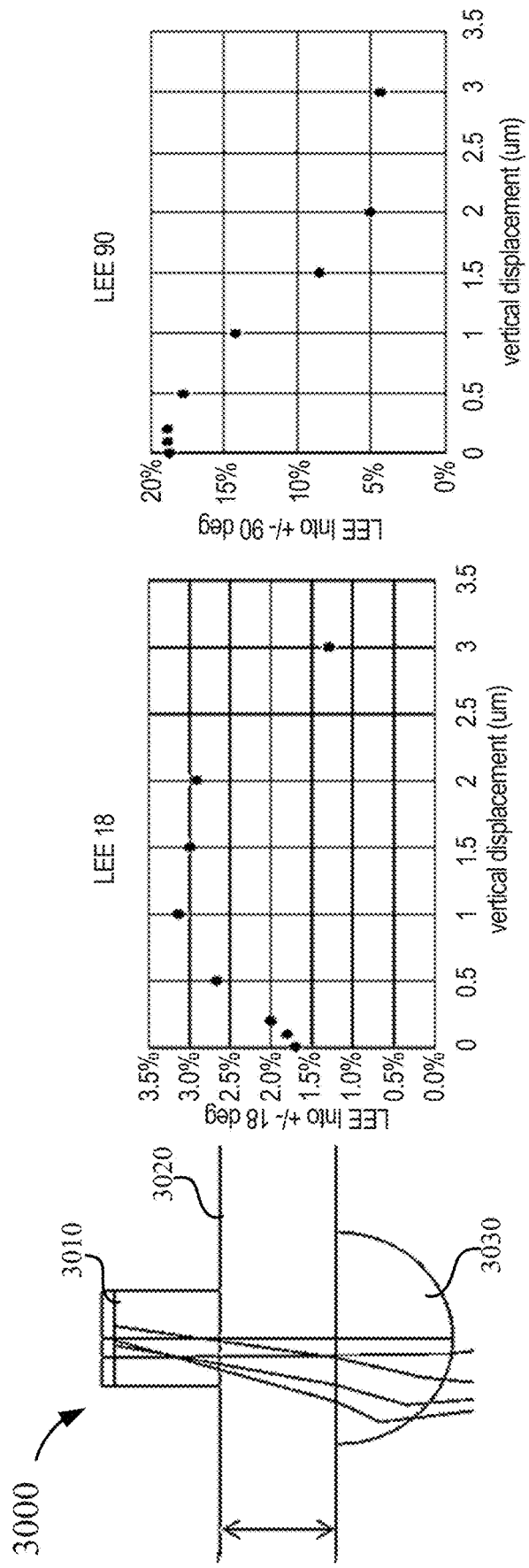
FIG. 30A illustrates an example of a micro-LED with a vertical mesa structure and a micro-lens according to certain embodiments.
FIG. 30B illustrates simulated light extraction efficiencies of examples of micro-LEDs having the structure of the micro-LED shown in FIG. 30A as a function of the vertical displacement of the micro-lens according to certain embodiments.
FIG. 30C illustrates simulated light extraction efficiencies of examples of micro-LEDs having the structure of the micro-LED shown in FIG. 30A as a function of the vertical displacement of the micro-lens according to certain embodiments.

FIG. 30A illustrates an example of a micro-LED 3000 with a vertical mesa structure 3010 and a micro-lens 3030 according to certain embodiments. Micro-lens 3030 may be formed in a dielectric layer 3020 and may be vertically displaced from vertical mesa structure 3010 by a distance d. Dielectric layer 3020 may include a dielectric material, such as $SiO_2$, $Si_3N_4$, or the like.

FIG. 30B illustrates simulated light extraction efficiencies of examples of micro-LEDs having the structure of micro-LED 3000 shown in FIG. 30A as a function of the vertical displacement (distance d) of the micro-lens from the vertical mesa structure according to certain embodiments. The examples of micro-LEDs may have vertical displacement (distance d) from 0 to about 3 µm, where the light extraction efficiency within the ±18° acceptance angle range may be the highest when the vertical displacement is between about 0.5 µm and about 2 µm.

FIG. 30C illustrates simulated light extraction efficiencies of examples of micro-LEDs having the structure of micro-LED 3000 shown in FIG. 30A as a function of the vertical displacement (distance d) of the micro-lens from the vertical mesa structure according to certain embodiments. The examples of micro-LEDs may have vertical displacement (distance d) from 0 to about 3 µm, where the light extraction efficiency within the ±90° acceptance angle range may generally decrease when the vertical displacement increases.

Figure 30D:
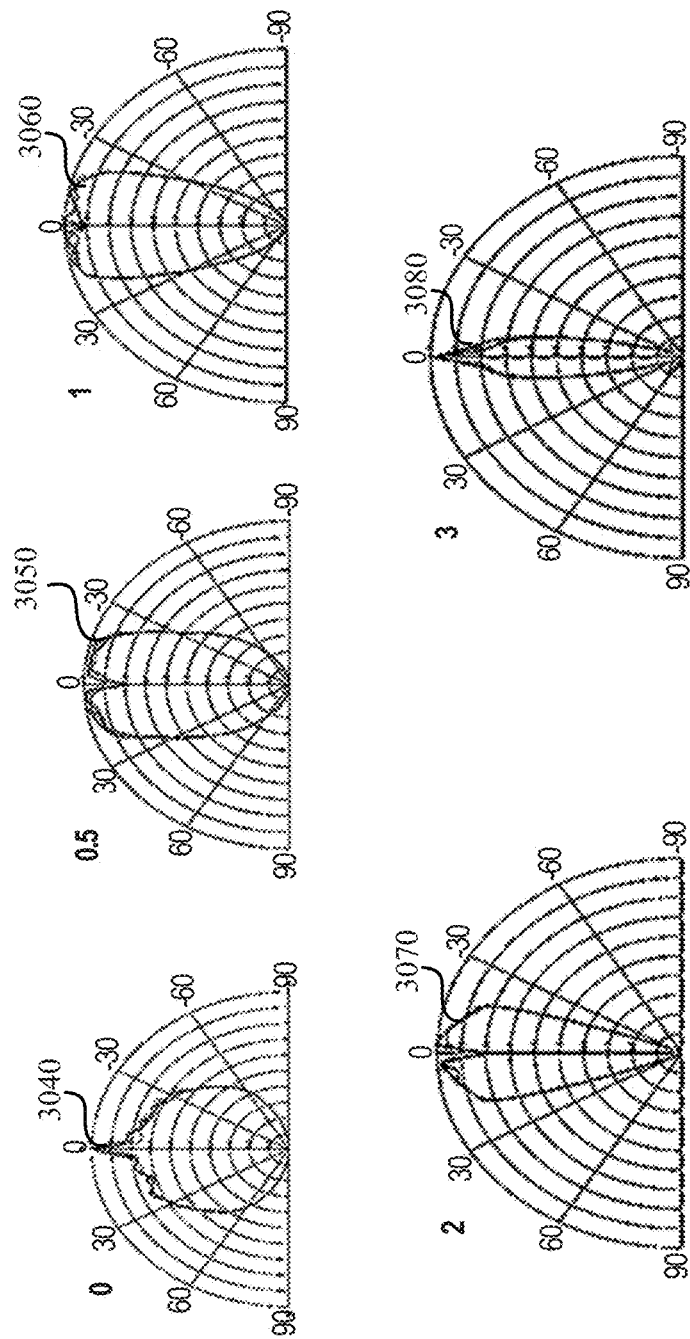
FIG. 30D illustrates simulated beam profiles of examples of micro-LEDs having the structure of the micro-LED shown in FIG. 30A as a function of the vertical displacement of the micro-lens according to certain embodiments.

FIG. 30D illustrates simulated beam profiles of examples of micro-LEDs having the structure of micro-LED 3000 shown in FIG. 30A as a function of the vertical displacement (distance d) of the micro-lens from the vertical mesa structure according to certain embodiments. A simulated beam profile 3040 may correspond to a micro-LED having the structure of micro-LED 3000 and no vertical displacement for the micro-lens. Simulated beam profiles 3050, 3060, 3070, and 3080 may correspond to micro-LEDs having the structure of micro-LED 3000 and with vertical displacement for the micro-lenses about 0.5 µm, 1 µm, 2 µm, and 3 µm, respectively.

Figure 31B:
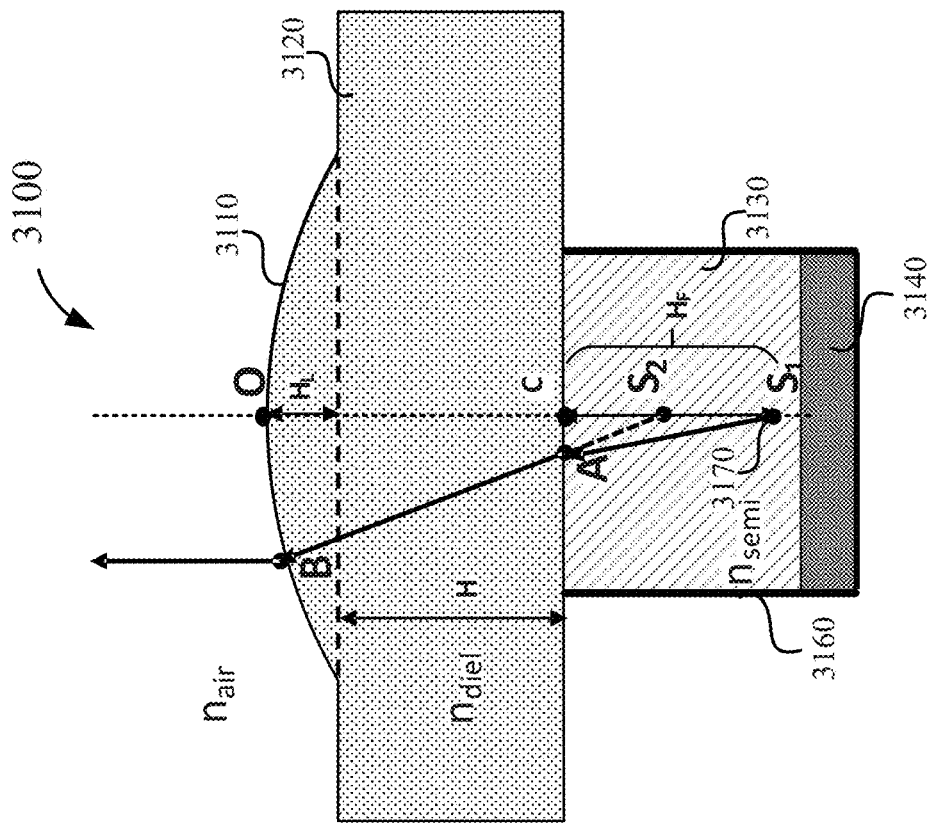
FIG. 31B illustrates light extraction and collimation by the micro-lens in the example of the micro-LED shown in FIG. 31A according to certain embodiments.
Figure 31A:
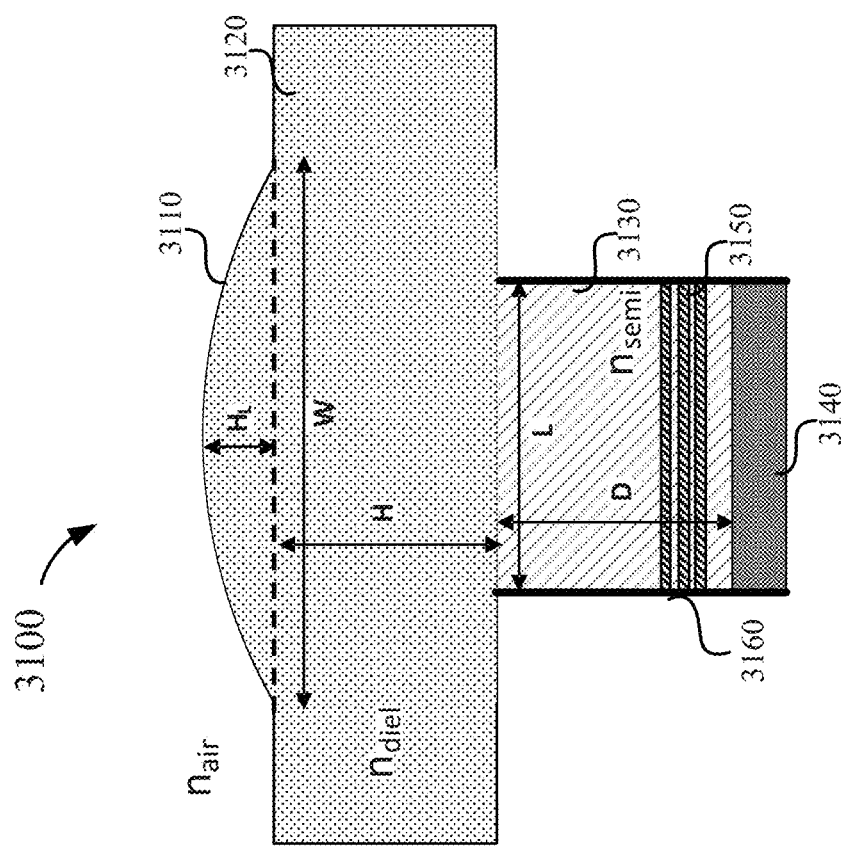
FIG. 31A illustrates an example of a micro-LED with a vertical mesa structure and a micro-lens according to certain embodiments.

FIG. 31A illustrates an example of a micro-LED 3100 including a vertical mesa structure 3130 and a micro-lens 3110 according to certain embodiments. Vertical mesa structure 3130 may include semiconductor materials having a refractive index $n_{semi}$, where the semiconductor materials may have a total thickness D and may include an active region 3150 and p and n regions. Vertical mesa structure 3130 may have a lateral size L. Active region 3150 may include one or more heterostructures, such as one or more quantum wells or MQWs. Vertical mesa structure 3130 may also include a metal contact 3140 (e.g., p-contact) and reflective sidewalls 3160. Micro-lens 3110 may be formed in a dielectric layer 3120 and may be vertically displaced from vertical mesa structure 3130 by a distance H. Dielectric layer 3120 may be deposited on vertical mesa structure 3130 and may include a dielectric material with a refractive index $n_{diel}$, such as $SiO_2$, $Si_3N_4$, or the like. Micro-lens 3110 may include a spherical lens having a radius R, a lateral size W (e.g., diameter), and thickness $H_L$. In general, to improve the light extraction efficiency, the lateral size W of micro-lens 3110 is larger than about 80% of the lateral size L of vertical mesa structure 3130.

FIG. 31B illustrates light extraction and collimation by micro-lens 3110 in the example of micro-LED 3100 shown in FIG. 31A according to certain embodiments. Micro-LED 3100 may be a plano-convex spherical lens. As shown in FIG. 31B, the effective focal point of micro-lens 3110 may be located at a point S1 in the semiconductor materials in vertical mesa structure 3130, and the focal point of micro-lens 3110 in dielectric layer 3120 may be at a point S2. The focal length of micro-lens 3110 in free space may be determined by:

$$f = \frac{R}{n_{diel} - n_{air}}.$$

The focal length of micro-lens 3110 in dielectric layer 3120 may be determined by:

$$\overline{OS_2} = F = R\frac{n_{diel}}{n_{diel} - n_{air}} = H_L + H + \overline{CS_2},$$

where the length of $\overline{CS_2}$ may be determined by:

$$\frac{H_F}{n_{semi}} = \frac{\overline{CS_2}}{n_{diel}} \Rightarrow \overline{CS_2} = H_F \frac{n_{diel}}{n_{semi}} = R\frac{n_{diel}}{n_{diel}-n_{air}} - H_L - H,$$

where $H_F$ is the distance from the effective focal point Si to the top surface of vertical mesa structure 3130. Thus, the focal length of micro-lens 3110 in dielectric layer 3120 may be:

$$F = H_L + H + H_F \frac{n_{diel}}{n_{semi}}.$$

For micro-LEDs with vertical sidewalls or inward tilted sidewalls, the effective focal point Si may be located close to the interface between p-contact 3140 and the semiconductor material (e.g., p-type layer) in order to achieve a high light extraction efficiency and a more collimated beam. For example, the ratio between $H_F$ and D may be between about 0.8 and about 1.25.

For micro-LEDs having outward tilted sidewalls, such as parabolic or conic sidewalls, because the light emitted from the micro-LED to the dielectric layer may have been partially collimated, the position of the effective focal point may be away from the interface between the semiconductor materials and the dielectric layer (and the interface between p-contact 3140 and the semiconductor material) in order to achieve a high light extraction efficiency and a more collimated beam. For example, the ratio between $H_F$ and D may be between about between 1.2 and about 4.

Figure 32C:
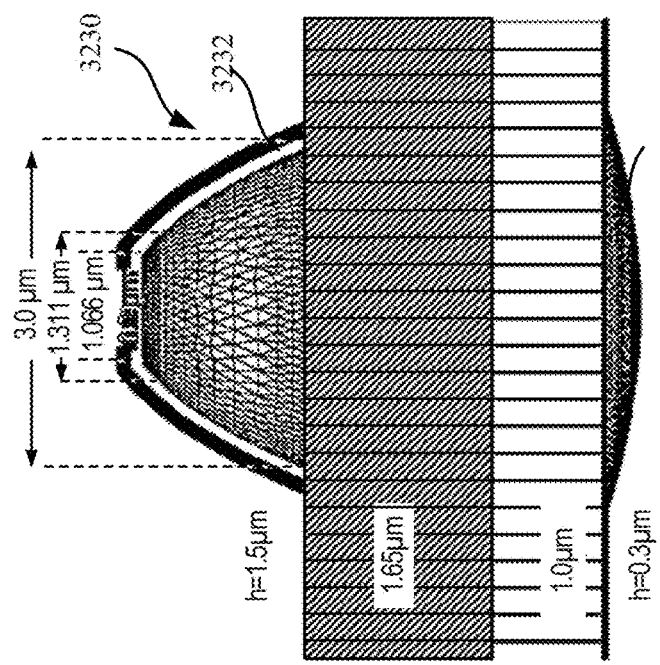
FIG. 32C illustrates an example of a blue micro-LED with a parabolic mesa structure and a micro-lens according to certain embodiments.
Figure 32D:
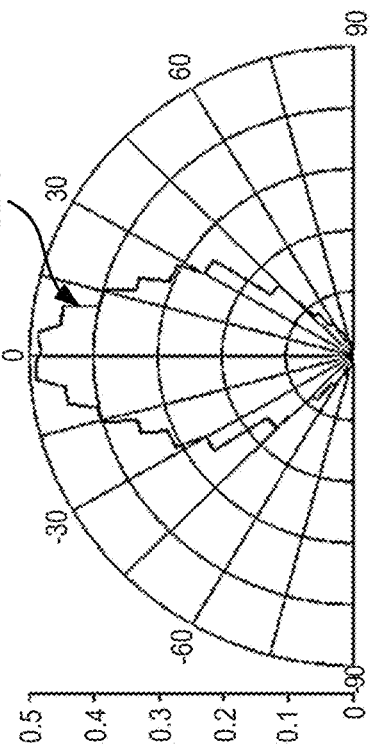
FIG. 32D illustrates a simulated beam profile of light extracted from the blue micro-LED with the parabolic mesa structure and the micro-lens according to certain embodiments.
Figure 32A:
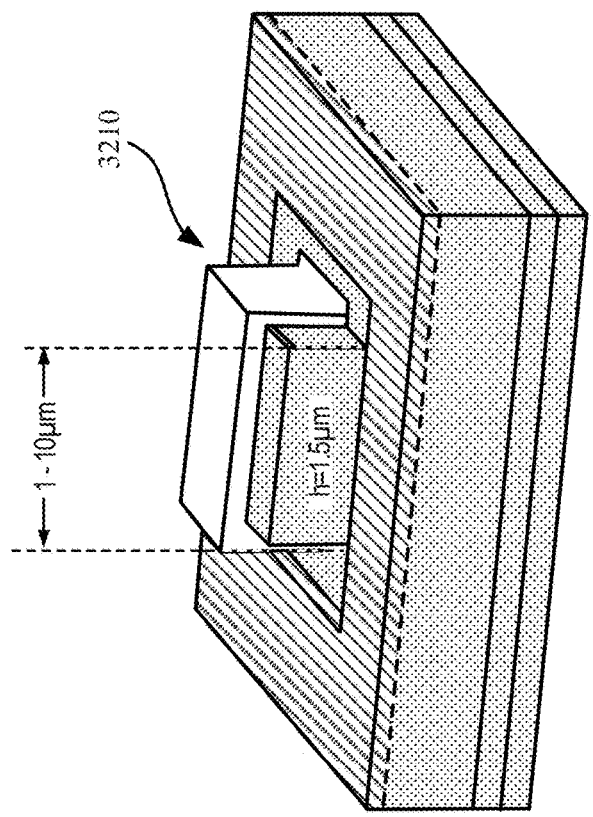
FIG. 32A illustrates an example of a blue micro-LED with a vertical mesa structure according to certain embodiments.

FIG. 32A illustrates an example of a blue micro-LED 3210 with a vertical mesa structure according to certain embodiments. In the example shown in FIG. 32A, blue micro-LED 3210 may have a linear dimension about 8.5 μm and may not include a micro-lens or an anti-reflection coating layer.

Figure 32B:
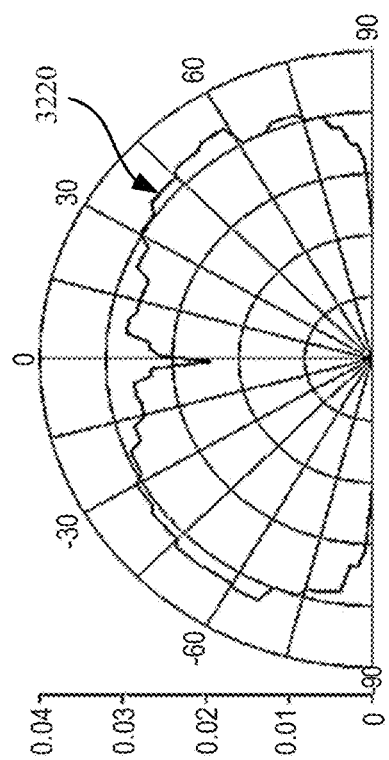
FIG. 32B illustrates a simulated beam profile of light extracted from the blue micro-LED with the vertical mesa structure according to certain embodiments.

FIG. 32B illustrates a simulated beam profile 3220 of light emitted from blue micro-LED 3210 with the vertical mesa structure according to certain embodiments. The light extraction efficiency of blue micro-LED 3210 may be about 21% within the ±90° acceptance angle range, or about 0.22% within the ±10° acceptance angle range.

FIG. 32C illustrates an example of a blue micro-LED 3230 with a parabolic mesa structure 3232 and a micro-lens 3234 according to certain embodiments. In the example shown in FIG. 32C, mesa structure 3232 may have a bottom diameter about 3 μm, and micro-lens 3234 may have a height about 0.3 μm with a focal plane at the quantum well of blue micro-LED 3230.

FIG. 32D illustrates a simulated beam profile 3240 of light emitted from blue micro-LED 3230 with parabolic mesa structure 3232 and micro-lens 3234 according to certain embodiments. The light extraction efficiency of blue micro-LED 3230 may be about 70% within the ±90° acceptance angle range, or about 4.5% within the ±10° acceptance angle range.

VI. Secondary Optics Fabrication

The micro-lenses described above can be etched using a polymer (e.g., photoresist) layer with a variable thickness, which may be formed by, for example, reflowing patterned polymers (e.g., photoresist) or using a gray-scale photomask and a photoresist with a linear response to exposure dosage to form the micro-lens array in the photoresist, and/or dry-etching the polymers or photoresist to transfer the pattern and shape of the micro-lens array to a dielectric material layer or a semiconductor layer). In some embodiments, the micro-lenses may be fabricated by direct E-beam etching.

Figure 33:
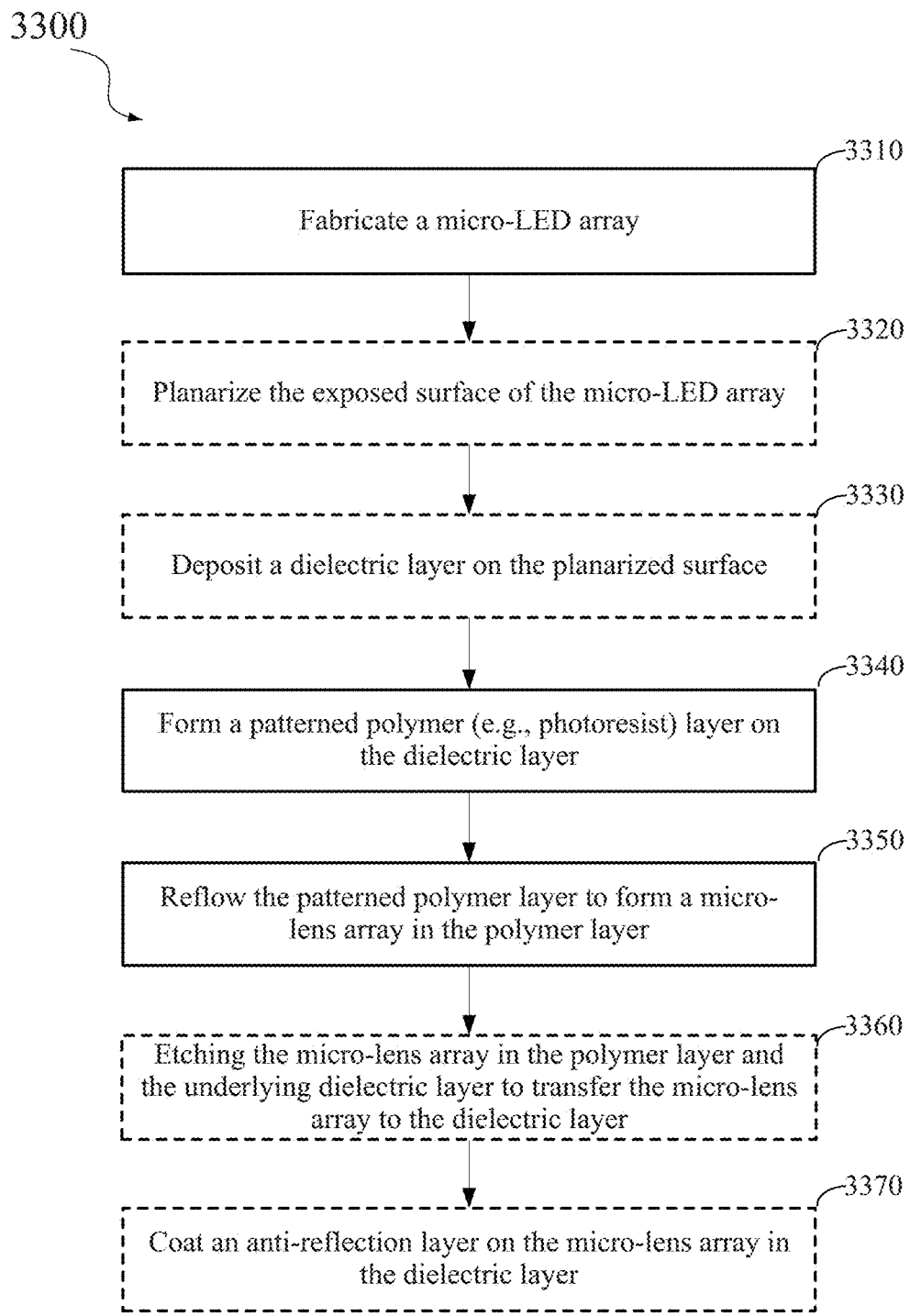
FIG. 33 is a flow chart illustrating an example of a method for fabricating an array of micro-lenses for light extraction from a micro-LED array according to certain embodiments.

FIG. 33 is a flow chart 3300 illustrating an example of a method for fabricating an array of micro-lenses for light extraction from a micro-LED array using a thermal reflow process according to certain embodiments. The operations described in flow chart 3300 are for illustration purposes only and are not intended to be limiting. In various implementations, modifications may be made to flow chart 3300 to add additional operations or to omit some operations. The operations described in flow chart 3300 may be performed by, for example, one or more semiconductor fabrication systems that include a patterning system, a deposition system, an etching system, or any combination thereof.

At block 3310, a micro-LED array may be fabricated as described above with respect to, for example, FIGS. 7A and 7B. Each micro-LED in the micro-LED array may include a heterostructure (e.g., a MQW) that includes multiple layers, such as GaN, InGaN, AlGaN, or AlInGaP layers, epitaxially grown on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO$_2$ structure. The substrate may be cut in a specific direction to expose a specific plane as the growth surface. Each micro-LED may include a mesa structure of any desired shape and a passivation layer (e.g., a SiO$_2$ layer) surrounding the mesa structure as described above. Adjacent micro-LED may be isolated by insulation materials, such as the passivation layer, resin, or the like. The linear dimension of each micro-LED may be a few microns (e.g., less than about 10 μm, such as about 1-5 μm) or a few tens of microns. The micro-lens array may also be encapsulated by a dielectric material layer.

Optionally, at block 3320, the exposed surface of the micro-LED array, such as the surface of the encapsulation layer, the substrate, or another surface through which the light emitted by the micro-LED array may be extracted, may be planarized by, for example, chemical mechanical polishing (CMP), selective etching, or other processes, to achieve a flat and smooth surface. In some embodiments, the exposed surface of the micro-LED array may be roughened.

Optionally, at block 3330, a dielectric layer, such as a SiO$_2$ or SiNx layer, may be deposited on the planarized surface of the micro-LED array by, for example, PECVD, ALD, or the like. A thickness of the dielectric layer may be higher than the desired thickness of the micro-lens array to be fabricated.

At block 3340, a patterned polymer layer may be formed on the dielectric layer. The pitch of the pattern in the patterned polymer layer may be slightly different from the pitch of the micro-LED array, such that the center of each polymer region in the patterned polymer layer may not be aligned with the center of the corresponding micro-LED in the micro-lens array. The etch rate of the polymer may be similar to or comparable to the etch rate of the dielectric layer under the patterned polymer layer. In some embodiments, the polymer layer may include a positive or negative photoresist, and the pattern in the patterned polymer (e.g., photoresist) layer may be formed by a photolithography process using a binary mask and uniform exposure light (e.g., UV light). In some embodiments, the pattern in the patterned polymer layer may be formed by a printing process where a certain volume of polymer may be deposited (e.g., dropped) at each location of a one- or two-dimensional array of locations with a certain distance between adjacent locations.

At block 3350, the patterned polymer layer may go through a reflow process to form a micro-lens array in the polymer material. For example, the patterned polymer layer may be heated from the top or bottom of the micro-LED array to a temperature slight above the melting point of the patterned polymer layer, such that the polymer material may be liquefied and allowed to flow. The melted polymer material may reflow and reach an equilibrium state due to the surface tension of the liquid polymer material. At the equilibrium state, a spherical cap having a particular polymer volume may be formed. The shape of the spherical cap may depend on the contact angle of the polymer material on the surface of the dielectric layer. After reaching the equilibrium state, the polymer material may be allowed to cool down and solidify to form an array of micro-lenses including the polymer material. The array of micro-lenses formed by the polymer material may be used as the micro-lens array for extracting light from the micro-LED array, or may be used as a mask layer for etching the underlying dielectric layer.

Optionally, at block 3360, the micro-lens array in the polymer material and the underlying dielectric layer may be etched to transfer the micro-lens array to the dielectric layer. The etching may include, for example, an ion milling, a plasma-based reactive ion etching (e.g., RIE), or another dry etching process. The etch rate of the polymer material may be similar to or comparable to the etch rate of the dielectric material, in order to more linearly transfer the thickness profile of the patterned polymer layer to the substrate. For example, the etch rate of the patterned polymer layer may be between about 0.2 to about 5 times of the etch rate of the dielectric layer, between about 0.3 to about 3 times of the etch rate of the dielectric layer, between about 0.5 to about 2 times of the etch rate of the dielectric layer, between about 0.7 to about 1.5 times of the etch rate of the dielectric layer, between about 0.8 to about 1.2 times of the etch rate of the dielectric layer, and the like.

In some embodiments, the dielectric layer with the micro-lens array may be used as an etch mask to transfer the micro-lens array into a semiconductor layer, such as an n-type semiconductor layer. The etch rate of the dielectric material may be similar to or comparable to the etch rate of the semiconductor material, in order to more linearly transfer the thickness profile of the micro-lens array in the dielectric layer into the semiconductor layer. For example, the etch rate of the dielectric layer may be between about 0.2 to about 5 times of the etch rate of the semiconductor layer, such about 0.5 times of the etch rate of the semiconductor layer.

Optionally, at block 3370, an anti-reflection layer may be coated on the micro-lens array in the dielectric layer or the semiconductor layer. The anti-reflection layer may include one or more dielectric layers (e.g., thin films) that have certain refractive indices and/or thicknesses, such that the reflections at different interfaces of the one or more dielectric layers may destructively interfere to reduce the reflection. For example, the dielectric layers may include tantalum pentoxide ($Ta_2O_5$) and aluminum oxide ($Al_2O_3$) in alternating thin layers. The one or more dielectric layers may be deposited on the surface of the micro-lens array by, for example, evaporative deposition, ion assisted deposition, plasma sputtering, ion beam sputtering, ALD, or the like.

FIG. 34A illustrates an example of a method for fabricating a micro-lens array for light extraction from a micro-LED array or fabricating mesa structures of the micro-LED array according to certain embodiments. The surface of an array of micro-LEDs 3410 may be planarized by, for example, CMP, selective etching, or the like. A dielectric layer 3420 (e.g., a polymer, a silicon dioxide, or a silicon nitride layer) may be deposited on the planarized surface of the array of micro-LEDs 3410 by, for example, PECVD, ALD, or the like. Dielectric layer 3420 may be used to form a micro-lens or may be used as a mask layer for etching a micro-lens or mesa structure in III-V semiconductor layers of the array of micro-LEDs 3410. A photoresist layer 3430 may be deposited on dielectric layer 3420 by, for example, spin coating, spraying coating, physical vapor deposition, chemical vapor deposition, atomic layer deposition, or the like. Photoresist layer 3430 may include a positive or negative photoresist material and may be patterned by exposure to light (e.g., UV light) through a mask and development to remove exposed or unexposed portions. The photoresist material in photoresist layer 3430 may be etched by the same etching process that etches the underlying dielectric layer 3420, and may have an etch rate similar or comparable to the etch rate of dielectric layer 3420 (e.g., $SiO_2$ or $Si_3N_4$) using the same etching process.

The remaining portions of photoresist layer 3430 may go through a thermal reflow process. For example, the remaining portions of photoresist layer 3430 may be heated from the top or bottom of the array of micro-LEDs 3410 to a temperature slight above the melting point of photoresist layer 3430, such that the photoresist may be liquefied. The melted photoresist material may reflow and reach an equilibrium state governed by the surface tension of the liquid photoresist material. The shape of the spherical cap formed at the equilibrium state for a particular photoresist volume may depend on the contact angle of the photoresist material on the surface of dielectric layer 3420. After reaching the equilibrium state, the photoresist material may be allowed to cool down and solidify to form an array of micro-lenses in photoresist layer 3430. The array of micro-lenses may be used as the micro-lenses for extracting light from the array of micro-LEDs 3410, or may be used as a mask layer for etching the underlying dielectric layer 3420.

In some embodiments, the array of micro-lenses in photoresist layer 3430 may be formed by photolithography using a gray-scale mask. A gray-scale mask may include a light transmissivity pattern, where certain regions of the gray-scale mask may have higher transmissivity than other regions and the transmissivity may vary gradually from the high transmissivity regions to the low transmissivity regions. The light transmissivity profile of the gray-scale mask may be complementary to the height profile or optical length profile of an array of micro-lenses. Exposure light may have a uniform intensity. Thus, after the exposure, the exposed portions of photoresist layer 3430 may have a depth profile corresponding to the light transmissivity profile of the gray-scale mask, and thus may be complementary to the height profile or optical length profile of an array of micro-lenses. The exposed portions of photoresist layer 3430 may change the chemical structure (e.g., decompose to smaller molecules) so that it may become more soluble in the developer and can be removed by a development process.

Photoresist layer 3430 with the array of micro-lenses and the underlying dielectric layer 3420 may be etched to linearly or nonlinearly transfer the thickness profile of the array of micro-lenses into dielectric layer 3420, depending on the relative etch rates of the photoresist material and the dielectric material, to form an array of micro-lenses in dielectric layer 3420. The etching may include, for example, a wet etching, an ion milling, a plasma based reactive ion etching, or any combinations thereof. The wet etching may include a chemical etching using a combination of acids, bases, and solvents at a range of temperatures and concentrations. The ion milling may include a physical removal of a portion of the patterned photoresist layer and the underlying dielectric layer at an extremely low pressure and using a high accelerating potential such that electrons may be accelerated to impact gas atoms with enough energy to ionize the gas atoms. The plasma based reactive ion etching (ME) may use a chemically reactive plasma at a low pressure and an electromagnetic field to remove portions of the patterned photoresist layer and the underlying dielectric layer. In any of these etching techniques, the etch rate of the photoresist material may be similar or comparable to the etch rate of the dielectric material to transfer the thickness profile of the patterned photoresist layer to the substrate. For example, the etch rate of the patterned photoresist layer 3430 may be between about 0.2 to about 5 times of the etch rate of dielectric layer 3420, between about 0.3 to about 3 times of the etch rate of dielectric layer 3420, between about 0.5 to about 2 times of the etch rate of dielectric layer 3420, between about 0.7 to about 1.5 times of the etch rate of dielectric layer 3420, between about 0.8 to about 1.2 times of the etch rate of dielectric layer 3420, and the like.

The array of micro-lenses in dielectric layer 3420 may be used as the micro-lenses to extract and/or collimate light from the array of micro-LEDs 3410 or may be used as an etch mask for etching micro-lenses or mesa structures 3440 in the III-V semiconductor layers of the array of micro-LEDs 3410. The etch rate of the dielectric material may be similar or comparable to the etch rate of the III-V semiconductor materials to transfer the thickness profile of dielectric layer 3420 to the III-V semiconductor materials. For example, the etch rate of dielectric layer 3420 may be between about 0.2 to about 5 times of the etch rate of the III-V semiconductor materials.

FIG. 34B illustrates examples of height profiles of a photoresist layer, a dielectric layer, and a semiconductor layer at different stages of the fabrication of the micro-lens array according to certain embodiments. A curve 3432 illustrates the height profile of a region of the photoresist layer (e.g., photoresist layer 3430) after patterning and thermal reflow. A curve 3422 illustrates the height profile of a region of the dielectric layer (e.g., dielectric layer 3420) after etching using the photoresist layer as the etch mask. In the example shown in FIG. 34B, the etch rate of the photoresist layer may be similar to the etch rate of the dielectric layer, and thus curve 3422 may be similar to curve 3432. A curve 3412 illustrates the height profile of a region of the semiconductor layer (e.g., III-V semiconductor materials in array of micro-LEDs 3410) after etching using the dielectric layer as the etch mask. In the example shown in FIG. 34B, the etch rate of the semiconductor layer may be about two times of the etch rate of dielectric layer 3420, and thus the height of curve 3412 may be about two times of the height of curve 3422.

FIGS. 34C-34E illustrate examples of mesas or lenses fabricated using the method described with respect to FIG. 34A. For example, FIG. 34C is a scanning electron microscope (SEM) image of an etched mesa structure 3450 that may have a parabolic shape and a flat top. Mesa structure 3450 may have a bottom diameter about 5 μm and a height of about 1.5 μm, and may be etched using an etch mask that includes structures with a height of about 0.75 μm. FIG. 34D is an SEM image of an etched structure 3460 that may have a parabolic shape and a flat top. Structure 3460 may have a bottom diameter about 2 μm and a height of about 1.4 μm, and may be etched using an etch mask that includes structures with a height of about 0.7 μm. FIG. 34E is an SEM image of an etched structure 3470 that may have a parabolic shape. Structure 3460 may have a bottom diameter about 1 μm and a height of about 1.2 μm, and may be etched using an etch mask that includes structures with a height of about 0.6 μm.

Figures 35A, 35B:
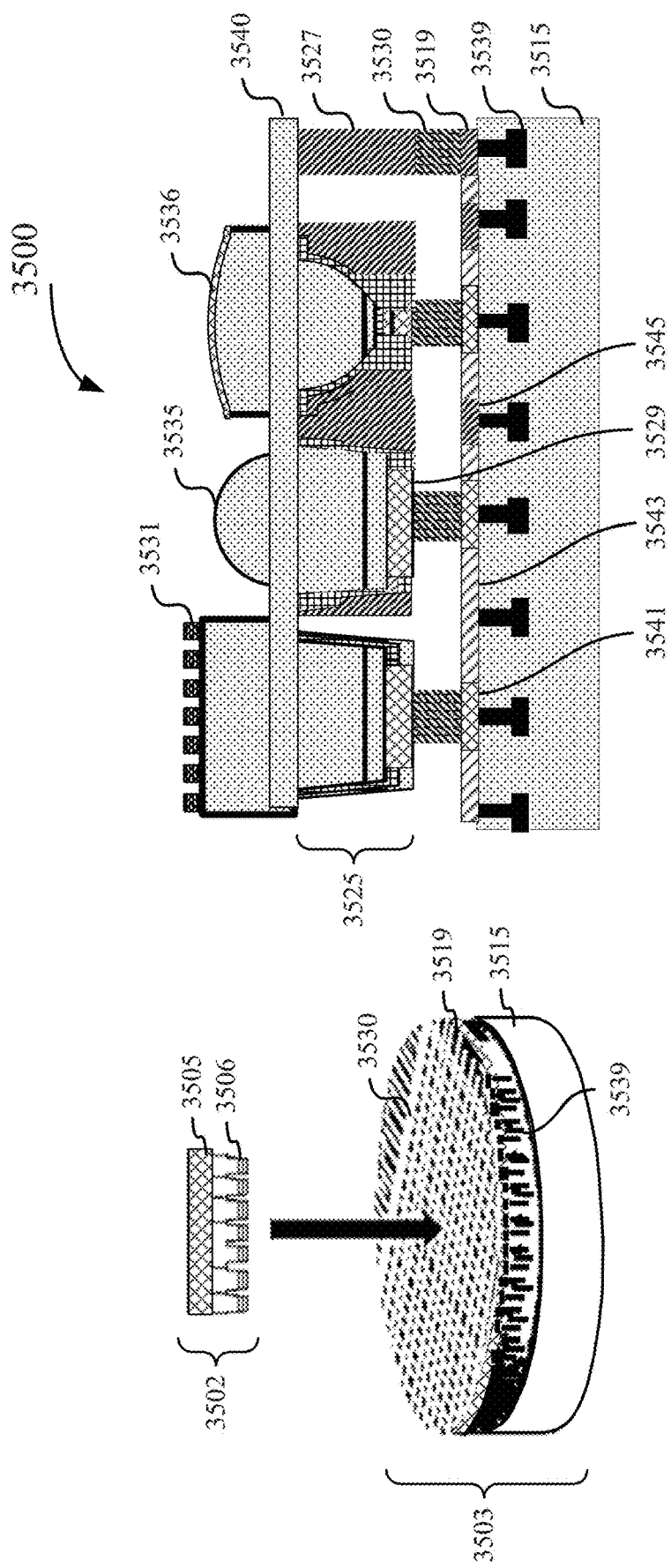
FIG. 35A illustrates an example of a method of die-to-wafer bonding for fabricating arrays of LEDs according to certain embodiments.
FIG. 35B illustrates an example of an LED array that may be formed by die-to-wafer bonding according to certain embodiments.

FIG. 35A illustrates an example of a method of die-to-wafer bonding to fabricate an array of LEDs according to certain embodiments. An LED array 3502 that includes a plurality of LEDs 3506 may be fabricated on a carrier substrate 3505, for example, by processing an LED chip or die, including the formation of mesa structures for LEDs 3506, before being bonded to a wafer 3503 that includes various circuits, such as driver circuits. The LED chip may be processed from, for example, the p-side of the LED chip.

Wafer 3503 may include a base layer 3515, passive or active integrated circuits 3539, and a bonding layer 3519. Base layer 3515 may include, for example, a Si wafer. Integrated circuits 3539 may include a plurality of driver circuits. For example, each driver circuit may include a 2T1C pixel structure that has two transistors and one capacitor. Bonding layer 3519 may include various materials, such as a metal, an oxide, a dielectric, a metal alloy, and the like. A patterned layer 3530 may be formed on a surface of bonding layer 3519. Patterned layer 3530 may include a metallic grid made of a material, such as Cu, Ag, Pt, Au, Al, Ti, or any combination thereof.

LED array 3502 may be bonded to wafer 3503 via patterned layer 3530. Patterned layer 3530 may include metal bumps made of various materials, such as CuSn, AuSn, or nanoporous Au, that may be used to align LEDs 3506 of LED array 3502 with corresponding driver circuits of wafer 3503. LED array 3502 may be brought toward wafer 3503 until LEDs 3506 come into contact with respective metal bumps corresponding to integrated circuits 3539. Some or all of LEDs 3506 may be aligned with integrated circuits 3539, and then bonded to wafer 3503 via patterned layer 3530 by various bonding techniques, such as metal-to-metal bonding. After LEDs 3506 have been bonded to wafer 3503, carrier substrate 3505 may be removed from LEDs 3506. Optical components corresponding to LEDs 3506 may then be formed from, for example, the n-side of the LED chip.

FIG. 35B illustrates an example of an LED array 3500 that may be formed by die-to-wafer bonding according to certain embodiments. In the example shown in FIG. 35B, three LEDs 3525 are shown as bonded to wafer 3503 via patterned layer 3530. Each LED 3525 includes a p-contact 3529 that is in electrical contact with a metal pad 3541 via patterned layer 3530. P-contact 3529 and metal pad 3541 may include various materials, such as Cu or another metal. Further, an n-contact 3527 between adjacent LEDs 3525 may be in electrical contact with a metal pad 3545. N-contact 3527 and metal pad 3545 may include various materials, such as Cu or another metal. A thin film 3543 may be provided within bonding layer 3519. Thin film 3543 may include various materials, such as SiCN. Metal pad 3541, thin film 3543, and metal pad 3545 may constitute bonding layer 3519. A common n-contact layer and current spreading layer 3540 may be provided to connect LEDs 3525.

As described above, various optical components may be formed to correspond to LEDs 3525. For example, the optical components may include a grating 3531, a first lens 3535, and a second lens 3536. The optical components may be formed on the n-side of LEDs 3525. Three different secondary optical components are illustrated in FIG. 35B to show some examples of secondary optical components that can be formed on LEDs 3525, which does not necessary imply that different secondary optical components are used simultaneously for every LED array. In some embodiments, an LED may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like.

Figures 36A, 36B:
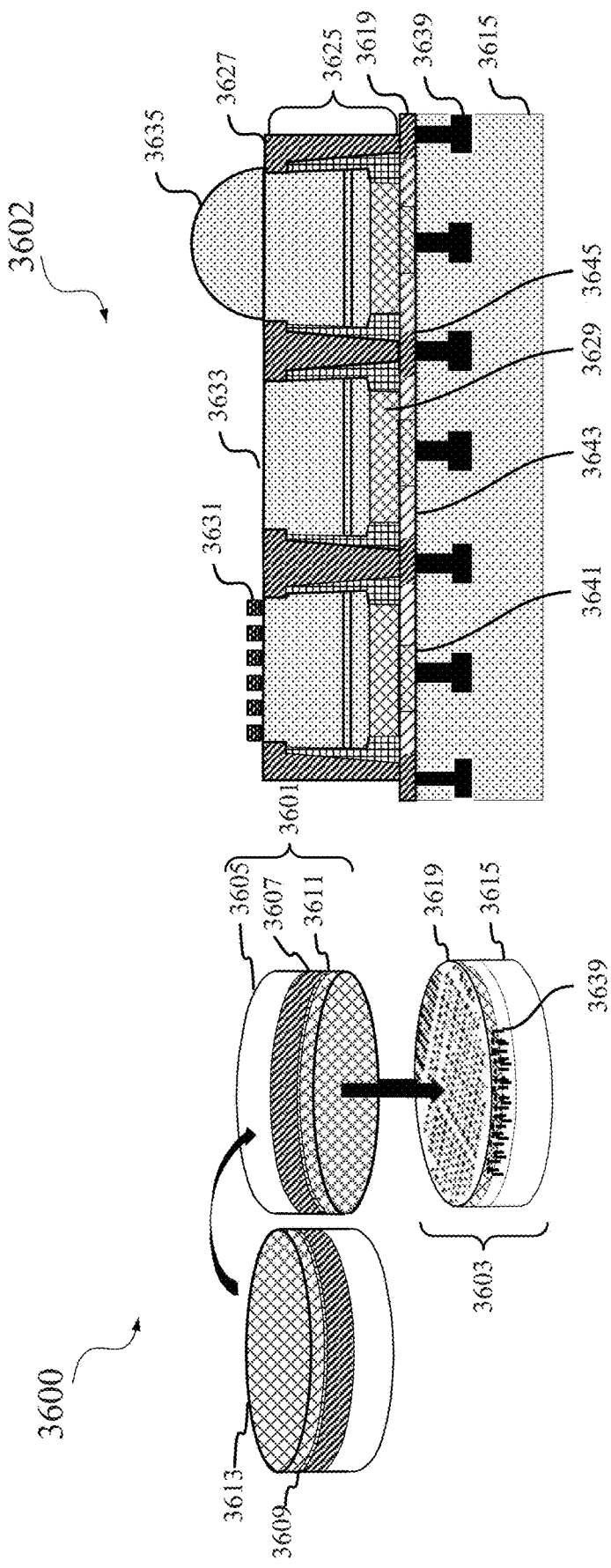
FIG. 36A illustrates an example of a method of wafer-to-wafer bonding for arrays of LEDs according to certain embodiments.
FIG. 36B illustrates an example of an LED array that may be formed by wafer-to-wafer bonding according to certain embodiments.

FIG. 36A illustrates an example of a method of wafer-to-wafer bonding for fabricating arrays of LEDs according to certain embodiments. As shown in FIG. 36A, a first wafer 3601 may include a substrate 3605, a semiconductor layer 3607, active layers 3609, a semiconductor layer 3611, and a bonding layer 3613. Substrate 3605 may include various materials, such as GaAs, InP, GaN, AlN, sapphire, SiC, or Si. Semiconductor layer 3607 and semiconductor layer 3611 may include various materials, such as (AlGaIn)P, (AlGaIn)AsP, (AlGaIn)AsN, (Eu:InGa)N, or (AlGaIn)N. Semiconductor layer 3607 may be an n-type layer and semiconductor layer 3611 may be a p-type layer. For example, semiconductor layer 3607 may be n-doped (e.g., with Si or Ge) and semiconductor layer 3611 may be p-doped (e.g., with Mg, Ca, Zn, or Be). Active layers 3609 may include one or more InGaN layers, one or more AlInGaP layers, and/or one or more GaN layers, which may form one or more heterostructures, such as one or more quantum wells or MQWs. Bonding layer 3613 may include various materials, such as a metal, an oxide, a dielectric, CuSn, and/or AuTi. For example, bonding layer 3613 may include p-contacts (not shown). Other layers may also be included, such as a buffer layer between substrate 3605 and semiconductor layer 3607. The buffer layer may include various materials, such as polycrystalline GaN or AlN. In addition, a contact layer may be between semiconductor layer 3611 and bonding layer 3613. The contact layer may include any suitable material for providing an electrical contact to semiconductor layer 3611.

A second wafer 3603 may include a base layer 3615 having a passive or an active matrix integrated circuit that is adjacent to a bonding layer 3619. Base layer 3615 may include, for example, a Si substrate. Second wafer 3603 may be an Application-Specific Integrated Circuit (ASIC) wafer having a plurality of driver circuits 3639. For example, each driver circuit 3639 may include a 2T1C pixel structure that has two transistors and one capacitor. Bonding layer 3619 may include various materials, such as a metal, an oxide, a dielectric, CuSn, and/or AuTi.

First wafer 3601 may be bonded to second wafer 3603 via bonding layer 3613 and/or bonding layer 3619. Bonding layer 3613 and bonding layer 3619 may be made of the same material or different materials. Bonding layer 3613 and bonding layer 3619 may be substantially flat. First wafer 3601 may be bonded to second wafer 3603 by various methods, such as metal-to-metal bonding, eutectic bonding, metal oxide bonding, anodic bonding, thermocompression bonding, ultraviolet (UV) bonding, plasma-activated surface bonding, and/or fusion bonding.

As shown in FIG. 36A, first wafer 3601 may be bonded to second wafer 3603 with the p-side (e.g., semiconductor layer 3611) of first wafer 3601 facing down (i.e., toward second wafer 3603). After bonding, substrate 3605 may be at least partially removed from first wafer 3601, and first wafer 3601 may then be processed from the n-side (e.g., semiconductor layer 3607). The processing may include the formation of mesa structures for individual LEDs, as well as the formation of optical components (e.g., micro-lenses) corresponding to the individual LEDs.

FIG. 36B illustrates an example of an LED array 3602 that may be formed by wafer-to-wafer bonding according to certain embodiments. In the example shown in FIG. 36B, three LEDs 3625 are shown as bonded to second wafer 3603 via bonding layer 3619. Each LED 3625 may include a p-contact 3629 that is in electrical contact with a metal pad 3641. P-contact 3629 and metal pad 3641 may include various materials, such as Cu, Ag, Pt, Au, etc. Further, an n-contact 3627 between adjacent LEDs 3625 may be in electrical contact with a metal pad 3645. N-contact 3627 and metal pad 3645 may include various materials, such as Cu. A thin film 3643 may be provided between each pair of adjacent metal pads 3641 and 3645. Thin film 3643 may include various materials, such as SiCN. Metal pad 3641, thin film 3643, and metal pad 3645 may constitute bonding layer 3619.

Various optical components may be formed to correspond to LEDs 3625. For example, the optical components may include a grating 3631, an antireflection (AR) coating 3633, and/or a lens 3635. The optical components may be formed on the n-side (e.g., semiconductor layer 3607 or a dielectric material deposited on semiconductor layer 3607) of LEDs 3625. Three different secondary optical components are illustrated in FIG. 36B to show some examples of secondary optical components that can be formed on LEDs 3625, which does not necessary imply that different secondary optical components are used simultaneously for every LED array. In some embodiments, an LED may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like.

Figure 37B:
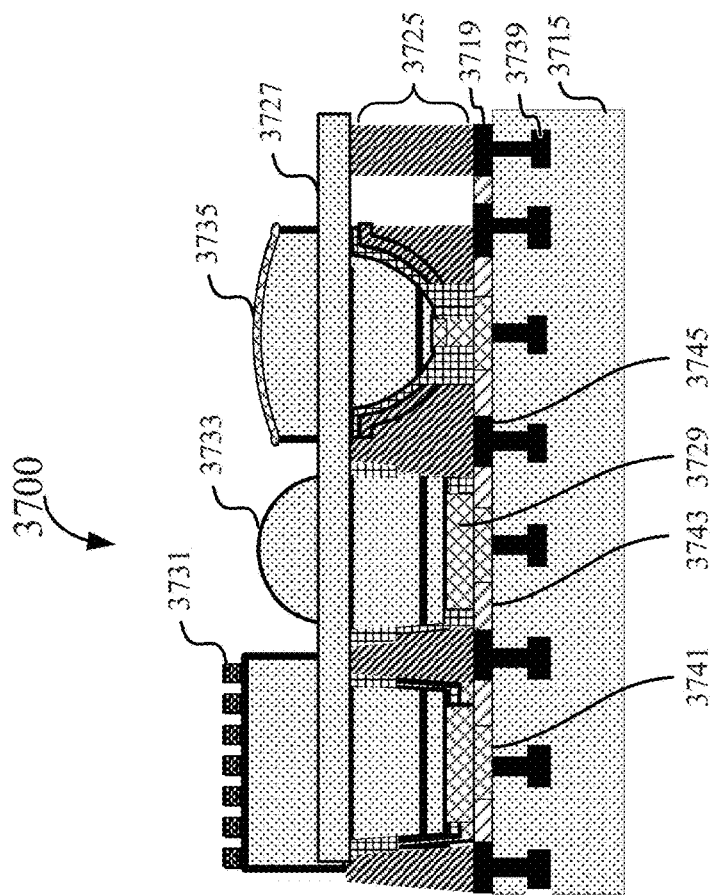
FIG. 37B illustrates an example of an LED array that may be formed by hybrid bonding according to certain embodiments.
Figure 37A:
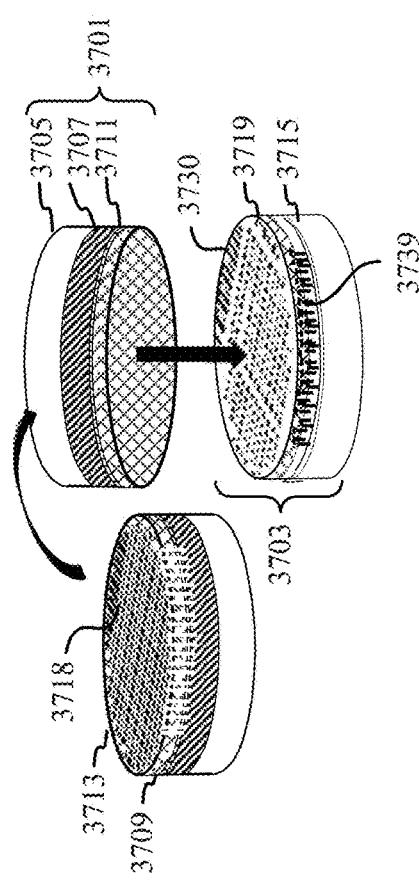
FIG. 37A illustrates an example of a method of hybrid bonding for fabricating arrays of LEDs according to certain embodiments.

FIG. 37A illustrates an example of a method of hybrid bonding for fabricating arrays of LEDs according to certain embodiments. A first wafer 3701 may include a substrate 3705, a semiconductor layer 3707, active layers 3709, a semiconductor layer 3711, and a bonding layer 3713. Substrate 3705 may include various materials, such as GaAs, InP, GaN, AlN, sapphire, SiC, or Si. Semiconductor layer 3707 and semiconductor layer 3711 may include various materials, such as (AlGaIn)P, (AlGaIn)AsP, (AlGaIn)AsN, (Eu:InGa)N, or (AlGaIn)N. Semiconductor layer 3707 may be an n-type layer and semiconductor layer 3711 may be a p-type layer. For example, semiconductor layer 3707 may be n-doped (e.g., with Si or Ge) and semiconductor layer 3711 may be p-doped (e.g., with Mg, Ca, Zn, or Be). Active layers 3709 may include one or more InGaN layers, one or more AlInGaP layers, and/or one or more GaN layers, which may form one or more heterostructures, such as one or more quantum wells or MQWs. Bonding layer 3713 may include various materials, such as a metal, an oxide, a dielectric, CuSn, and/or AuTi. For example, bonding layer 3713 may include p-contacts (not shown in FIG. 37A). A patterned layer 3718 may be formed on a surface of bonding layer 3713. Patterned layer 3718 may include a metallic grid made of a material, such as Cu, Ag, Au, or Al.

First wafer 3701 may be processed from the p-side to form mesa structures corresponding to individual LEDs before bonding layer 3713 and patterned layer 3730 are formed on the mesa structures. In addition, a reflector layer may be formed on each of the mesa structures from the p-side as described above. Various methods to reduce surface recombination loss may also be performed from the p-side, such as quantum well intermixing, ion implantation, defect etching, and surface cleaning.

A second wafer 3703 may include a base layer 3715 having a passive or an active matrix integrated circuit that is adjacent to a bonding layer 3719. Base layer 3715 may include Si, and may be an ASIC wafer having a plurality of driver circuits 3739. For example, each driver circuit 3739 may include a 2T1C pixel structure that has two transistors and one capacitor. Bonding layer 3719 may include various materials, such as a metal, an oxide, a dielectric, CuSn, and/or AuTi. A patterned layer 3730 may be formed on a surface of bonding layer 3719. Patterned layer 3730 may include a metallic grid made of a material, such as Cu, Ag, Au, Pt, Ti, Al, or any combination thereof.

First wafer 3701 may be bonded to second wafer 3703 via bonding layer 3713, patterned layer 3718, bonding layer 3719, and patterned layer 3730. As shown in FIG. 37A, first wafer 3701 is bonded to second wafer 3703 with the p-side of first wafer 3701 facing down (i.e., toward second wafer 3703). First wafer 3701 and second wafer 3703 may be aligned for bonding by a high-precision alignment of p-contacts 3729 within bonding layer 3713 of first wafer 3701 with metal pads 3741 within bonding layer 3719 of second wafer 3703. After first wafer 3701 and second wafer 3703 are aligned, first wafer 3701 and second wafer 3703 may be bonded by a two-step hybrid bonding method including dielectric bonding and metal bonding. For example, dielectric bonding of a dielectric material in bonding layer 3713 of first wafer 3701 may be performed using a dielectric material (e.g., thin film 3743) in bonding layer 3719 of second wafer 3703. The dielectric bonding may be performed at room temperature. Both dielectric materials may include, for example, SiCN, SiO$_2$, SiN, Al$_2$O$_3$, HfO$_2$, ZrO$_2$, Ta$_2$O$_5$ or the like. Metal bonding of p-contacts 3729 in bonding layer 3713 of first wafer 3701 may then be performed with metal pads 3741 in bonding layer 3719 of second wafer 3703. The metal bonding may be performed by annealing p-contacts 3729 and metal pads 3741 at a temperature that is higher than room temperature, such as between 150° C. and 250° C. P-contacts 3729 and metal pads 3741 may include, for example, Cu, Au, Al, W, Mo, Ag, Ni, Ti, Pt, Pd, or any combination thereof. After bonding, substrate 3705 is removed from first wafer 3701, and first wafer 3701 may be processed from the n-side. The processing may include the formation of optical components corresponding to the individual LEDs.

Because first wafer 3701 and second wafer 3703 include materials having different coefficients of thermal expansion (CTEs), the metal bonding may cause a different bow to be formed in first wafer 3701 and second wafer 3703. The different bow may cause run-out, which may occur when the centers of p-contacts 3729 become misaligned with the centers of metal pads 3741. Various methods may be used to compensate for the different CTEs, such as forming trenches between adjacent mesa structures in substrate 3705, forming trenches between groups of mesa structures in substrate 3705, forming trenches through part or all of substrate 3705, forming a CTE compensation layer on first wafer 3701 and/or second wafer 3703, forming first wafer 3701 and/or second wafer 3703 into a concave shape after performing the dielectric bonding and before performing the metal bonding, and/or performing dishing of p-contacts 3729 and/or metal pads 3741.

FIG. 37B illustrates an example of an LED array 3700 that may be formed by hybrid bonding according to certain embodiments. In the example shown in FIG. 37B, three LEDs 3725 are shown as bonded to second wafer 3703 via bonding layer 3719. Each LED 3725 includes a p-contact 3729 that is in electrical contact with a metal pad 3741. Further, an n-contact 3727 between adjacent LEDs 3725 may be in electrical contact with a metal pad 3745. N-contact 3727 and metal pad 3745 may include various materials, such as Cu or another metal. A thin film 3743 may be provided between each pair of adjacent metal pads 3741 and 3745. Thin film 3743 may include various materials, such as SiCN. Metal pad 3741, thin film 3743, and metal pad 3745 may constitute bonding layer 3719.

Various optical components may be formed to correspond to LEDs 3725. For example, the optical components may include a grating 3731, an antireflection (AR) coating 3735, and/or a lens 3733. The optical components may be formed on the n-side of LEDs 3725. Three different secondary optical components are illustrated in FIG. 37B to show some examples of secondary optical components that can be formed on LEDs 3725, which does not necessary imply that different secondary optical components are used simultaneously for every LED array. In some embodiments, an LED may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like.

Figure 38:
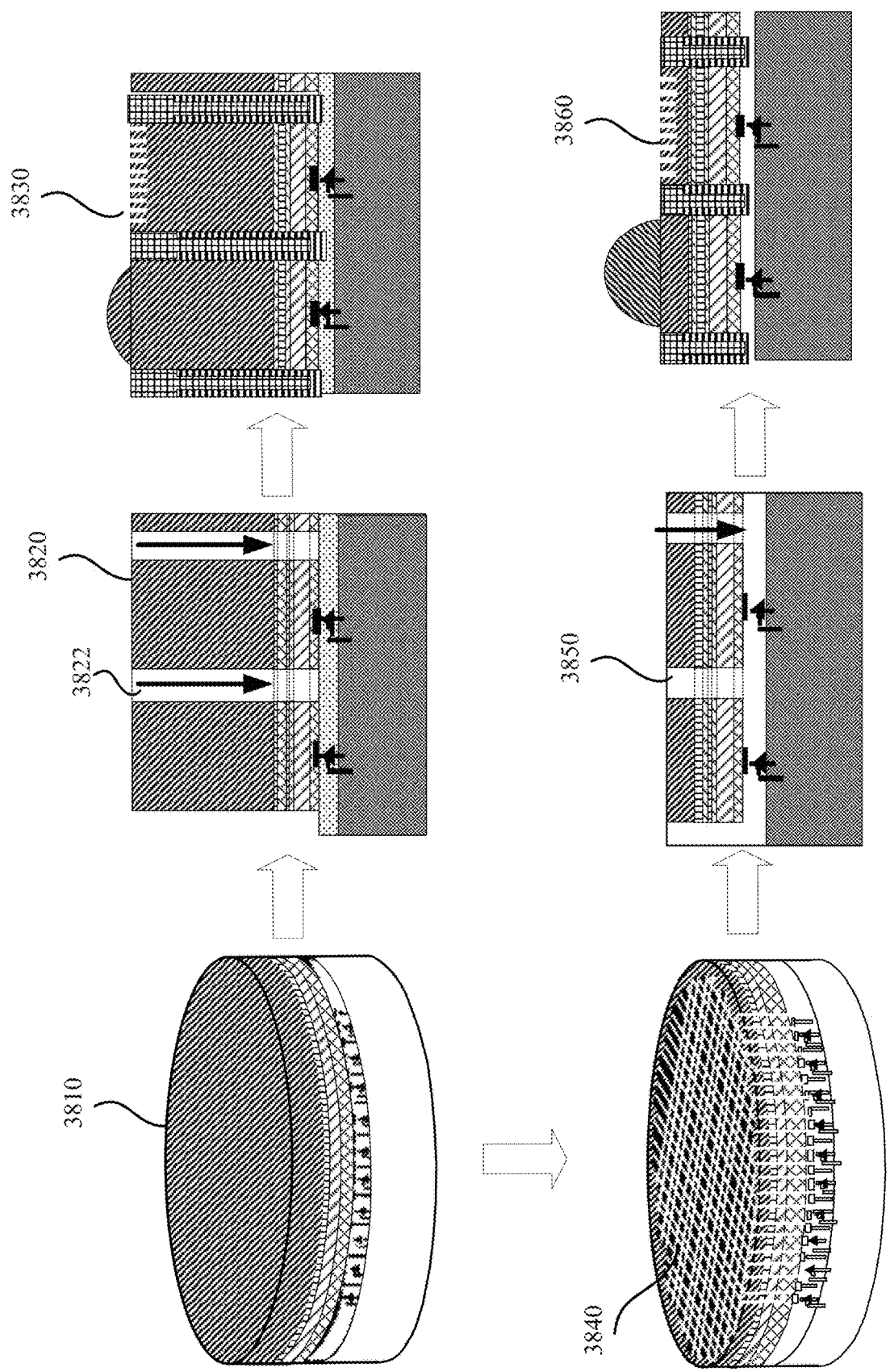
FIG. 38 illustrates an example of a method of forming an array of micro-LEDs with micro-lenses or other secondary optic components on a bonded wafer stack according to certain embodiments.

FIG. 38 illustrates an example of a method of forming an array of micro-LEDs with micro-lenses or other secondary optic components on a bonded wafer stack according to certain embodiments. The bonded wafer stack may be processed (e.g., grinding, lapping, polishing, lateral etching, etc.) to at least partially remove the substrate (e.g., substrate 3605 or 3705) adjacent to the n-type semiconductor layer. When a small pitch (e.g., <10 µm) for the array of micro-LEDs is desired, the substrate may be completely removed to expose the n-type semiconductor layer as shown by a wafer stack 3810.

For red micro-LEDs, the epitaxial layers grown on the substrate may be thick (e.g., about 2 µm to about 5 µm) in order to achieve a higher internal quantum efficiency (IQE). Wafer stack 3810 may be etched using, for example, an inductively coupled plasma (ICP) etching process that has high etch rates, high selectivity, and low damage, to etch deep trenches 3822 that separate individual micro-LEDs 3820. Each micro-LED 3820 may include a vertical mesa structure or an inward-tilted mesa structure (e.g., as shown in FIG. 18A). Various methods may be used to reduce surface recombination loss (SRL) at the sidewalls of the vertical mesa structures, such as quantum well intermixing, ion implantation, defect etching, and surface cleaning. A dielectric layer and/or a metal layer may be deposited (e.g., using ALD) on the sidewalls of micro-LEDs 3820 to form mesa reflectors and/or to reduce surface recombination loss and improve the internal quantum efficiency. Optical components 3830, such as gratings or micro-lenses, may be etched in the n-type semiconductor material layer or a layer deposited on the n-type semiconductor layer.

For green or blue micro-LEDs, CMP, horizontal photo-electrochemical (PEC) etching, vertical etching using an etch-stop layer, or the like may be used to thin the n-type semiconductor layer to a desired thickness (e.g., about 1 µm or thinner) with a high precision (e.g., ±25 nm), in order to achieve a high light extraction efficiency. The thinned wafer stack 3840 may be etched from the n-type side, for example, using ICP, to form trenches 3850. Various methods may be used to reduce surface recombination loss at the sidewalls of the vertical mesa structures, such as quantum well intermixing, ion implantation, defect etching, and surface cleaning. A dielectric layer and/or a metal layer may be deposited (e.g., using ALD) on the sidewalls of trenches 3850 to form passivation layers and mesa reflectors and/or to reduce surface recombination loss and improve the internal quantum efficiency. Optical components 3860, such as gratings or micro-lenses, may be etched in the n-type semiconductor material layer or a layer deposited on the n-type semiconductor layer as described above.

Figure 39B:
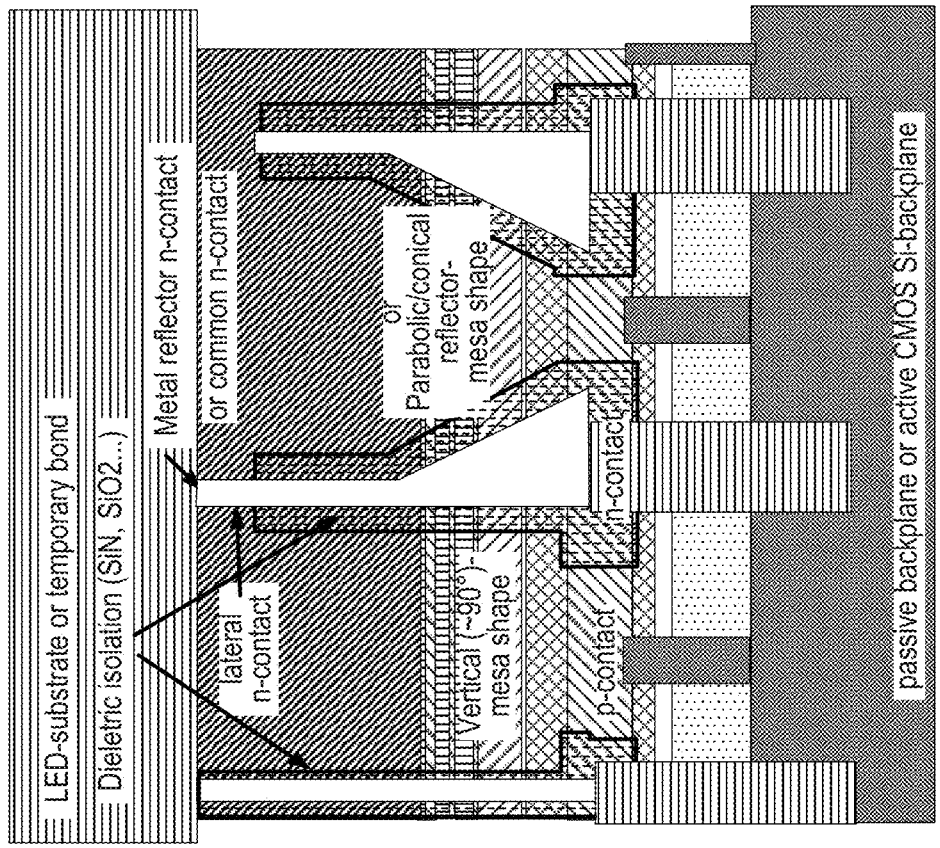
FIGS. 39A-39E illustrate an example of a method of forming micro-lenses on hybrid bonded micro-LEDs according to certain embodiments.
Figure 39A:
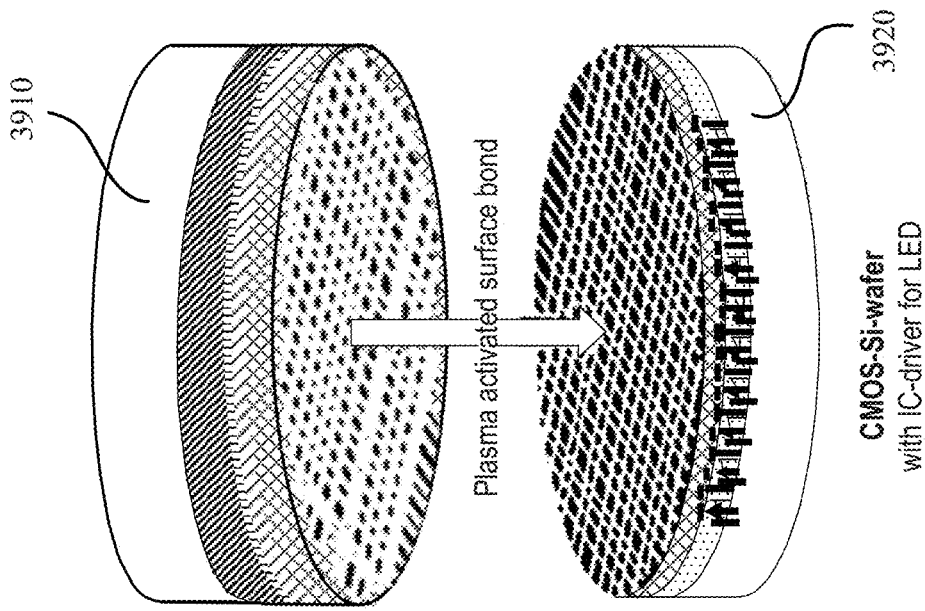

FIGS. 39A-39E illustrate an example of a method of forming micro-lenses on hybrid bonded micro-LEDs according to certain embodiments. FIG. 39A shows that a first wafer 3910 (e.g., first wafer 3801) and a second wafer 3920 (e.g., second wafer 3803) are bonded together using, for example, plasma-activated surface bonding. For example, the bonding may include copper bonding of the bonding layers on first wafer 3910 and second wafer 3920. As described above with respect to FIGS. 38A and 38B, first wafer 3910 may include an array of micro-LEDs that have vertical, parabolic, or conical mesas as shown in FIG. 39B. The mesas may include metal reflectors and may be fabricated from the p-side as described above with respect to FIG. 38A. The bonded wafer stack may be annealed at appropriate temperatures.

Figure 39D:
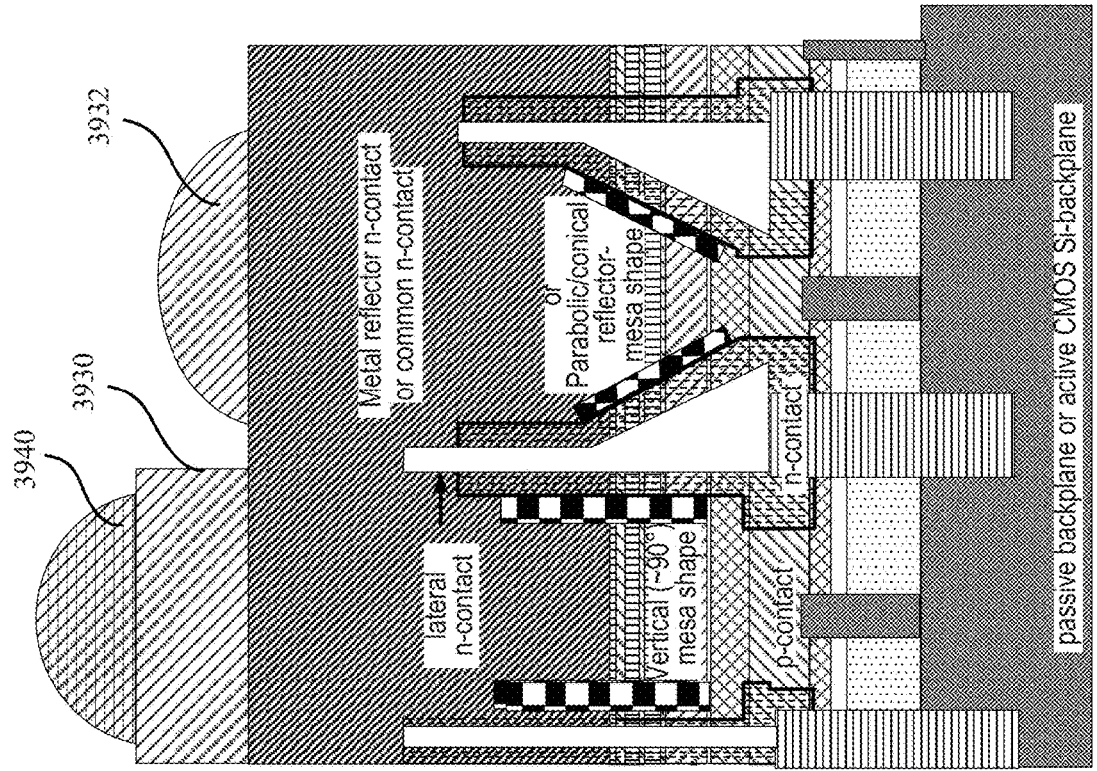
Figure 39C:
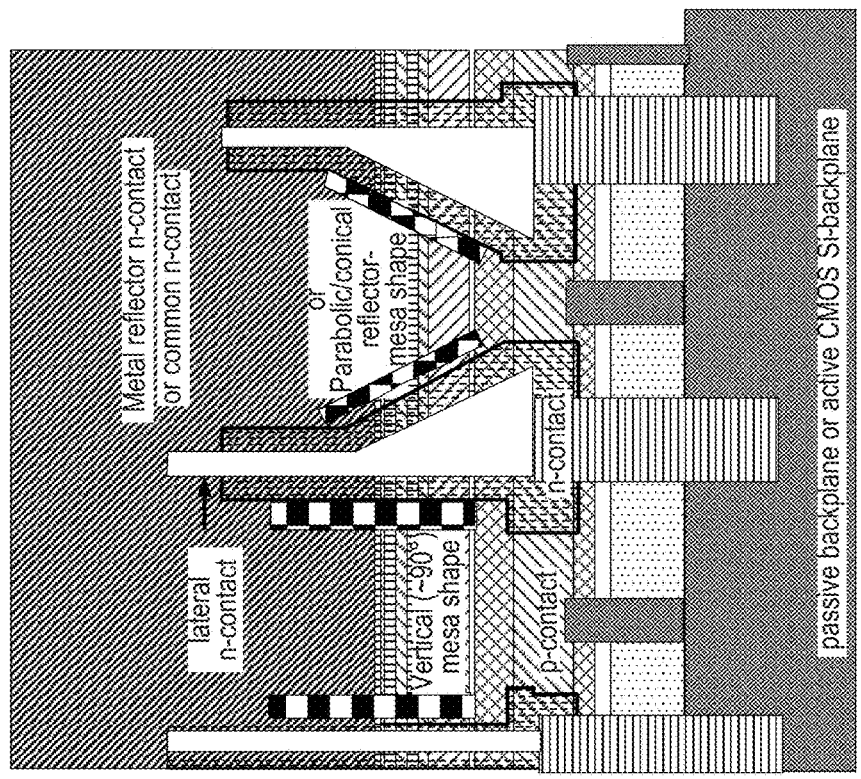

After the annealing, the substrate of first wafer 3910 may be removed to expose the epitaxially layers, such as an n-type semiconductor layer. The exposed surface of the n-type semiconductor layer may be cleaned or polished, and, in some embodiments, may be thinned by CMP, vertical etching using an etch-stop layer, horizontal PEC etching using a sacrificial structure, or the like, as shown in FIG. 39C.

A dielectric layer 3930, such as a $SiO_2$ or $SiN_x$ layer, may be deposited on the exposed surface of the n-type semiconductor layer, for example, using PECVD. A photoresist layer may be deposited on dielectric layer 3930 and may be patterned using a binary or gray-scale mask and a photolithographic process as described above with respect to, for example, FIG. 32. The patterned photoresist layer may be reflowed to form micro-lenses 3940 including the photoresist material. In some embodiments, micro-lenses 3940 may be used as the micro-lenses for the micro-LEDs. In some embodiments, an ICP etching process (e.g., F-based ICP) may be performed to transfer the shapes of the micro-lenses in the photoresist material into the mask layer to form micro-lenses 3932 in dielectric layer 3930, as shown in FIG. 39D.

Figure 39E:
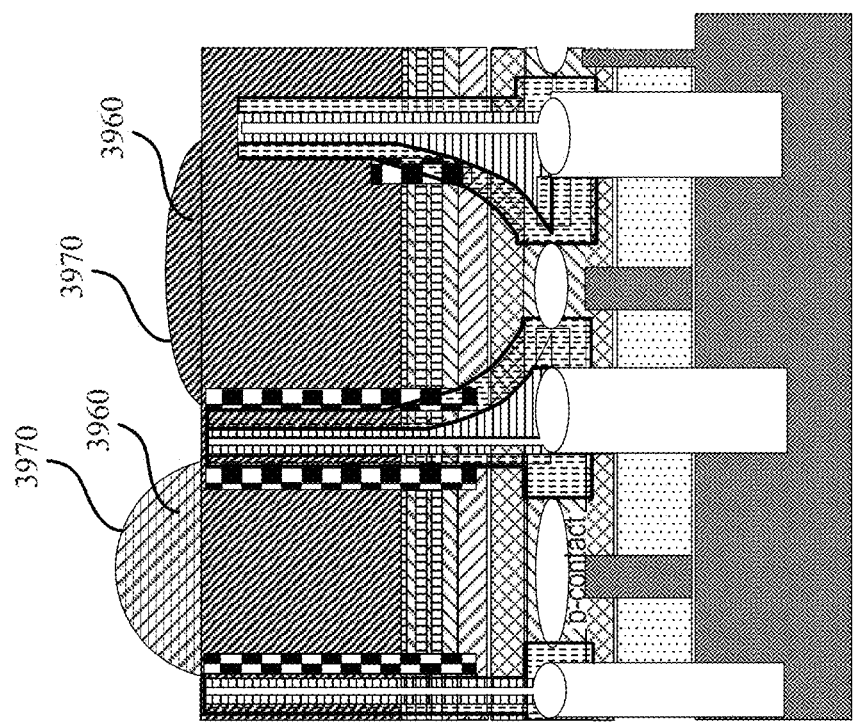

In some embodiments, micro-lenses 3932 may be used as the micro-lenses for the micro-LEDs, where an anti-reflection layer 3970 may be coated on micro-lenses 3932, as shown in FIG. 39E. In some embodiments, another ICP etching process (e.g., Cl-based ICP) may be performed to transfer the shapes of micro-lenses 3932 in dielectric layer 3930 into the n-type semiconductor layer to form micro-lenses 3960 in the n-type semiconductor layer, as shown in FIG. 39E. Anti-reflection layer 3970 may be coated on micro-lenses 3960 to reduce reflection and improve light extraction efficiency.

As described above, the shapes or height profiles of micro-lenses 3940 may be controlled by the photo-exposure and/or reflow process. The shapes or height profiles of micro-lenses 3932 and micro-lenses 3960 may be controlled by tuning the etch selectivity of the etching processes, such as the etch selectivity between the photoresist material and the dielectric material (e.g., $SiO_2$) and the etch selectivity between the dielectric material and the n-type semiconductor material. Because photoresist may not be suitable for high temperature etching, using the dielectric layer as an intermediate etch mask may allow the wafer temperature to be at about 190° C. in the ICP etching of the n-type semiconductor layer for improved etching of, for example, AlGaInP-based red epi-layers, and for tuning of ICP parameter for desired selectivity and lens shapes for different materials.

VII. Electronic System Example

Figure 40:
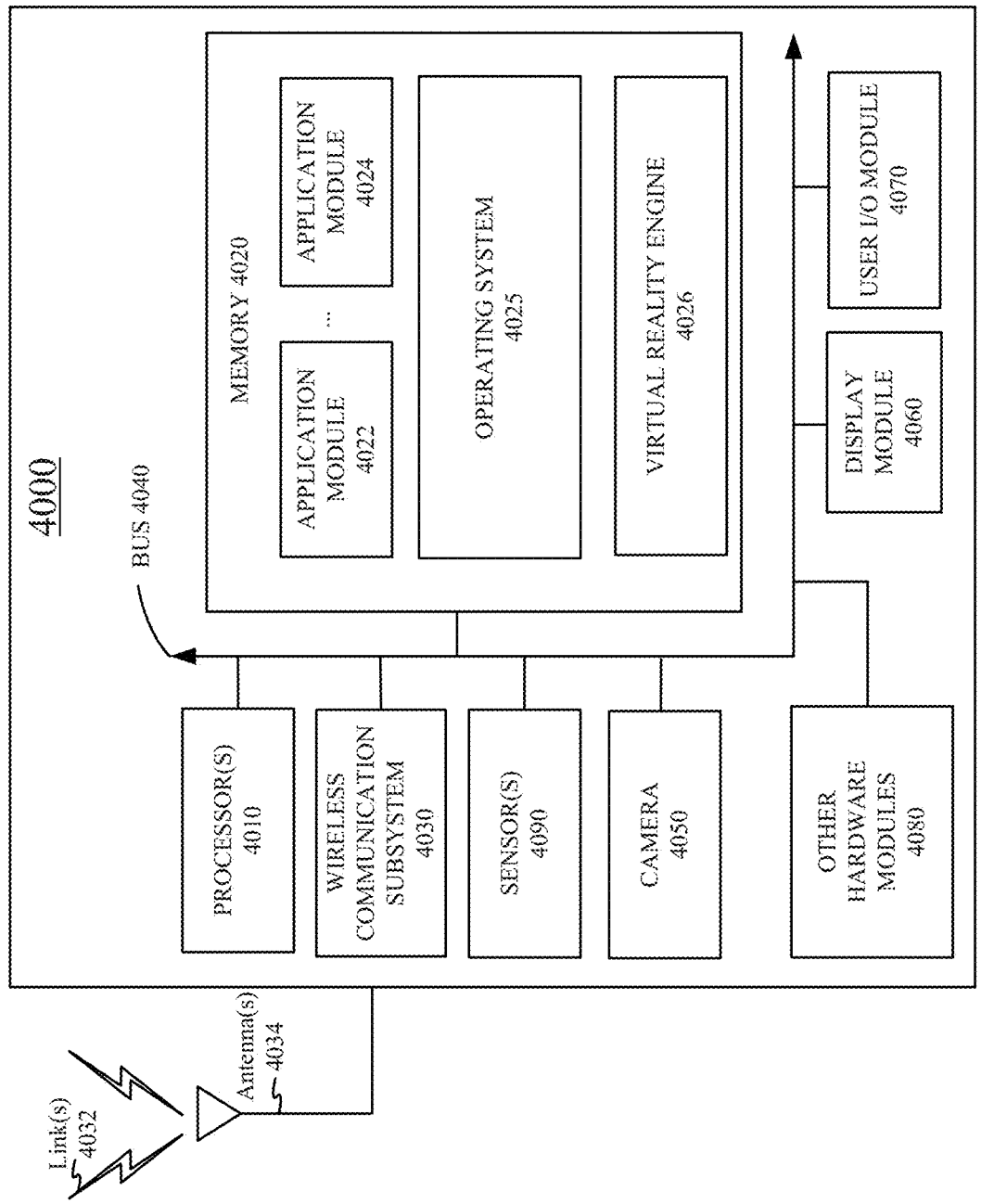
FIG. 40 is a simplified block diagram of an electronic system of an example of a near-eye display according to certain embodiments.

FIG. 40 is a simplified block diagram of an example electronic system 4000 of an example near-eye display (e.g., HMD device) for implementing some of the examples disclosed herein. Electronic system 4000 may be used as the electronic system of an HMD device or other near-eye displays described above. In this example, electronic system 4000 may include one or more processor(s) 4010 and a memory 4020. Processor(s) 4010 may be configured to execute instructions for performing operations at a number of components, and can be, for example, a general-purpose processor or microprocessor suitable for implementation within a portable electronic device. Processor(s) 4010 may be communicatively coupled with a plurality of components within electronic system 4000. To realize this communicative coupling, processor(s) 4010 may communicate with the other illustrated components across a bus 4040. Bus 4040 may be any subsystem adapted to transfer data within electronic system 4000. Bus 4040 may include a plurality of computer buses and additional circuitry to transfer data.

Memory 4020 may be coupled to processor(s) 4010. In some embodiments, memory 4020 may offer both short-term and long-term storage and may be divided into several units. Memory 4020 may be volatile, such as static random access memory (SRAM) and/or dynamic random access memory (DRAM) and/or non-volatile, such as read-only memory (ROM), flash memory, and the like. Furthermore, memory 4020 may include removable storage devices, such as secure digital (SD) cards. Memory 4020 may provide storage of computer-readable instructions, data structures, program modules, and other data for electronic system 4000. In some embodiments, memory 4020 may be distributed into different hardware modules. A set of instructions and/or code might be stored on memory 4020. The instructions might take the form of executable code that may be executable by electronic system 4000, and/or might take the form of source and/or installable code, which, upon compilation and/or installation on electronic system 4000 (e.g., using any of a variety of generally available compilers, installation programs, compression/decompression utilities, etc.), may take the form of executable code.

In some embodiments, memory 4020 may store a plurality of application modules 4022 through 4024, which may include any number of applications. Examples of applications may include gaming applications, conferencing applications, video playback applications, or other suitable applications. The applications may include a depth sensing function or eye tracking function. Application modules 4022-1824 may include particular instructions to be executed by processor(s) 4010. In some embodiments, certain applications or parts of application modules 4022-1824 may be executable by other hardware modules 4080. In certain embodiments, memory 4020 may additionally include secure memory, which may include additional security controls to prevent copying or other unauthorized access to secure information.

In some embodiments, memory 4020 may include an operating system 4025 loaded therein. Operating system 4025 may be operable to initiate the execution of the instructions provided by application modules 4022-1824 and/or manage other hardware modules 4080 as well as interfaces with a wireless communication subsystem 4030 which may include one or more wireless transceivers. Operating system 4025 may be adapted to perform other operations across the components of electronic system 4000 including threading, resource management, data storage control and other similar functionality.

Wireless communication subsystem 4030 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 4000 may include one or more antennas 4034 for wireless communication as part of wireless communication subsystem 4030 or as a separate component coupled to any portion of the system. Depending on desired functionality, wireless communication subsystem 4030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 4030 may permit data to be exchanged with a network, other computer systems, and/or any other devices described herein. Wireless communication subsystem 4030 may include a means for transmitting or receiving data, such as identifiers of HMD devices, position data, a geographic map, a heat map, photos, or videos, using antenna(s) 4034 and wireless link(s) 4032. Wireless communication subsystem 4030, processor(s) 4010, and memory 4020 may together comprise at least a part of one or more of a means for performing some functions disclosed herein.

Embodiments of electronic system 4000 may also include one or more sensors 4090. Sensor(s) 4090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 4090 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 4000 may include a display module 4060. Display module 4060 may be a near-eye display, and may graphically present information, such as images, videos, and various instructions, from electronic system 4000 to a user. Such information may be derived from one or more application modules 4022-1824, virtual reality engine 4026, one or more other hardware modules 4080, a combination thereof, or any other suitable means for resolving graphical content for the user (e.g., by operating system 4025). Display module 4060 may use LCD technology, LED technology (including, for example, OLED, ILED, µ-LED, AMOLED, TOLED, etc.), light emitting polymer display (LPD) technology, or some other display technology.

Electronic system 4000 may include a user input/output module 4070. User input/output module 4070 may allow a user to send action requests to electronic system 4000. An action request may be a request to perform a particular action. For example, an action request may be to start or end an application or to perform a particular action within the application. User input/output module 4070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 4000. In some embodiments, user input/output module 4070 may provide haptic feedback to the user in accordance with instructions received from electronic system 4000. For example, the haptic feedback may be provided when an action request is received or has been performed.

Electronic system 4000 may include a camera 4050 that may be used to take photos or videos of a user, for example, for tracking the user's eye position. Camera 4050 may also be used to take photos or videos of the environment, for example, for VR, AR, or MR applications. Camera 4050 may include, for example, a complementary metal-oxide-semiconductor (CMOS) image sensor with a few millions or tens of millions of pixels. In some implementations, camera 4050 may include two or more cameras that may be used to capture 3-D images.

In some embodiments, electronic system 4000 may include a plurality of other hardware modules 4080. Each of other hardware modules 4080 may be a physical module within electronic system 4000. While each of other hardware modules 4080 may be permanently configured as a structure, some of other hardware modules 4080 may be temporarily configured to perform specific functions or temporarily activated. Examples of other hardware modules 4080 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 4080 may be implemented in software.

In some embodiments, memory 4020 of electronic system 4000 may also store a virtual reality engine 4026. Virtual reality engine 4026 may execute applications within electronic system 4000 and receive position information, acceleration information, velocity information, predicted future positions, or any combination thereof of the HMD device from the various sensors. In some embodiments, the information received by virtual reality engine 4026 may be used for producing a signal (e.g., display instructions) to display module 4060. For example, if the received information indicates that the user has looked to the left, virtual reality engine 4026 may generate content for the HMD device that mirrors the user's movement in a virtual environment.

Additionally, virtual reality engine 4026 may perform an action within an application in response to an action request received from user input/output module 4070 and provide feedback to the user. The provided feedback may be visual, audible, or haptic feedback. In some implementations, processor(s) 4010 may include one or more GPUs that may execute virtual reality engine 4026.

In various implementations, the above-described hardware and modules may be implemented on a single device or on multiple devices that can communicate with one another using wired or wireless connections. For example, in some implementations, some components or modules, such as GPUs, virtual reality engine 4026, and applications (e.g., tracking application), may be implemented on a console separate from the head-mounted display device. In some implementations, one console may be connected to or support more than one HMD.

In alternative configurations, different and/or additional components may be included in electronic system 4000. Similarly, functionality of one or more of the components can be distributed among the components in a manner different from the manner described above. For example, in some embodiments, electronic system 4000 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A device comprising:
    a micro light emitting diode (micro-LED) including:
        a mesa structure including semiconductor materials and sidewalls that are vertical or inwardly tilted in a light emitting direction; and
        a backside reflector on a back surface of the mesa structure; and
    a micro-lens on top of the micro-LED and configured to extract light emitted by the micro-LED, wherein:
        a lateral size of the micro-lens is equal to or greater than 80% of a lateral size of the mesa structure; and
        a distance between a focal point of the micro-lens and a top surface of the mesa structure is between 0.8 and 1.25 times of a thickness of the semiconductor materials in the mesa structure.

2. The device of claim 1, wherein the micro-lens is offset from the micro-LED by a horizontal displacement that is equal to or greater than zero.

3. The device of claim 1, further comprising at least one of a second micro-lens, a wedge, a prism, a roughened surface, an antireflective coating, a diffractive optical element, or a photonic crystal.

4. The device of claim 1, wherein the micro-lens includes a spherical micro-lens, an aspherical micro-lens, or a toroidal micro-lens.

5. The device of claim 1, wherein the micro-lens includes a semiconductor material, a dielectric material including $SiO_2$, $TiO_2$, SiN, HfO, or AlN, or a polymer.

6. The device of claim 1, wherein the micro-LED further includes a mesa reflector on the sidewalls of the mesa structure.

7. The device of claim 1, further comprising:
    an array of micro-LEDs including a one-dimensional or two-dimensional array of micro-LEDs; and
    an array of micro-lenses optically coupled to the array of micro-LEDs, wherein each micro-lens in the array of micro-lenses is configured to direct a chief ray of light emitted by a corresponding micro-LED in the array of micro-LEDs to a different respective direction.

8. The device of claim 7, wherein each micro-lens in the array of micro-lenses is characterized by a different respective horizontal displacement from the corresponding micro-LED.

9. A device comprising:
    a micro light emitting diode (micro-LED) including:
        a mesa structure including semiconductor materials and sidewalls that are outwardly tilted in a light emitting direction; and
        a backside reflector on a back surface of the mesa structure; and
    a micro-lens on top of the micro-LED and configured to extract light emitted by the micro-LED, wherein:
        a lateral size of the micro-lens is equal to or greater than 80% of a lateral size of the mesa structure; and
        a distance between a focal point of the micro-lens and a top surface of the mesa structure is between 1.2 and 4 times of a thickness of the semiconductor materials in the mesa structure.

10. The device of claim 9, wherein the micro-LED further comprises a mesa reflector conformally formed on the sidewalls of the mesa structure.

11. The device of claim 9, wherein the micro-LED is characterized by a half-width half-magnitude light emission angle less than 60°, between 30° and 50°, between 15° and 30°, or less than 15°.

12. The device of claim 9, wherein the micro-lens is offset from the micro-LED by a horizontal displacement that is equal to or greater than zero.

13. The device of claim 9, further comprising at least one of a second micro-lens, a wedge, a prism, a roughened surface, an antireflective coating, a diffractive optical element, or a photonic crystal.

14. The device of claim 9, wherein the micro-lens includes a semiconductor material, a dielectric material including $SiO_2$, $TiO_2$, SiN, HfO, or AlN, or a polymer.

15. The device of claim 9, wherein the mesa structure is characterized by a parabolic or conic shape.

16. The device of claim 15, wherein the mesa structure is characterized by the conic shape and a mesa facet angle between 30° and 40°.

17. The device of claim 9, further comprising:
    an array of micro-LEDs including a one-dimensional or two-dimensional array of micro-LEDs; and
    an array of micro-lenses optically coupled to the array of micro-LEDs, wherein each micro-lens in the array of micro-lenses is configured to direct a chief ray of light emitted by a corresponding micro-LED in the array of micro-LEDs to a different respective direction.

18. The device of claim 17, wherein each micro-lens in the array of micro-lenses is characterized by a different respective horizontal displacement from the corresponding micro-LED.

* * * * *